US011164796B2

(12) United States Patent
Cheng et al.

(10) Patent No.: US 11,164,796 B2
(45) Date of Patent: Nov. 2, 2021

(54) METHOD FOR FORMING SEMICONDUCTOR DEVICE STRUCTURE

(71) Applicant: Taiwan Semiconductor Manufacturing Co., Ltd., Hsinchu (TW)

(72) Inventors: Chung-Liang Cheng, Changhua County (TW); Ziwei Fang, Hsinchu (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 0 days.

(21) Appl. No.: 16/353,493

(22) Filed: Mar. 14, 2019

(65) Prior Publication Data

US 2020/0294865 A1 Sep. 17, 2020

(51) Int. Cl.
| | |
|---|---|
| *H01L 21/82* | (2006.01) |
| *H01L 21/8238* | (2006.01) |
| *H01L 29/78* | (2006.01) |
| *H01L 29/66* | (2006.01) |
| *H01L 29/165* | (2006.01) |
| *H01L 29/49* | (2006.01) |
| *H01L 21/033* | (2006.01) |
| *H01L 21/28* | (2006.01) |
| *H01L 27/092* | (2006.01) |
| *H01L 21/02* | (2006.01) |
| *H01L 21/306* | (2006.01) |
| *H01L 29/06* | (2006.01) |

(52) U.S. Cl.
CPC ........ *H01L 21/823842* (2013.01); *H01L 21/02532* (2013.01); *H01L 21/0337* (2013.01); *H01L 21/28088* (2013.01); *H01L 21/30604* (2013.01); *H01L 21/823821* (2013.01); *H01L 21/823864* (2013.01); *H01L 27/0924* (2013.01); *H01L 29/0673* (2013.01); *H01L 29/165* (2013.01); *H01L 29/4966* (2013.01); *H01L 29/6681* (2013.01); *H01L 29/66545* (2013.01); *H01L 29/785* (2013.01)

(58) Field of Classification Search
CPC ........ H01L 29/42392; H01L 29/78696; H01L 29/66545; H01L 29/0673; H01L 29/775
See application file for complete search history.

(56) References Cited

U.S. PATENT DOCUMENTS

| | | | |
|---|---|---|---|
| 9,209,247 B2 | 12/2015 | Colinge et al. | |
| 9,236,267 B2 | 1/2016 | De et al. | |
| 9,412,817 B2 | 8/2016 | Yang et al. | |
| 9,412,828 B2 | 8/2016 | Ching et al. | |
| 9,472,618 B2 | 10/2016 | Oxland | |
| 9,502,265 B1 * | 11/2016 | Jiang | H01L 29/66469 |

(Continued)

*Primary Examiner* — Tony Tran
(74) *Attorney, Agent, or Firm* — Birch, Stewart, Kolasch & Birch, LLP

(57) ABSTRACT

A method for forming a semiconductor device structure is provided. The method includes forming a work function material around a first semiconductor layer in a first region and a second semiconductor layer in a second region. The method also includes forming a first gate electrode material over the work function material. The method also includes removing the first gate electrode material in the first region. The method also includes forming a second gate electrode material over the work function material in the first region.

17 Claims, 50 Drawing Sheets

(56) References Cited

U.S. PATENT DOCUMENTS

| | | |
|---|---|---|
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 2020/0044087 A1* | 2/2020 | Guha ................ H01L 29/42392 |

* cited by examiner

METHOD FOR FORMING SEMICONDUCTOR DEVICE STRUCTURE

BACKGROUND

The electronics industry is experiencing an ever-increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). So far, these goals have been achieved in large part by scaling down semiconductor IC dimensions (e.g., minimum feature size) and thereby improving production efficiency and lowering associated costs. However, such miniaturization has introduced greater complexity into the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). One such multi-gate device that has been introduced is the gate-all around transistor (GAA). The GAA device gets its name from the gate structure which can extend around the channel region providing access to the channel on two or four sides. GAA devices are compatible with conventional complementary metal-oxide-semiconductor (CMOS) processes and their structure allows them to be aggressively scaled-down while maintaining gate control and mitigating SCEs. In conventional processes, GAA devices provide a channel in a silicon nanowire. However, integration of fabrication of the GAA features around the nanowire can be challenging. For example, while the current methods have been satisfactory in many respects, continued improvements are still needed.

BRIEF DESCRIPTION OF THE DRAWINGS

Aspects of the present disclosure are best understood from the following detailed description when read with the accompanying Figures. It should be noted that, in accordance with the standard practice in the industry, various features are not drawn to scale. In fact, the dimensions of the various features may be arbitrarily increased or reduced for clarity of discussion.

FIGS. 2A-1 through 2X-1 are cross-sectional views illustrating the formation of semiconductor devices along line I-I in FIG. 1 at various intermediate stages, in accordance with some embodiments.

FIGS. 2A-2 through 2X-2 are cross-sectional views illustrating the formation of semiconductor devices along line II-II in FIG. 1 at various intermediate stages, in accordance with some embodiments

DETAILED DESCRIPTION

Figure 1:
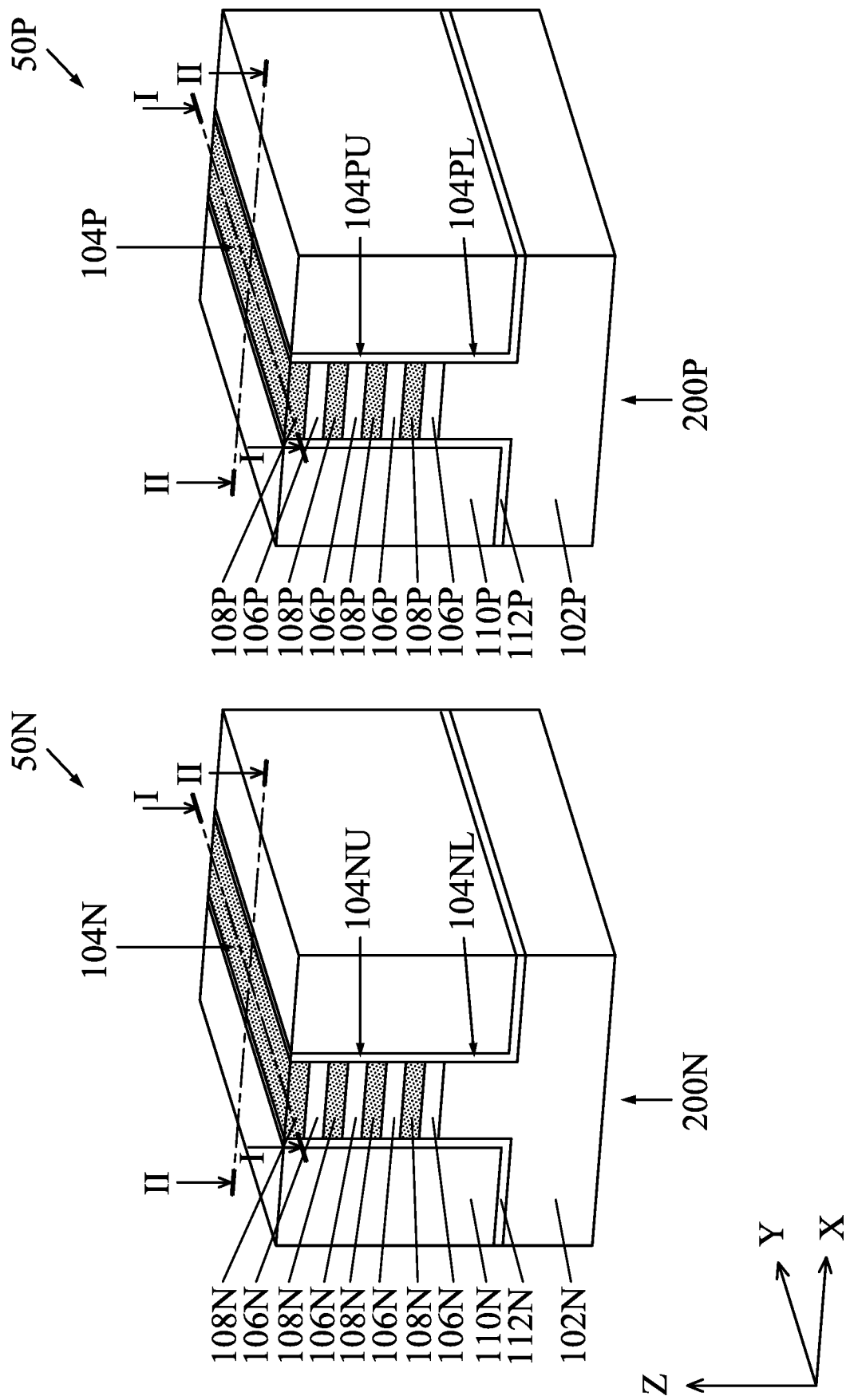
FIG. 1 is a perspective view of semiconductor device structures, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numerals are used to designate like elements. It should be understood that additional operations can be provided before, during, and after the method, and some of the operations described can be replaced or eliminated for other embodiments of the method.

The gate all around (GAA) transistor structures described below may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, smaller pitches than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Embodiments for forming a semiconductor device (e.g., GAA structure) are provided. The method for forming the semiconductor device structure may include forming a work function material around a first semiconductor layer in a first region and a second semiconductor layer in a second region, forming a first gate electrode material over the work function material, removing the first gate electrode material in the first region, and forming a second gate electrode material over the work function material in the first region. As a result, the semiconductor devices in the two regions can be respectively tuned to have ultra-low threshold voltages (Vt).

FIG. 1 is a perspective view of a semiconductor device structure 50N and a semiconductor device structure 50P, in accordance with some embodiments of the disclosure. The semiconductor device structure 50N is located in an NMOS region 200N, and the semiconductor device structure 50P is located in a PMOS region 200P, in accordance with some embodiments. Although the NMOS region 200N and the PMOS region 200P are shown as being separate in the figure, the NMOS region 200N and the PMOS region 200P are part of an integrated circuit (IC) device, in accordance with some embodiments.

The formation of the semiconductor device structures 50N and 50P includes providing a bulk substrate, in accordance with some embodiments. The bulk substrate includes a substrate 102N in the NMOS region 200N and a substrate 102P in the PMOS region 200P, in accordance with some embodiments. A fin structure 104N and an isolation structure 110N are formed on the substrate 102N, in accordance with some embodiments. The fin structure 104N is surrounded by the isolation structure 110N, in accordance with some embodiments. A fin structure 104P and an isolation structure 110P are formed on the substrate 102P, in accordance with some embodiments. The fin structure 104P is surrounded by the isolation structure 110P, in accordance with some embodiments.

In some embodiments, the bulk substrate (including the substrates 102N and 102P) is a semiconductor substrate such as a silicon substrate. In some embodiments, the bulk substrate includes an elementary semiconductor such as germanium; a compound semiconductor such as gallium nitride (GaN), silicon carbide (SiC), gallium arsenide (GaAs), gallium phosphide (GaP), indium phosphide (InP), indium arsenide (InAs), and/or indium antimonide (InSb); an alloy semiconductor such as SiGe, GaAsP, AlInAs, AlGaAs, GaInAs, GaInP, and/or GaInAsP; or a combination thereof. In some embodiments, the bulk substrate includes an epitaxial layer (epi-layer) formed thereon. In some embodiments, the bulk substrate is a semiconductor-on-insulator (SOI) substrate which includes a semiconductor substrate, a buried oxide layer over the substrate, and a semiconductor layer over the buried oxide layer.

The fin structure 104N extends in the Y direction, in accordance with some embodiments. The fin structure 104N includes a lower portion 104NL and an upper portion 104NU, in accordance with some embodiments. The lower portion 104NL of the fin structure 104N is formed by a portion of the substrate 102N, in accordance with some embodiments. The upper portion 104NU of the fin structure 104N is formed by a stacked semiconductor structure, which includes first semiconductor layers 106N and second semiconductor layers 108N alternately stacked over the lower portion 104NL, in accordance with some embodiments.

The fin structure 104P extends in the Y direction, in accordance with some embodiments. The fin structure 104P includes a lower portion 104PL and an upper portion 104PU, in accordance with some embodiments. The lower portion 104PL of the fin structure 104P is formed by a portion of the substrate 102P, in accordance with some embodiments. The upper portion 104PU of the fin structure 104P is formed by a stacked semiconductor structure, which includes first semiconductor layers 106P and second semiconductor layers 108P alternately stacked over the lower portion 104PL, in accordance with some embodiments.

As explained in detail below, the first semiconductor layers 106N and 106P of the fin structures 104N and 104P will be removed so that the second semiconductor layers 108N and 108P of the fin structures 104N and 106P form nanowire structures extending between source/drain features, in accordance with some embodiments. The nanowire structures of the second semiconductor layers 108N and 108P will be surrounded by respective gate stacks to serve as channel regions of the semiconductor devices, in accordance with some embodiments. For example, the embodiments described herein illustrate processes and materials that may be used to form nanowire structures with a GAA design for n-type FinFETs and p-type FinFETs.

In some embodiments, the formation of the fin structures 104N and 104P includes forming a stacked semiconductor structure including a first semiconductor material for the first semiconductor layers 106N and 106P and a second semiconductor material for the second semiconductor layers 108N and 108P over the bulk substrate.

The first semiconductor material for the first semiconductor layers 106N and 106P is made of a material having a different lattice constant than that of the second semiconductor material for the second semiconductor layers 108N and 108P, in accordance with some embodiments. In some embodiments, the first semiconductor layers 106N and 106P are made of SiGe, where the percentage of germanium (Ge) in the SiGe is in the range from about 20 atomic % to about 50 atomic %, and the second semiconductor layers 108N and 108P are made of silicon. In some embodiments, the first semiconductor layers 106N and 106P are $Si_{1-x}Ge_x$, where x is more than about 0.3, or Ge (x=1.0) and the second semiconductor layers 108N and 108P are Si or $Si_{1-y}Ge_y$, where y is less than about 0.4, and x>y.

In some embodiments, the first semiconductor material and the second semiconductor material are formed using low pressure chemical vapor deposition (LPCVD), epitaxial growth process, another suitable method, or a combination thereof. In some embodiments, the epitaxial growth process includes molecular beam epitaxy (MBE), metal organic chemical vapor deposition (MOCVD), or vapor phase epitaxy (VPE).

In some embodiments, the thickness of each of the first semiconductor layers 106N and 106P is in a range from about 1.5 nanometers (nm) to about 20 nm. In some embodiments, the first semiconductor layers 106N and 106P are substantially uniform in thickness. In some embodiments, the thickness of each of the second semiconductor layers 108N and 108P is in a range from about 1.5 nm to about 20 nm. In some embodiments, the second semiconductor layers 108N and 108P are substantially uniform in thickness.

Afterward, the stacked semiconductor structure including the first semiconductor material and the second semiconductor material and the underlying bulk substrate are patterned into the fin structure 104N and the fin structure 104P.

In some embodiments, the patterning process includes forming a hard mask layer over the stacked semiconductor structure, and etching the semiconductor structure and the underlying bulk substrate through the hard mask layer. In some embodiments, the etching process of the patterning process removes portions of the stacked semiconductor structure uncovered by the hard mask layer and further recesses the bulk substrate to form trenches.

In some embodiments, after the etching process, the substrate 102N has a portion which protrudes from between the trenches to form the lower portion 104NL of the fin structure 104N. In some embodiments, a remaining portion of the stacked semiconductor structure directly above the lower portion 104NL forms the upper portions 104NU of the fin structure 104N.

In some embodiments, after the etching process, the substrate 102P has a portion which protrudes from between the trenches to form the lower portion 104PL of the fin structure 104P. In some embodiments, a remaining portion of the stacked semiconductor structure directly above the lower portion 104PL forms the upper portions 104PU of the fin structure 104P.

Afterward, a lining layer 112N is conformally formed along the substrate 102N and the fin structure 104N, in accordance with some embodiments. A lining layer 112P is conformally formed along the substrate 102P and the fin structure 104P, in accordance with some embodiments. In some embodiments, the lining layers 112N and 112P are further formed along the hard mask layer.

In some embodiments, the lining layers 112N and 112P are formed by a bilayer structure, such as a silicon oxide layer and a silicon nitride layer formed on the silicon oxide layer. In some embodiments, the lining layers 112N and 112P are formed using thermal oxidation, CVD, atomic layer deposition (ALD), another suitable method, and/or a combination thereof.

Afterward, an insulating material for the isolation structures 110N and 110P is formed over the lining layers 112N and 112P, in accordance with some embodiments. The insulating material fills the trenches and covers the upper surface of the hard mask layer, in accordance with some embodiments.

In some embodiments, the insulating material includes silicon oxide, silicon nitride, silicon oxynitride (SiON), another suitable insulating material, and/or a combination thereof. In some embodiments, the insulating material is formed using LPCVD, plasma enhanced CVD (PECVD), high density plasma CVD (HDP-CVD), high aspect ratio process (HARP), flowable CVD (FCVD), ALD, another suitable method, and/or a combination thereof.

Afterward, the insulating material and the lining layers 112N and 112P formed above the hard mask layer are removed to form the isolation structures 110N and 110P, in accordance with some embodiments. In some embodiments, the removal process further removes the hard mask layer and exposes the upper surfaces of the fin structures 104N and 104P. In some embodiments, the removal process is an etch-back process, chemical mechanical polishing (CMP), and/or a combination thereof.

Figure 2A:
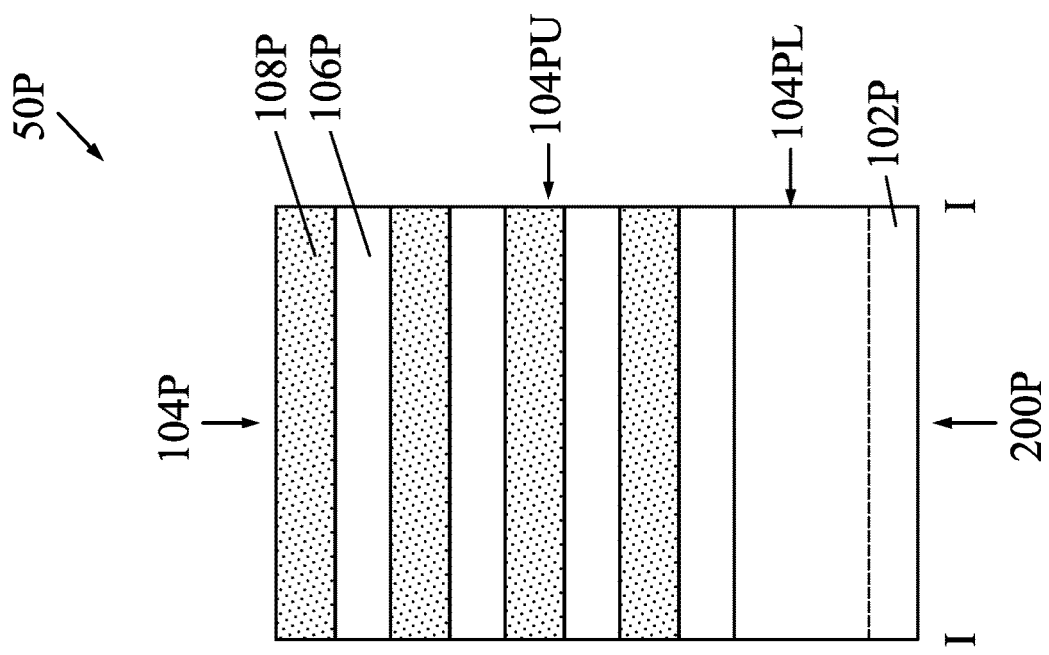
Figure 1:
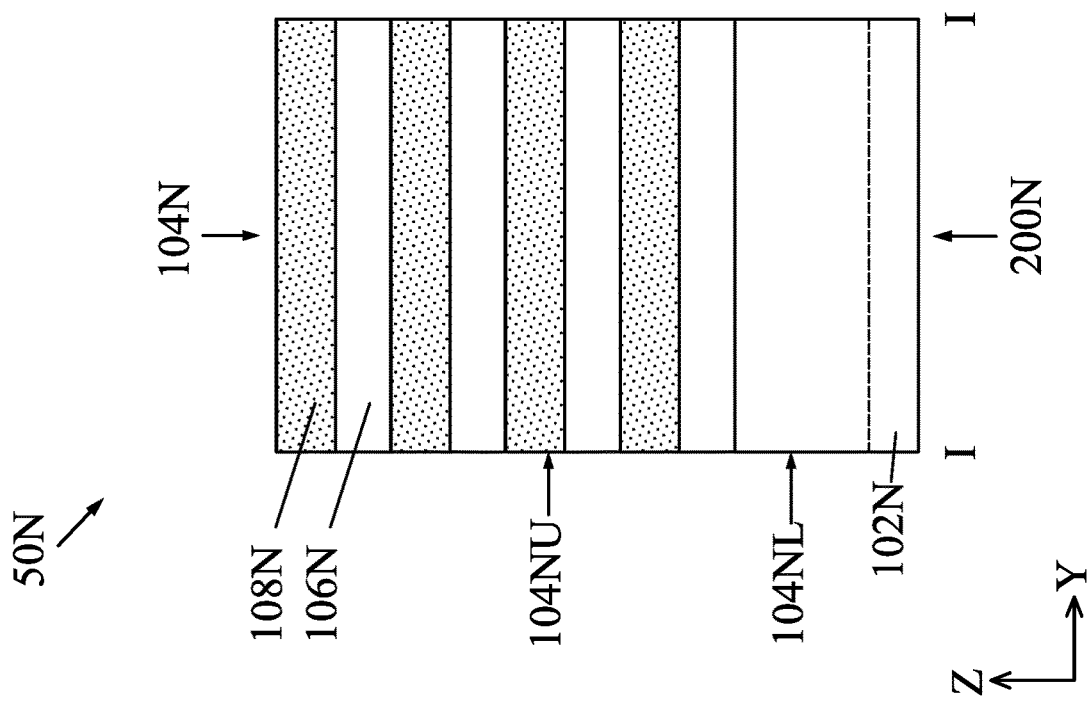
Figure 2A:
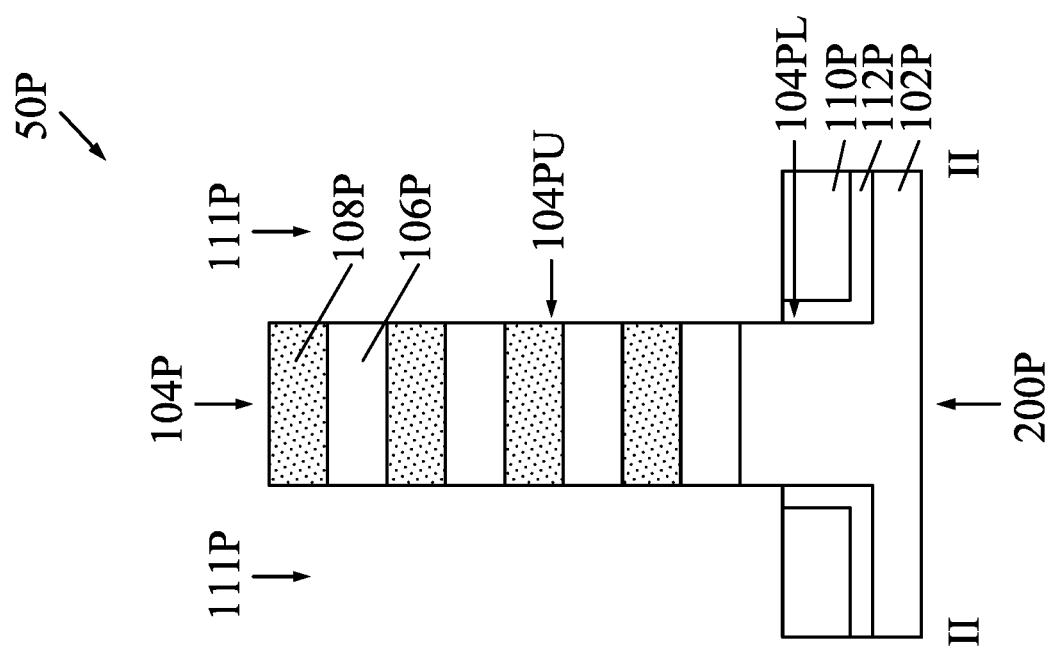
Figure 2:
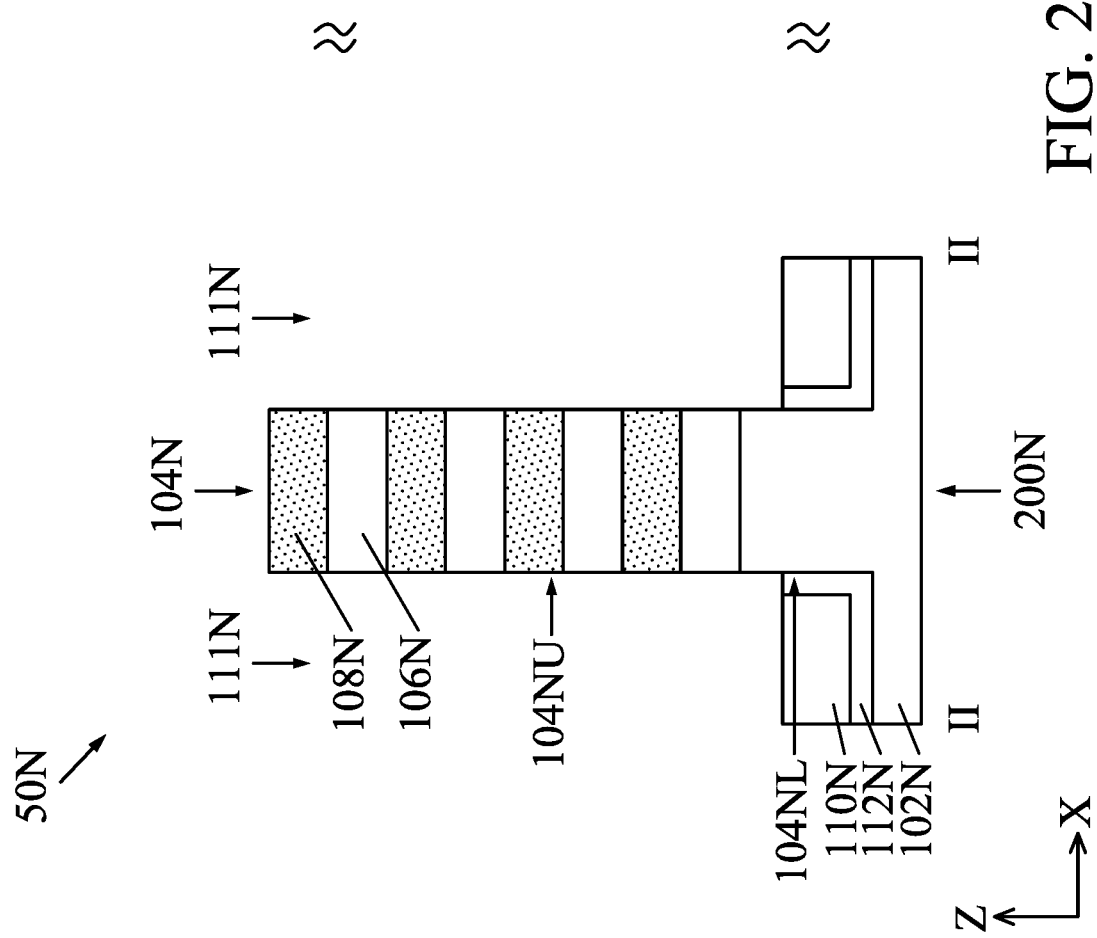
Figures 1, 2B:
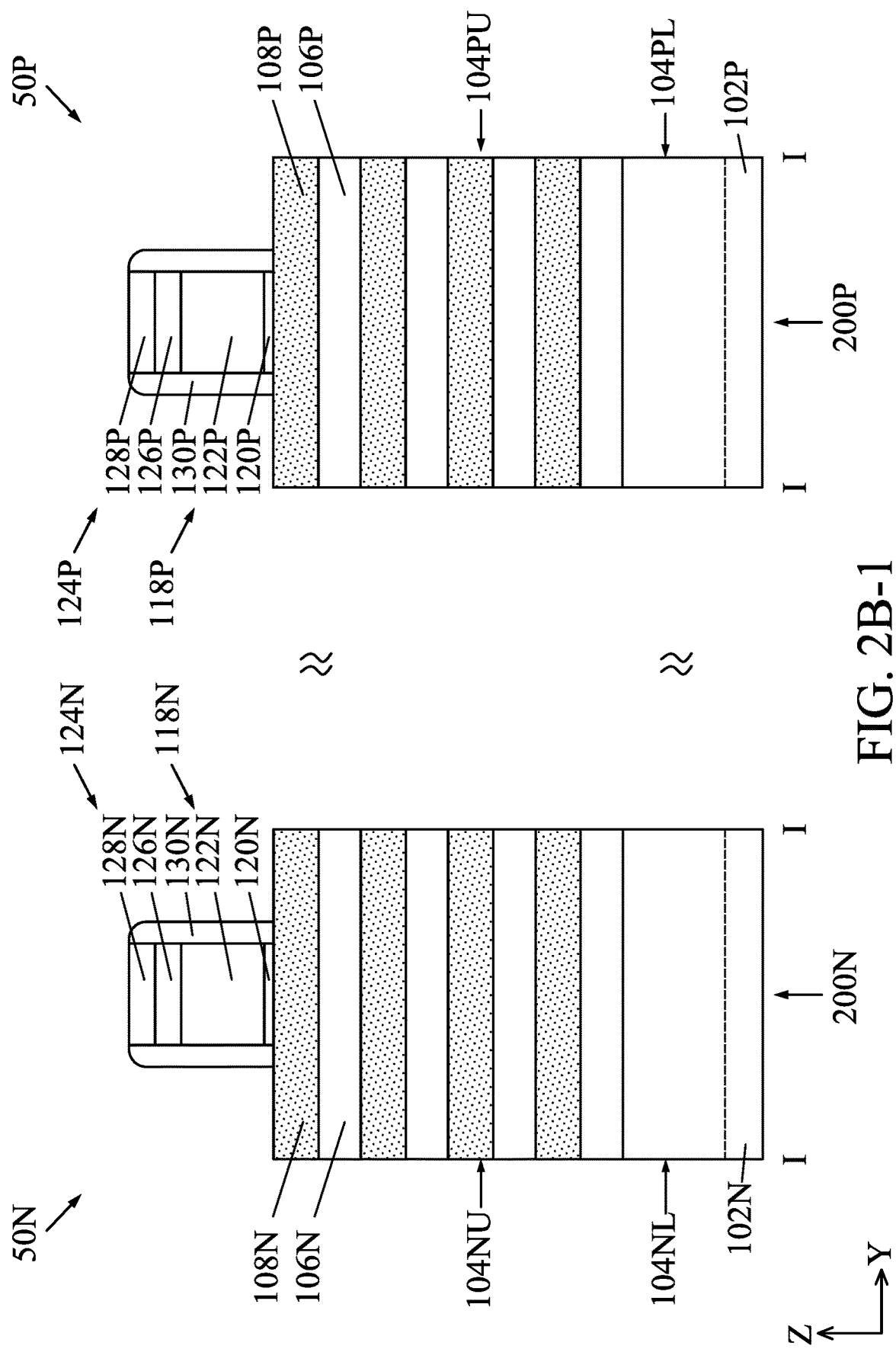
Figures 2, 2B:
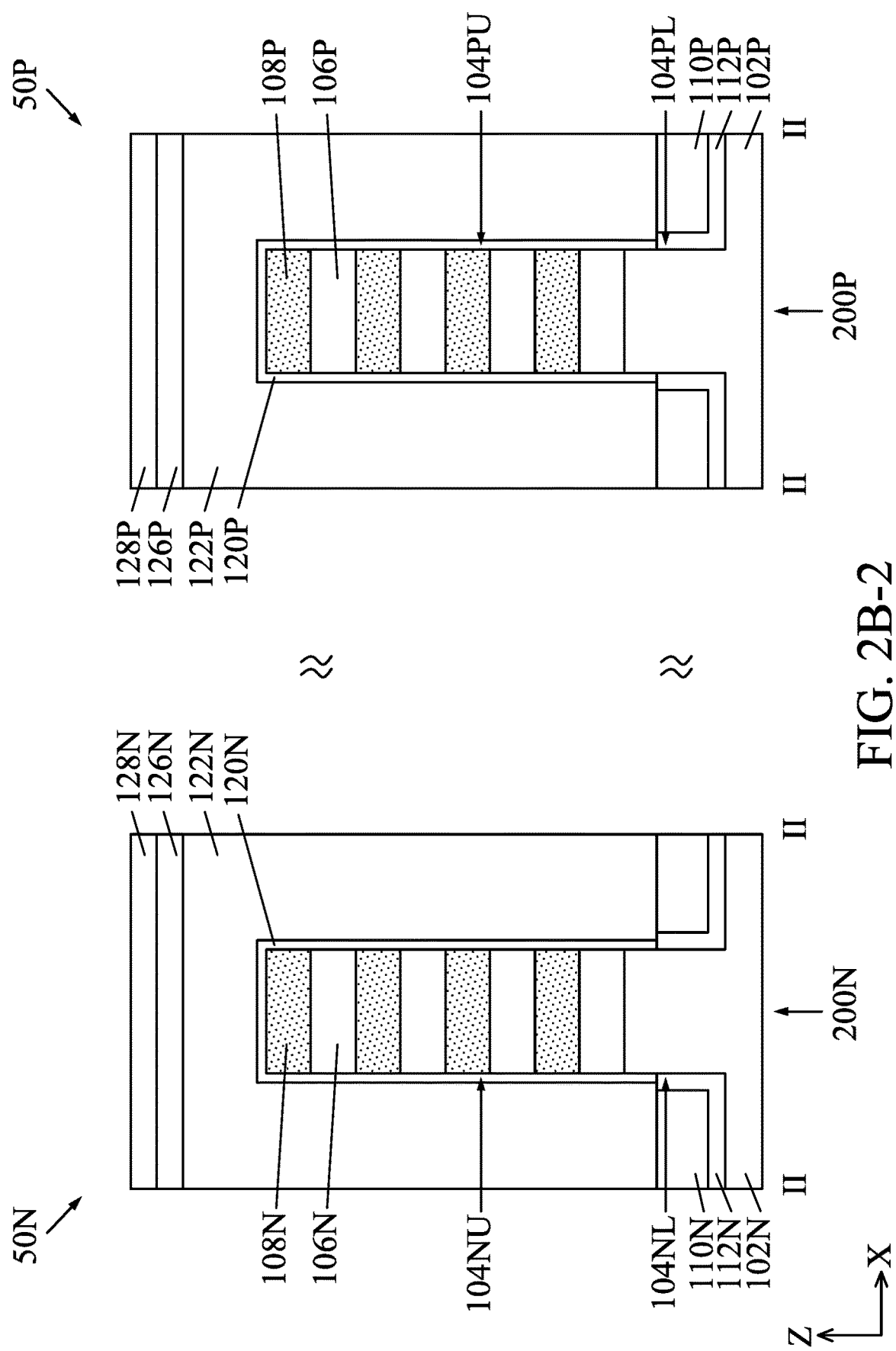
Figures 1, 2C:
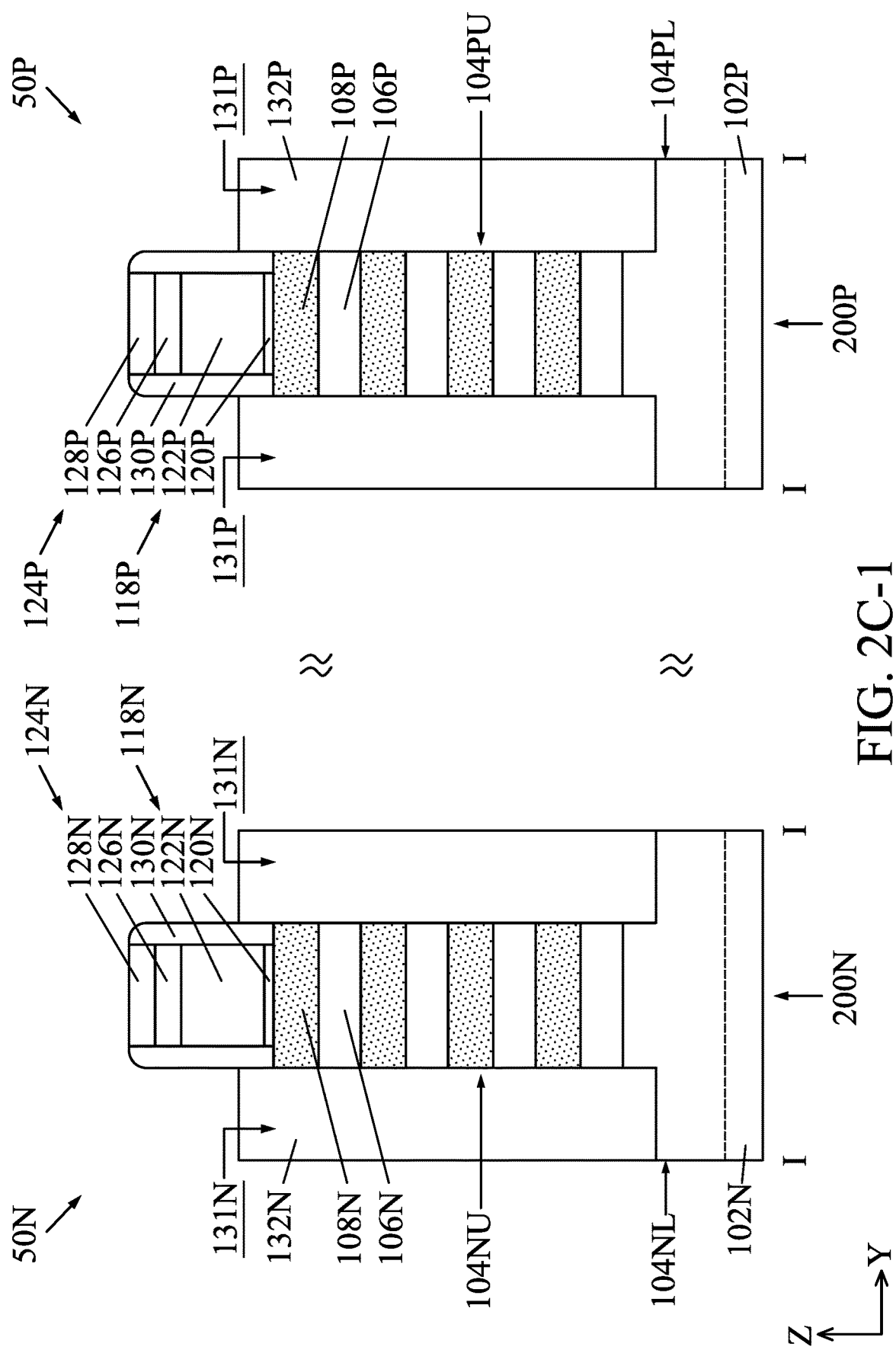
Figures 2, 2C:
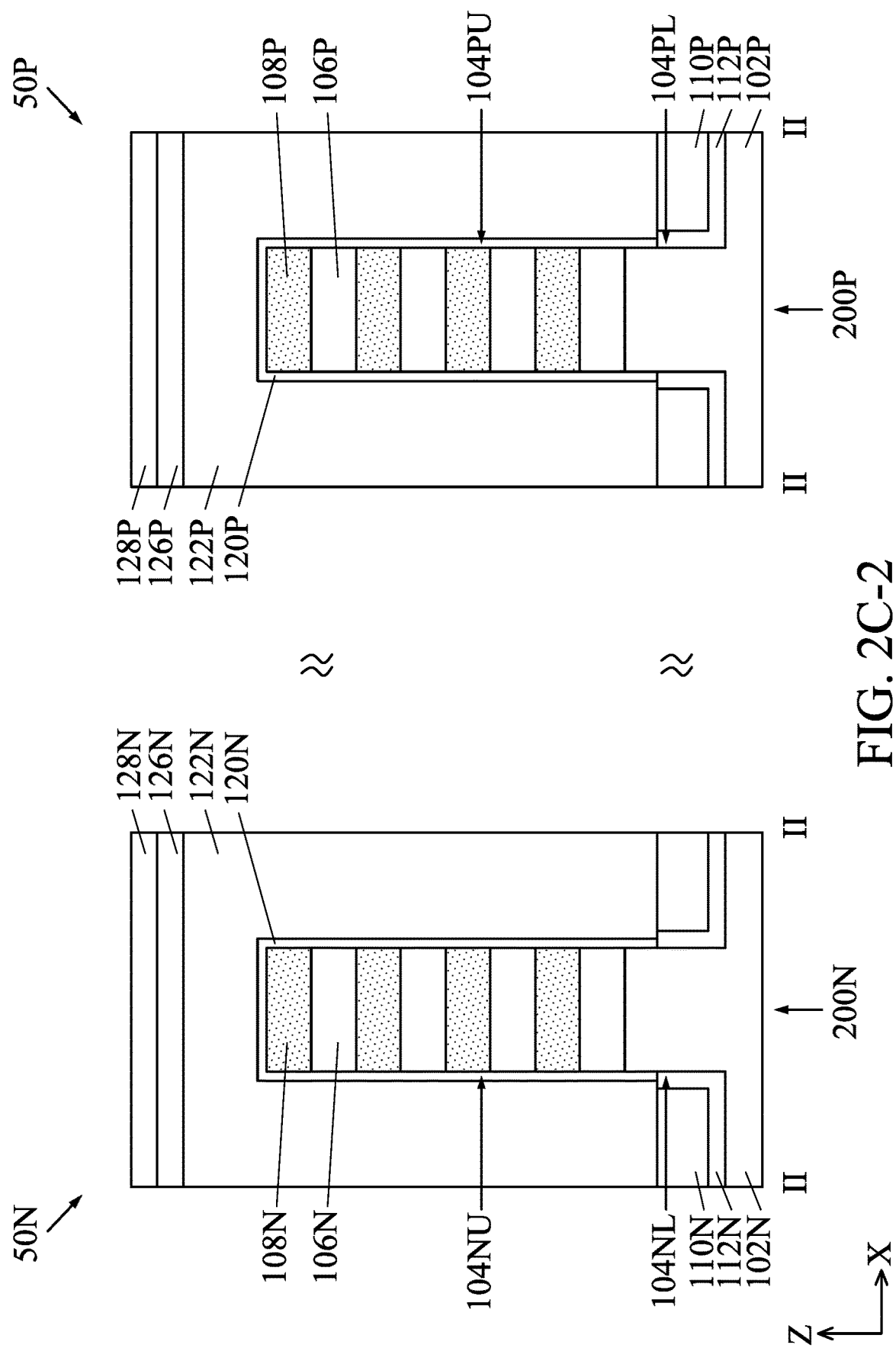
Figures 1, 2D:
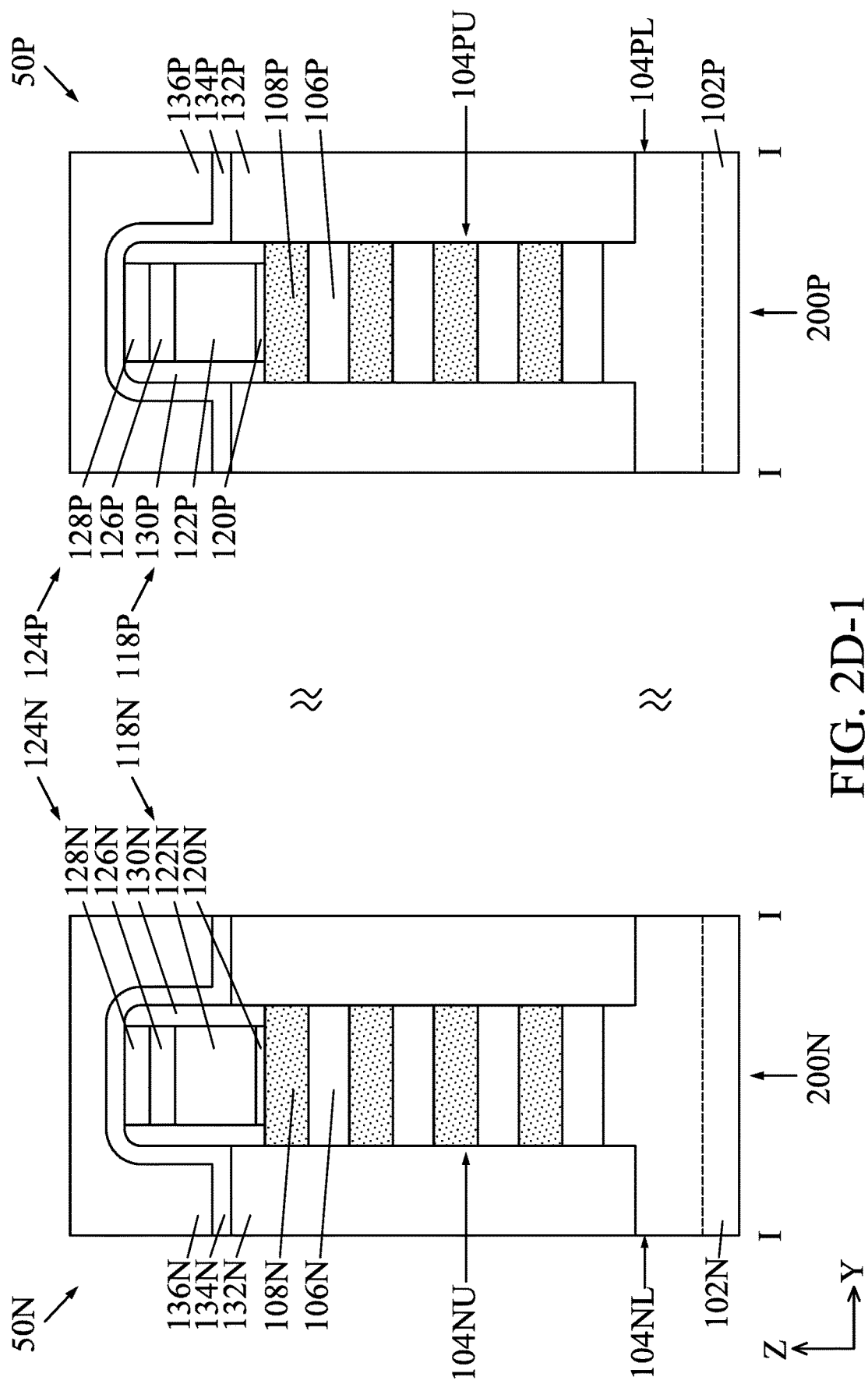
Figures 2, 2D:
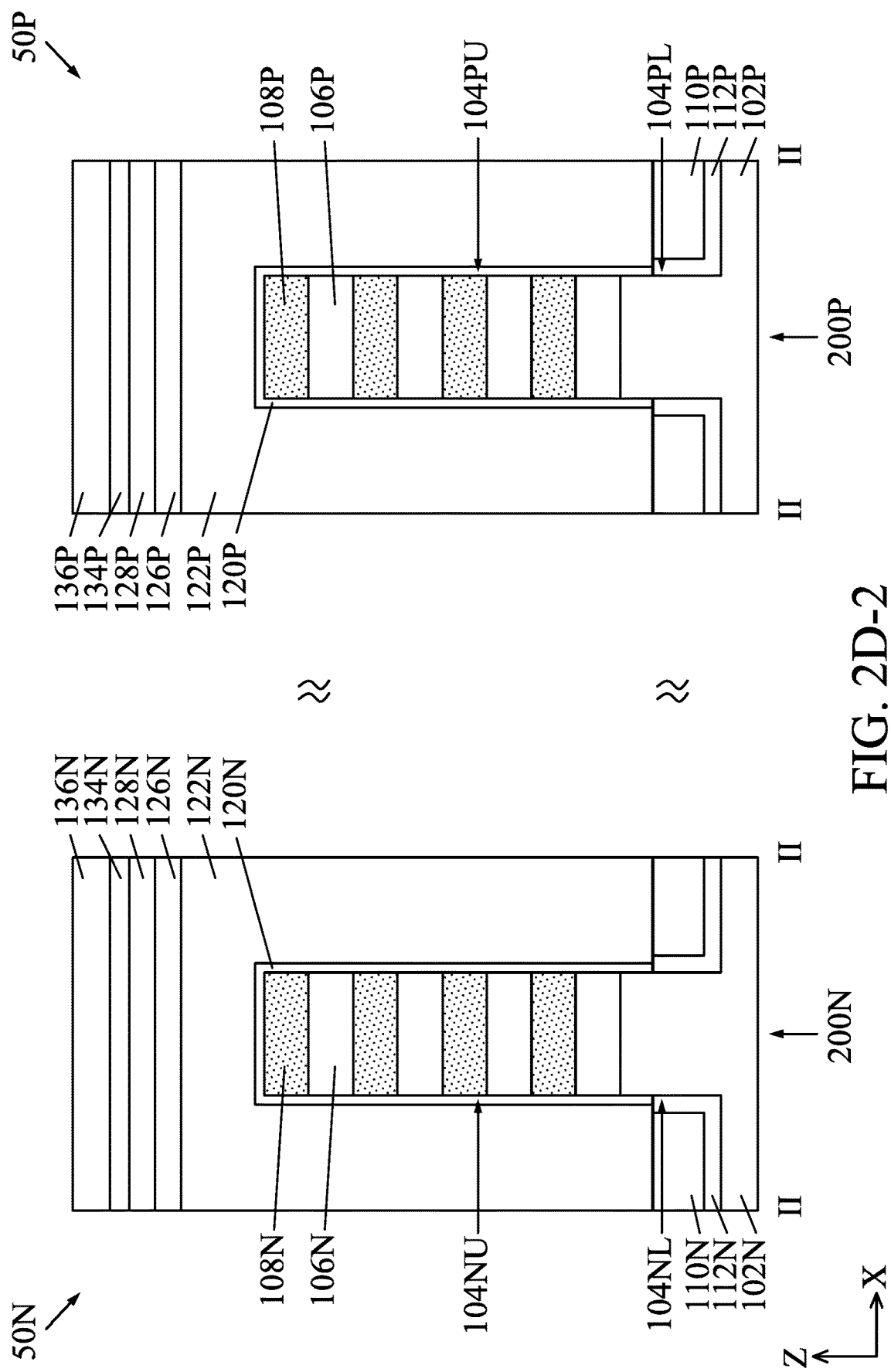
Figure 2E:
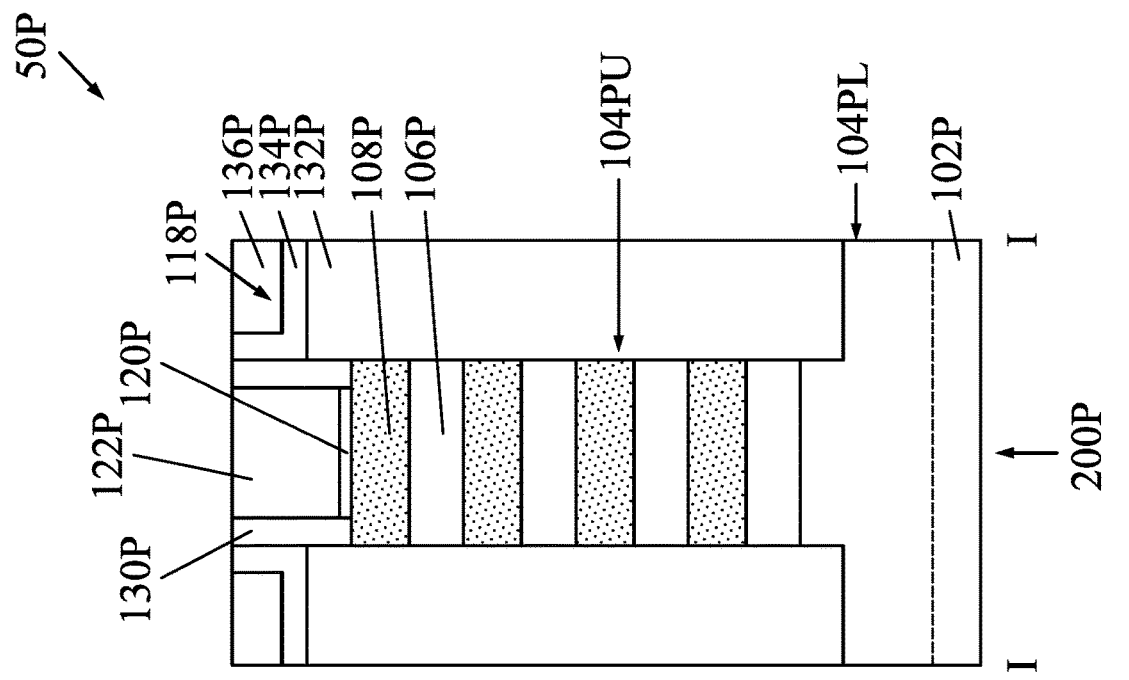
Figure 1:
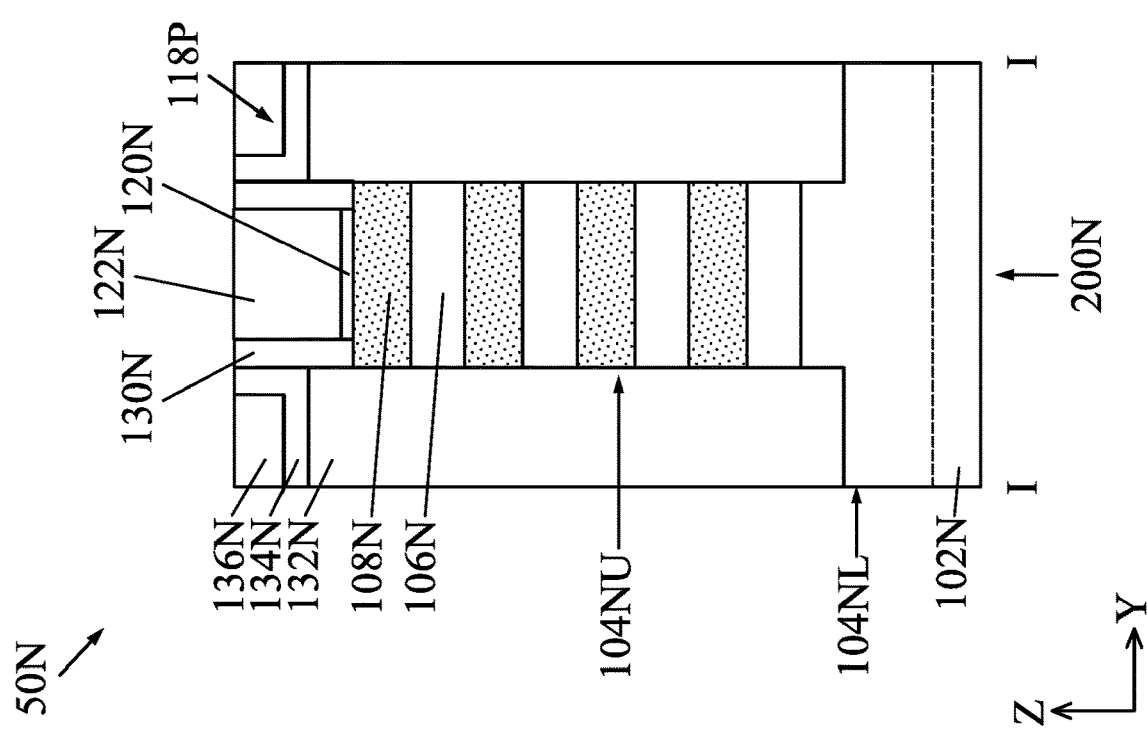
Figures 2, 2E:
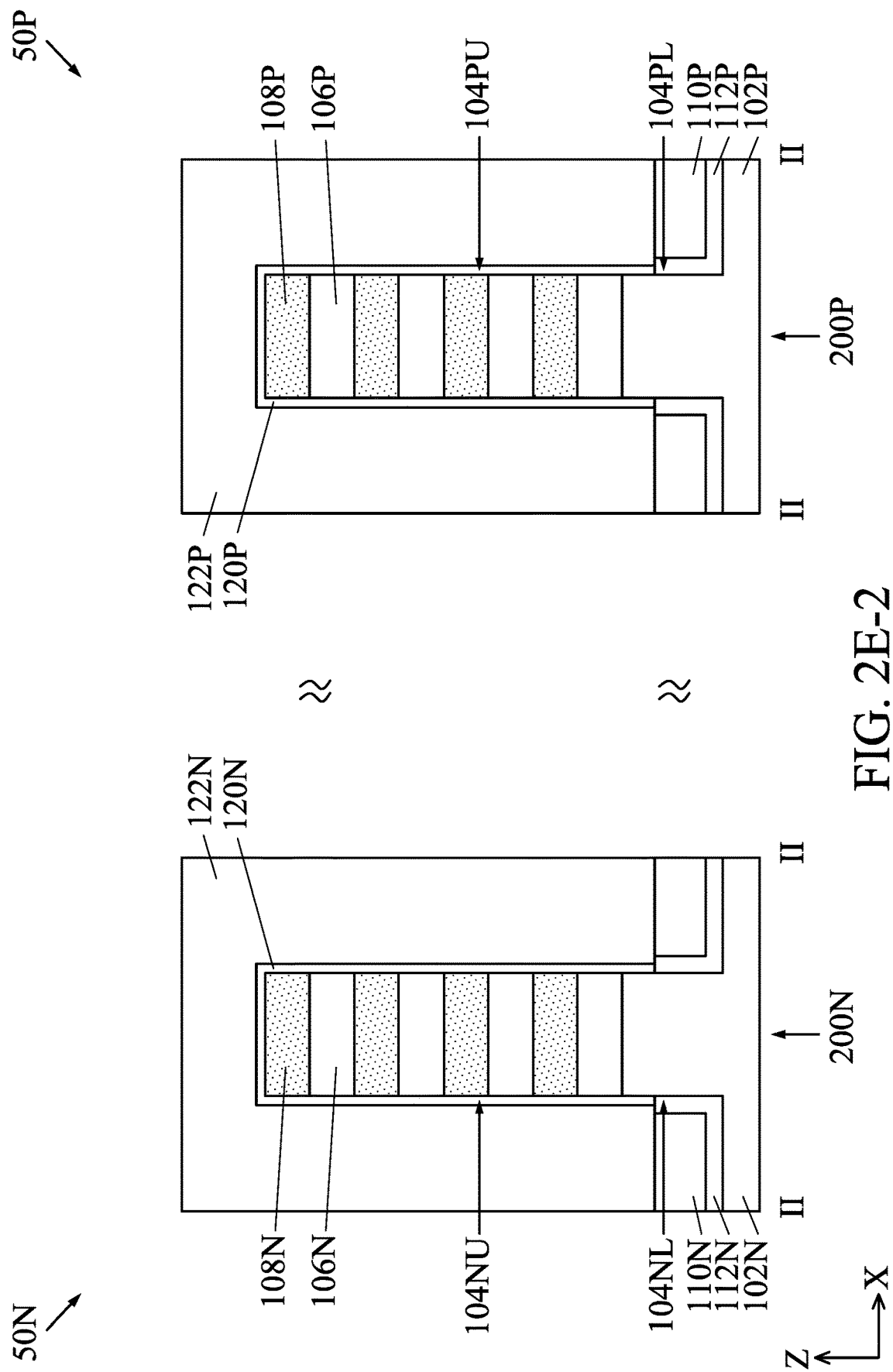
Figures 1, 2F:
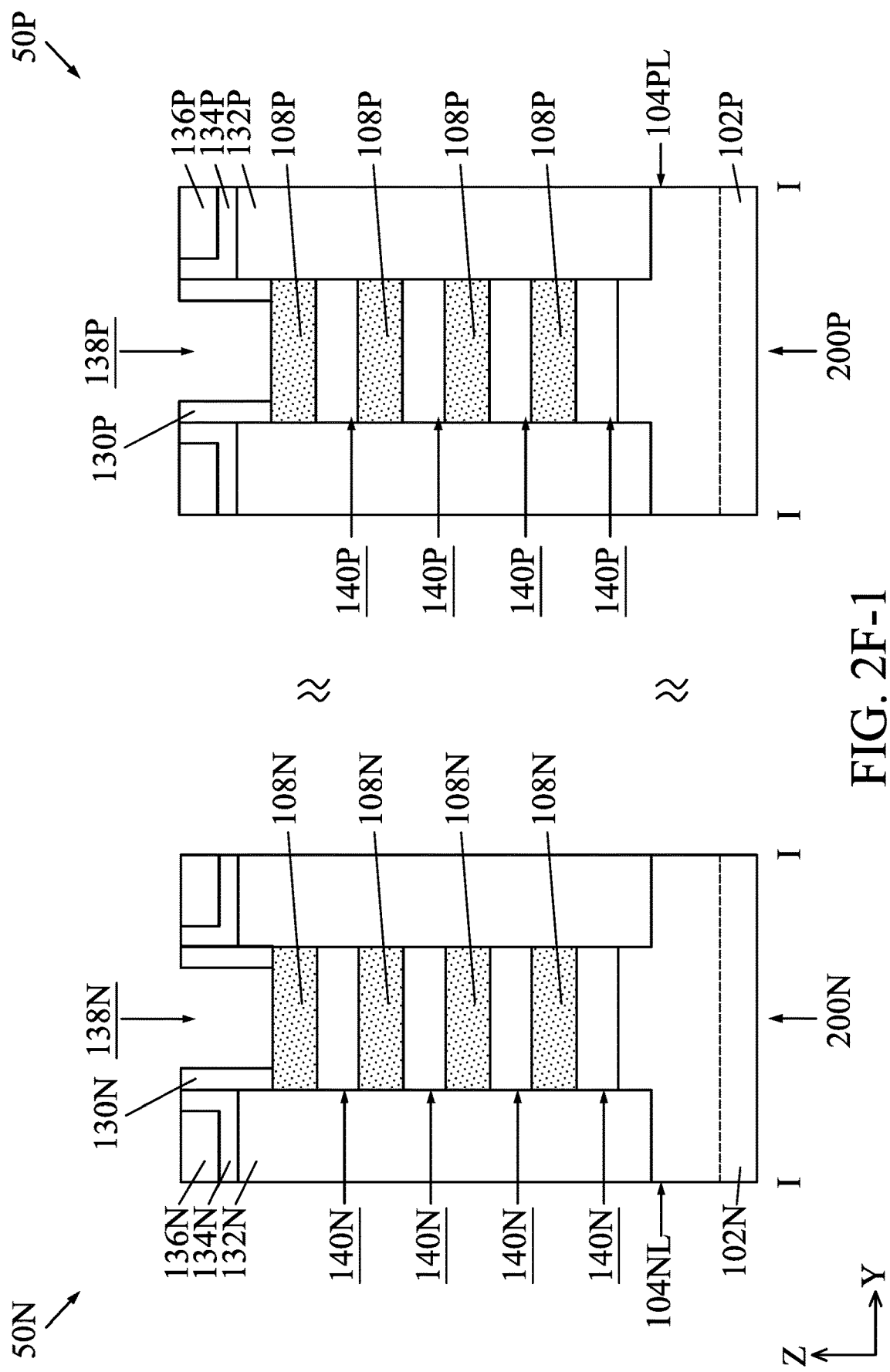
Figures 2, 2F:
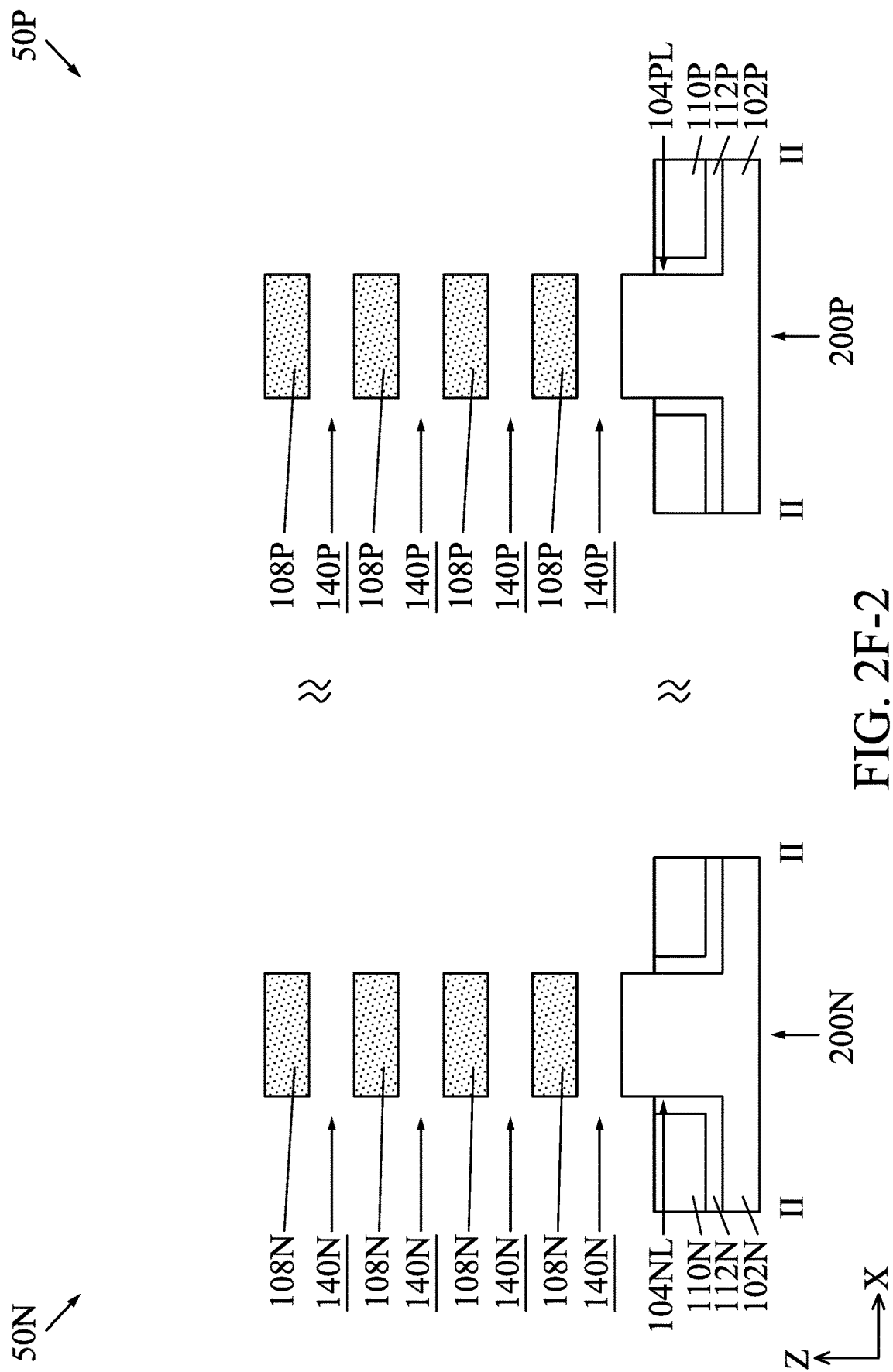
Figures 1, 2G:
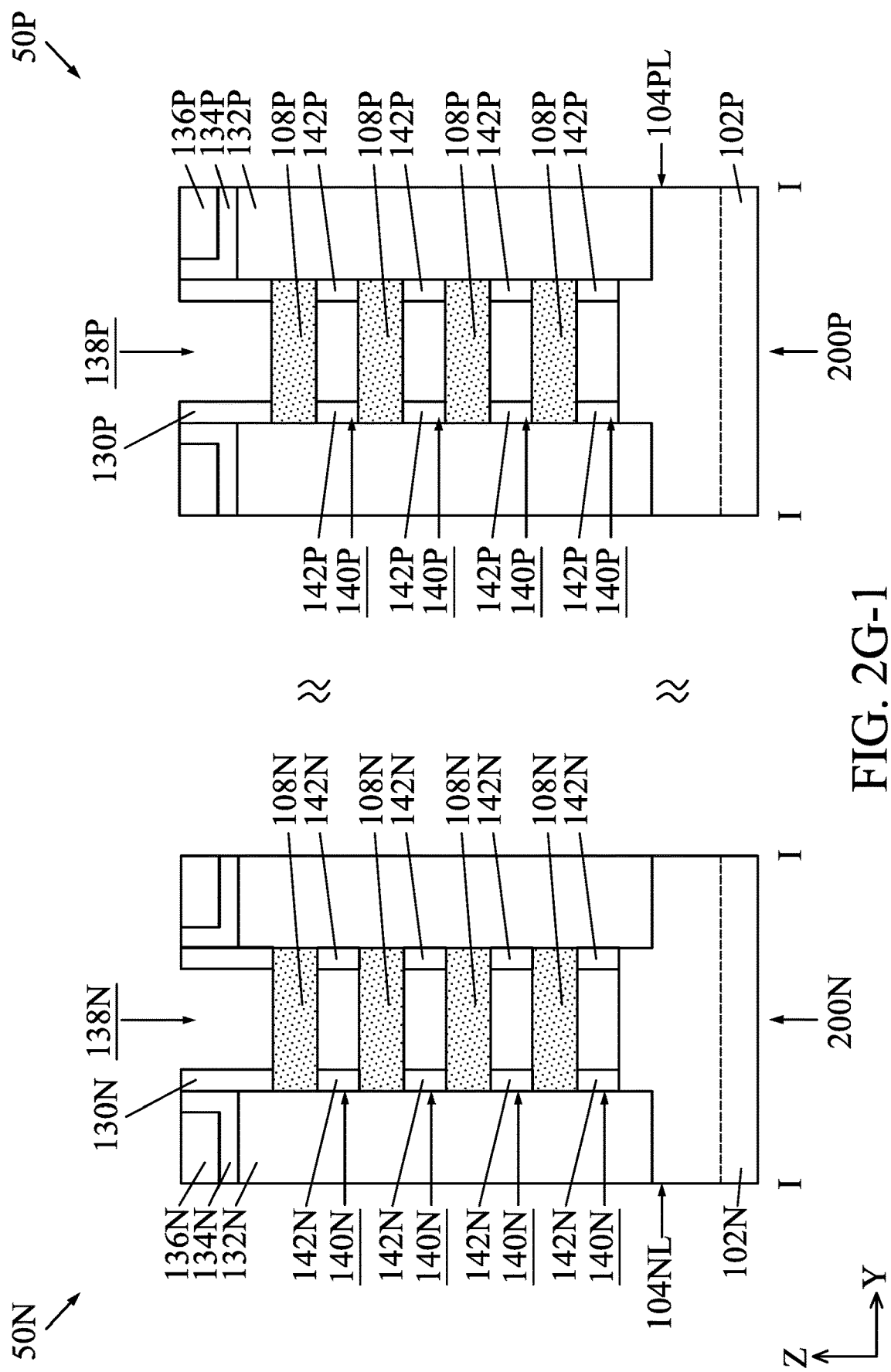
Figures 2, 2G:
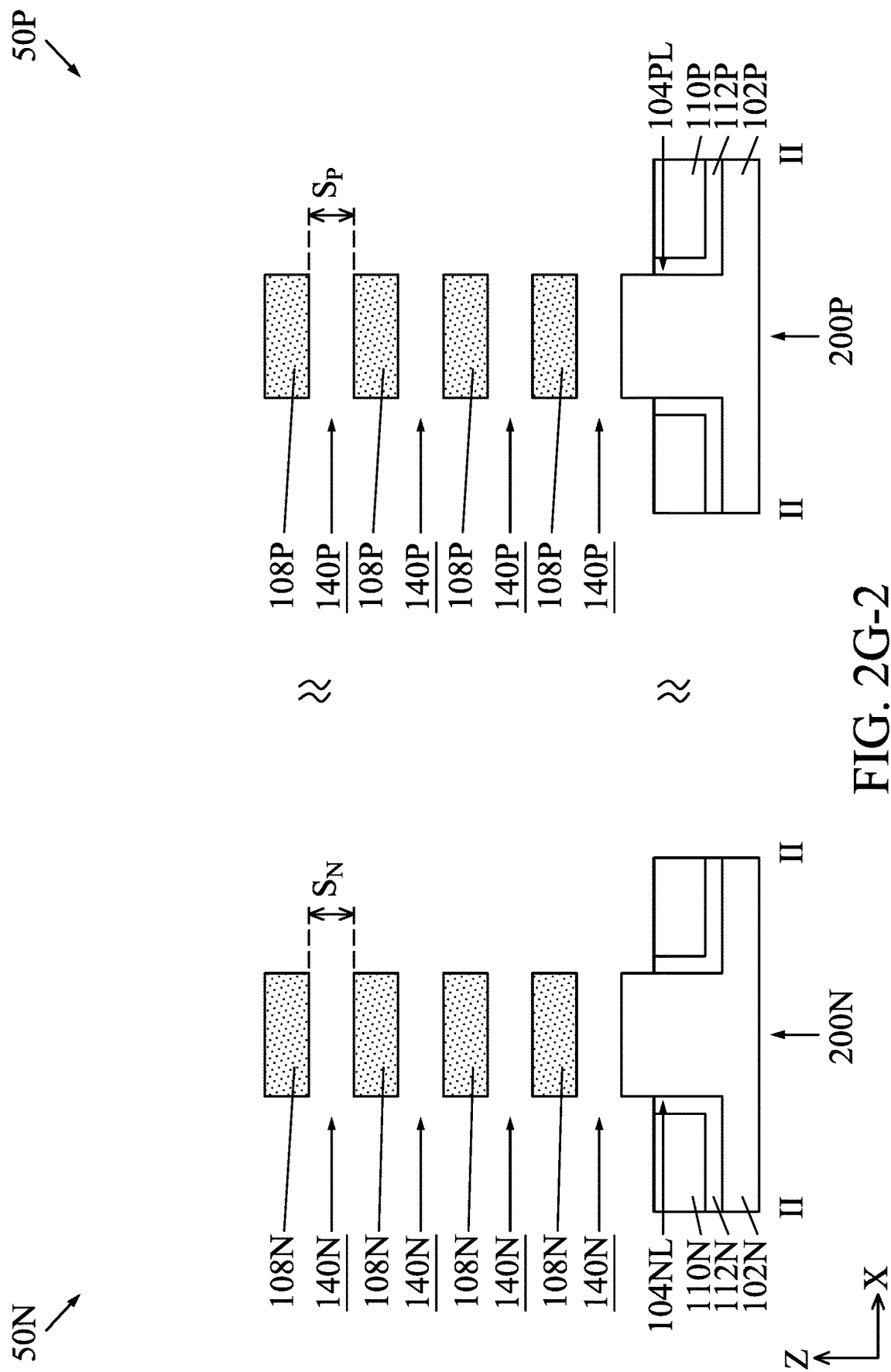
Figures 1, 2H:
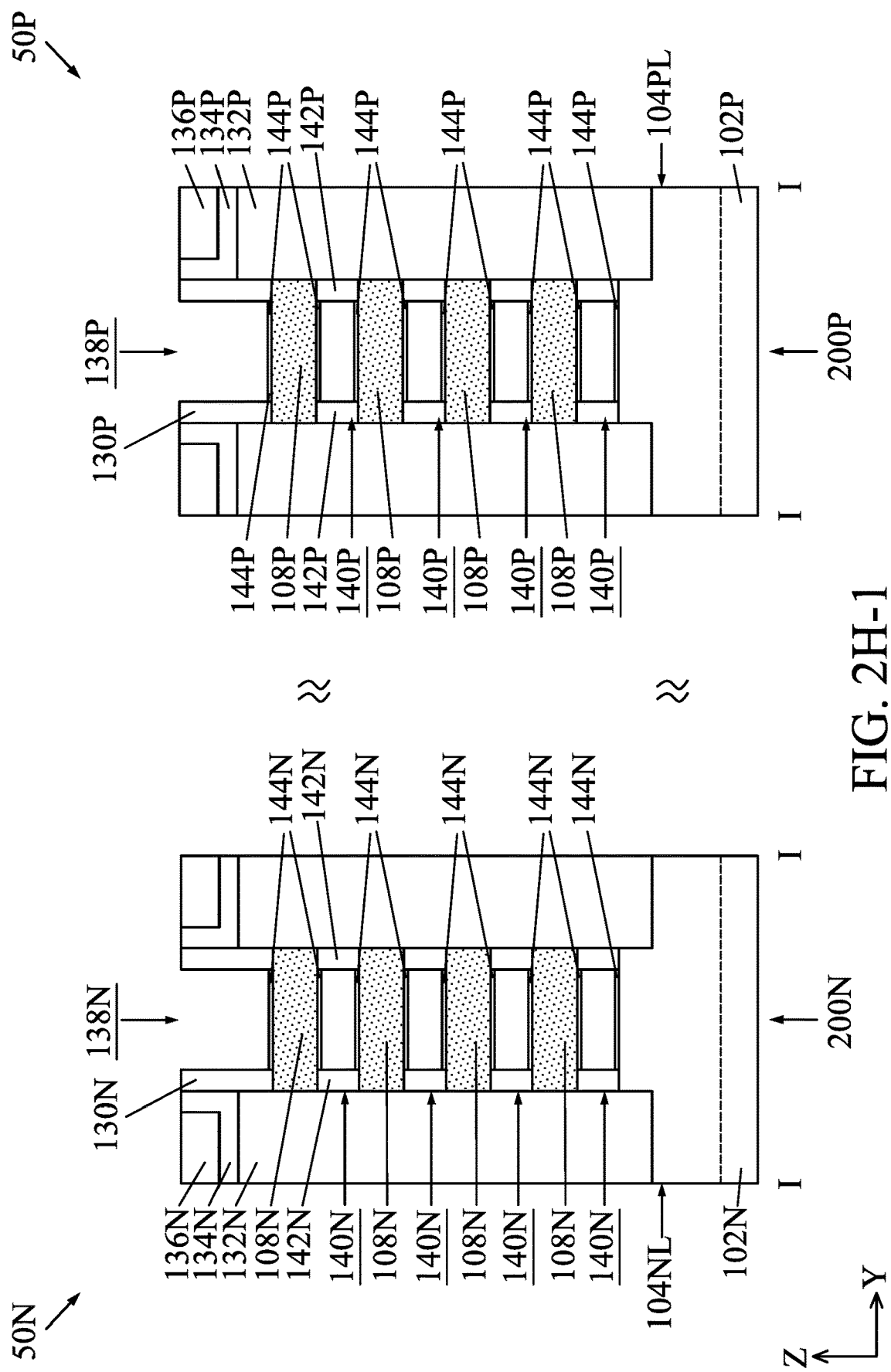
Figures 2, 2H:
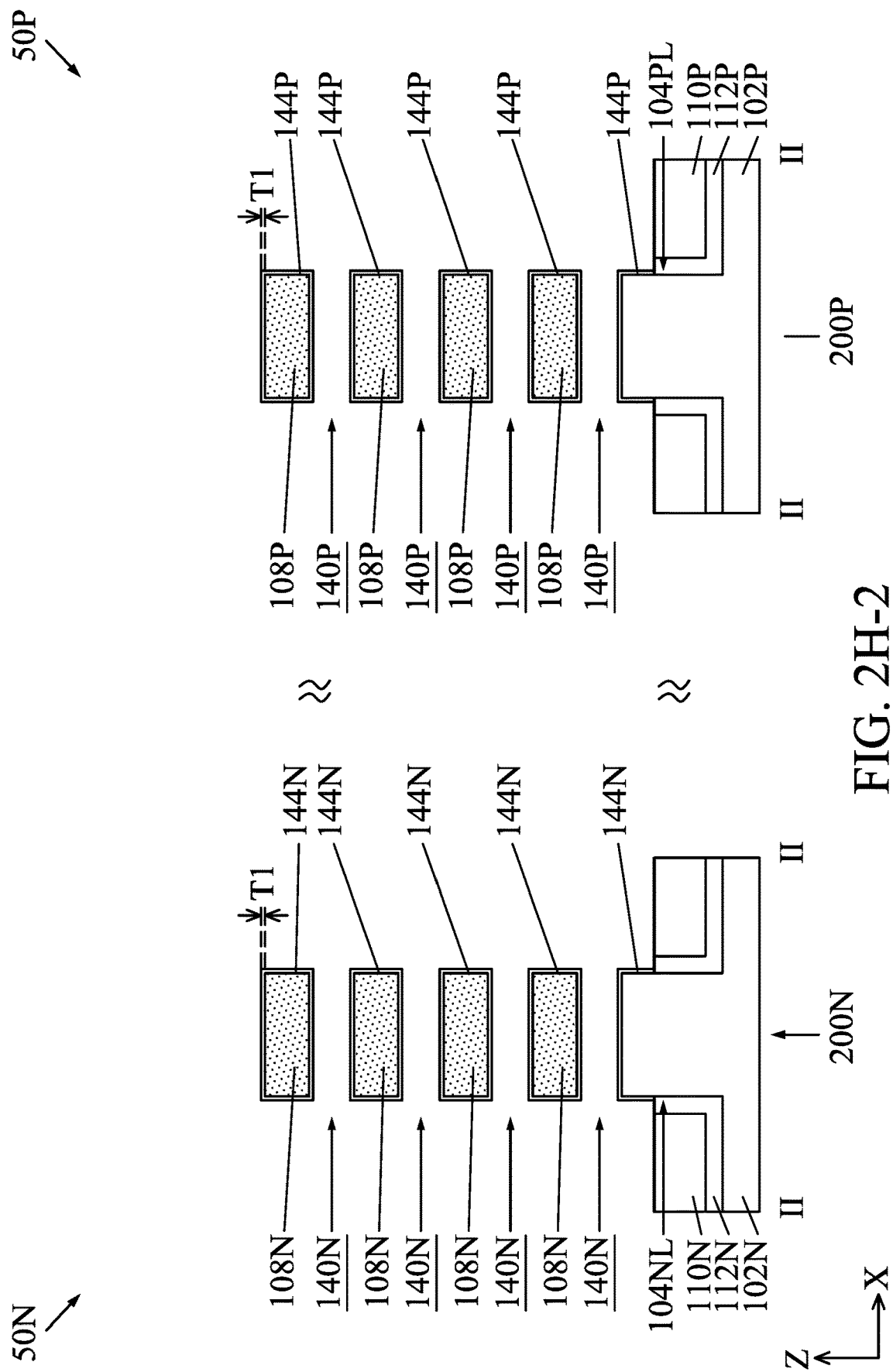
Figures 1, 2I:
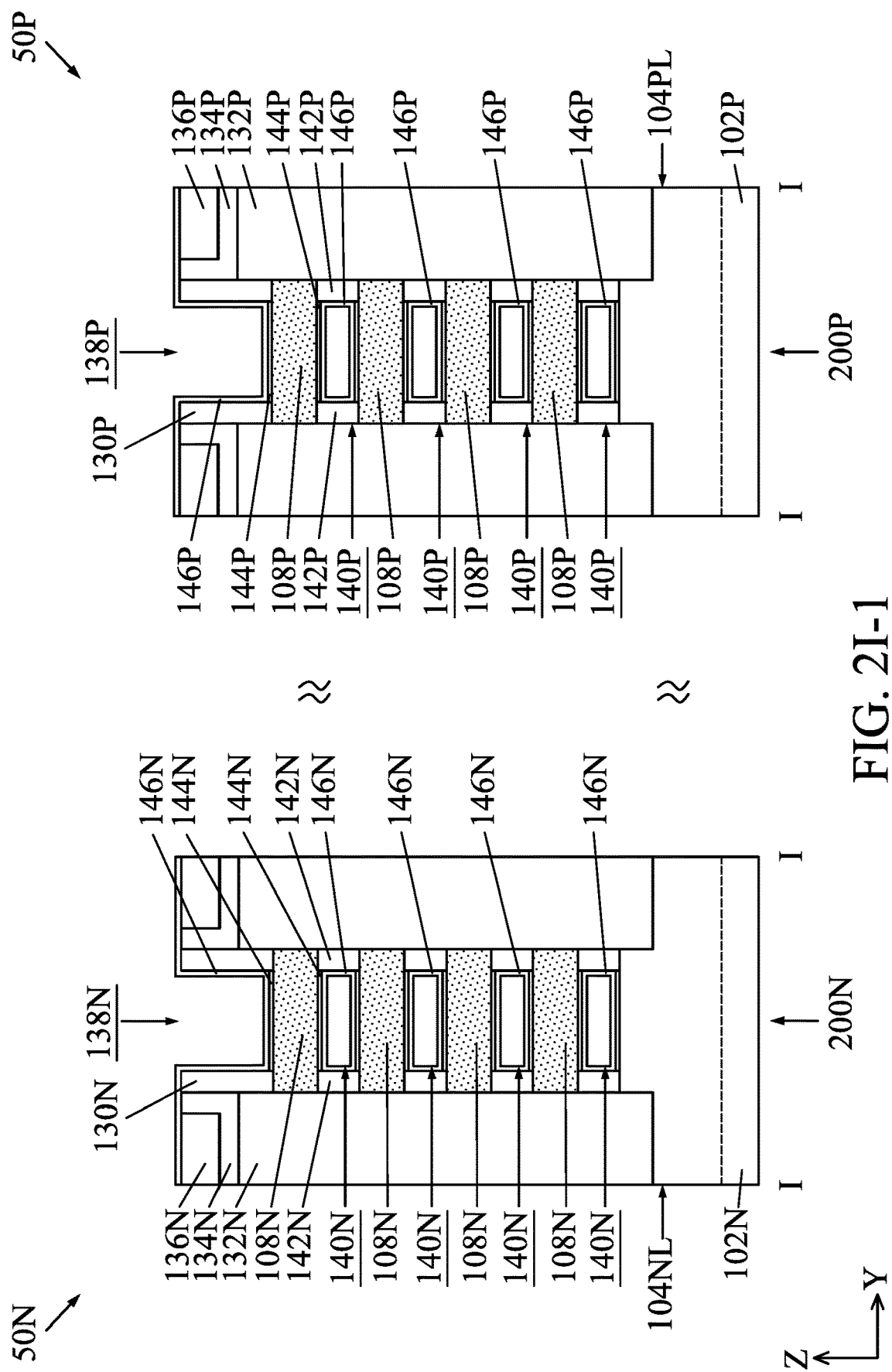
Figures 2, 2I:
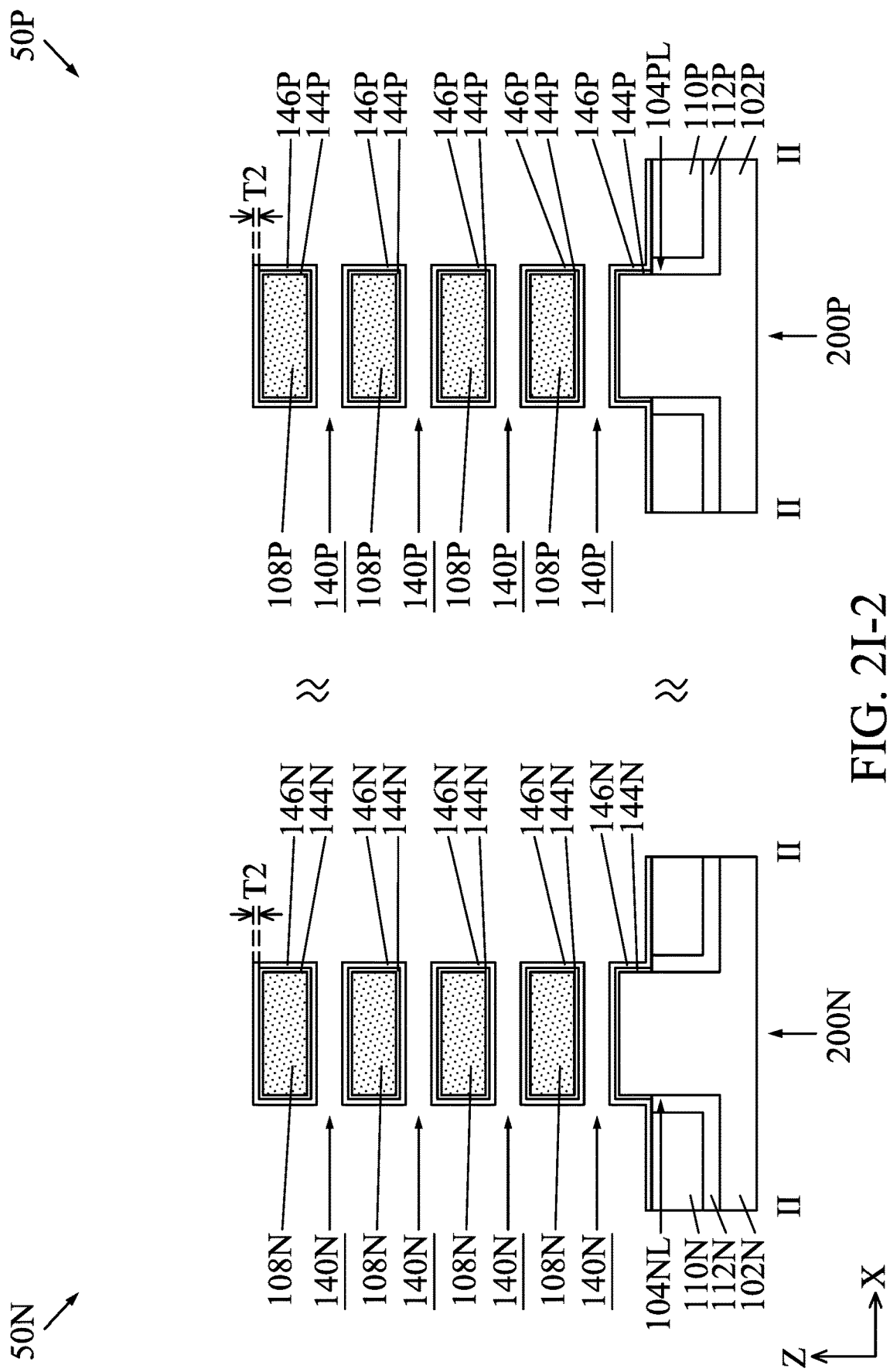
Figures 1, 2J:
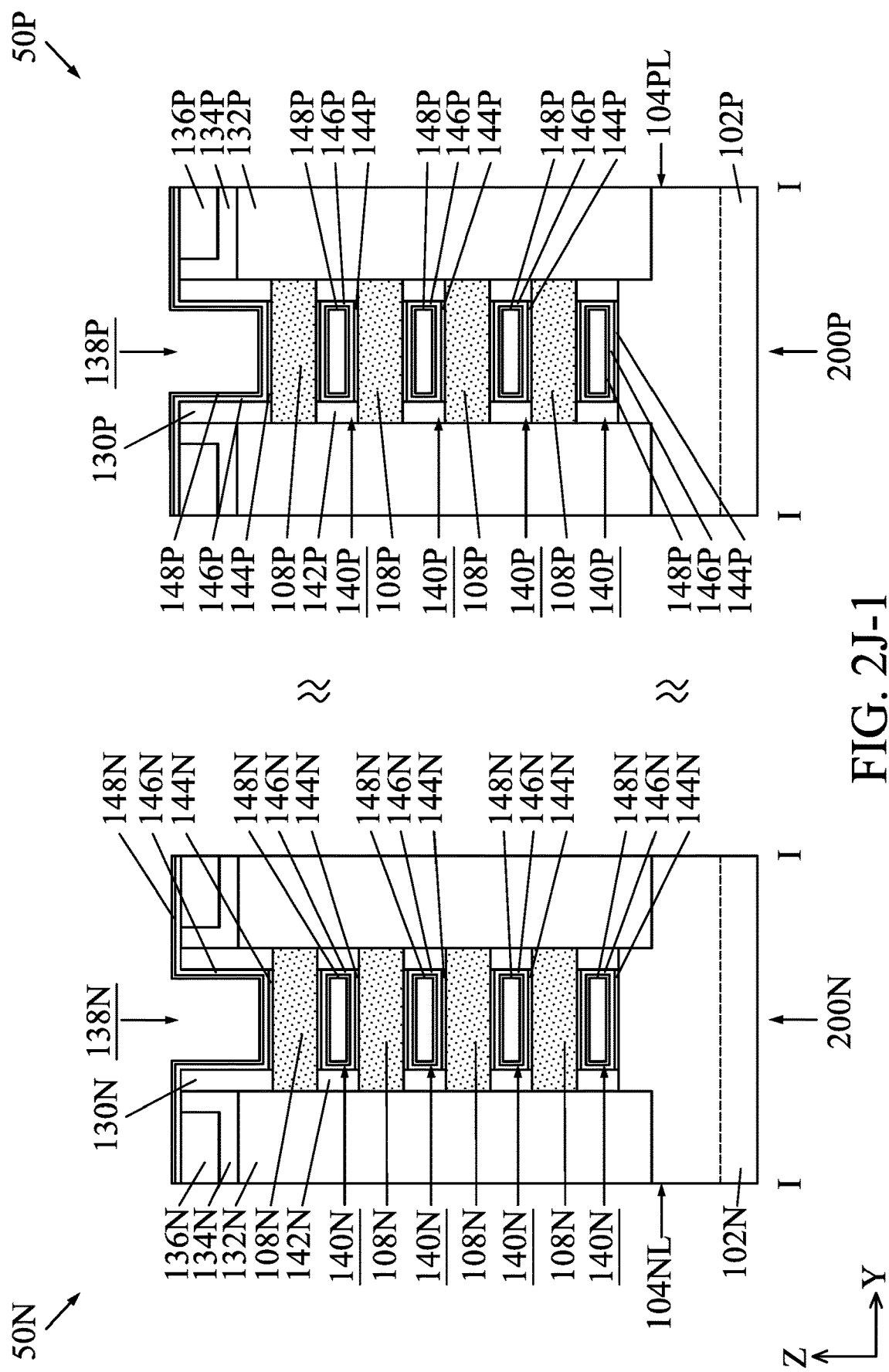
Figures 2, 2J:
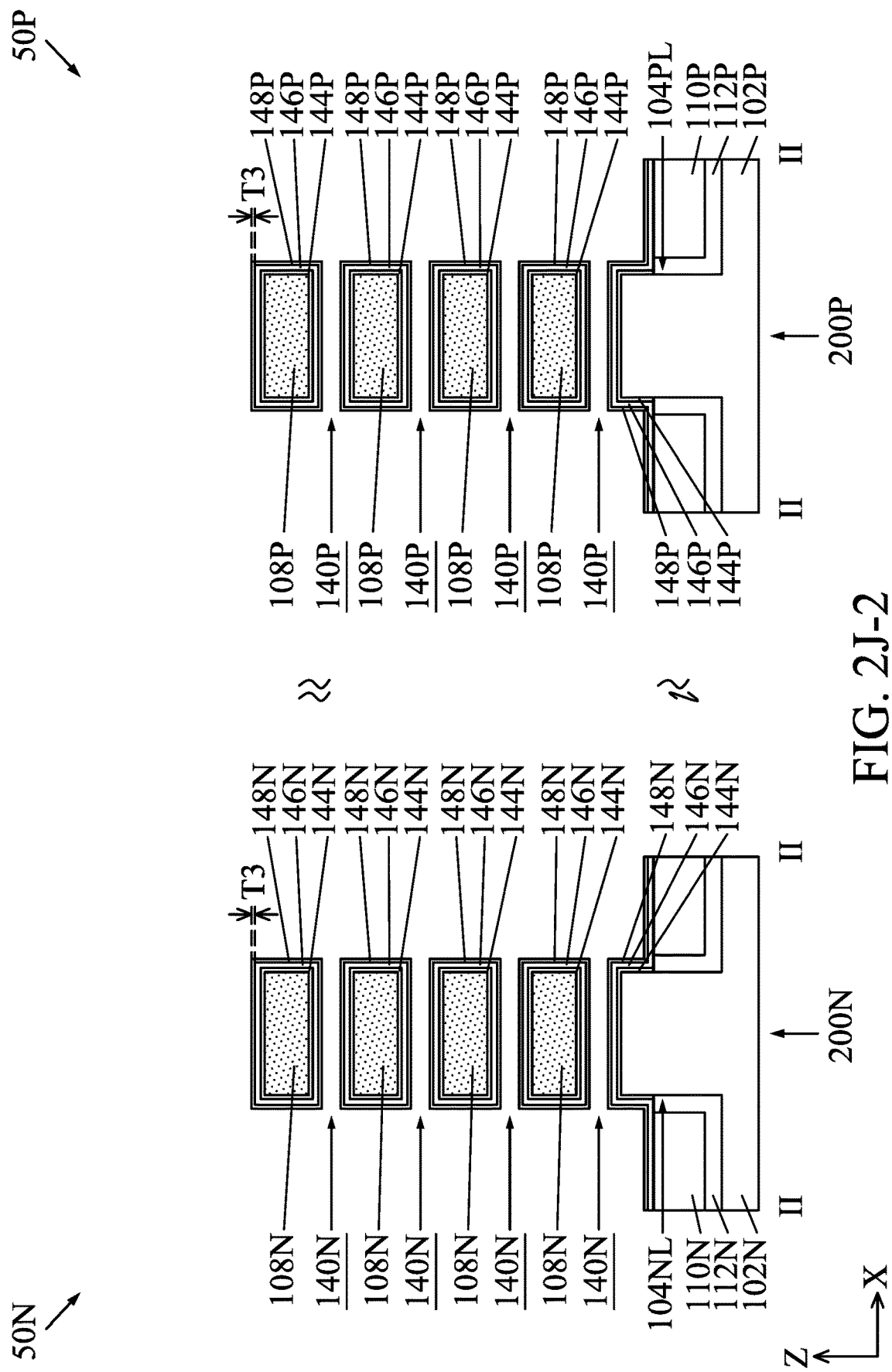
Figures 1, 2K:
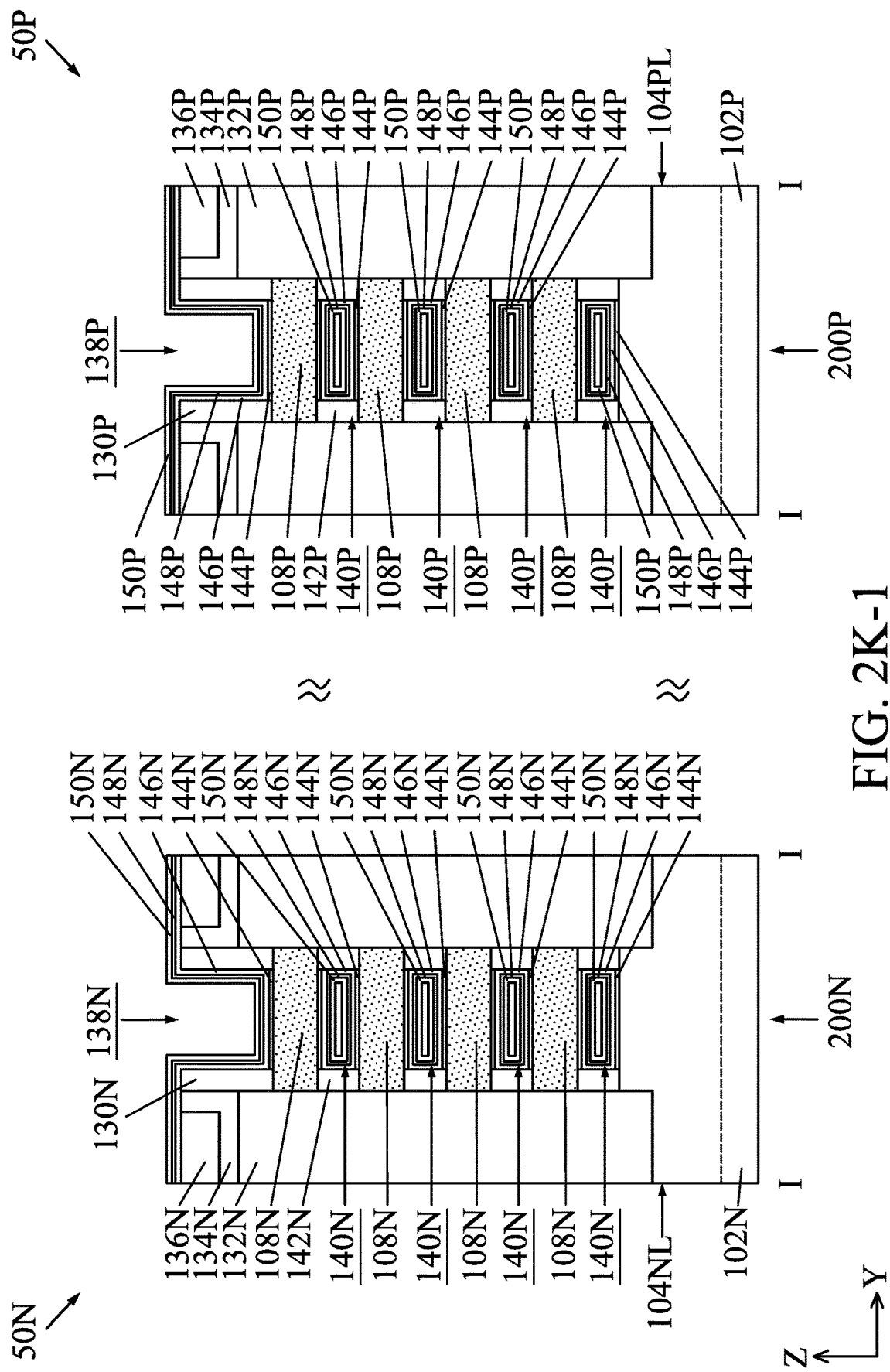
Figures 2, 2K:
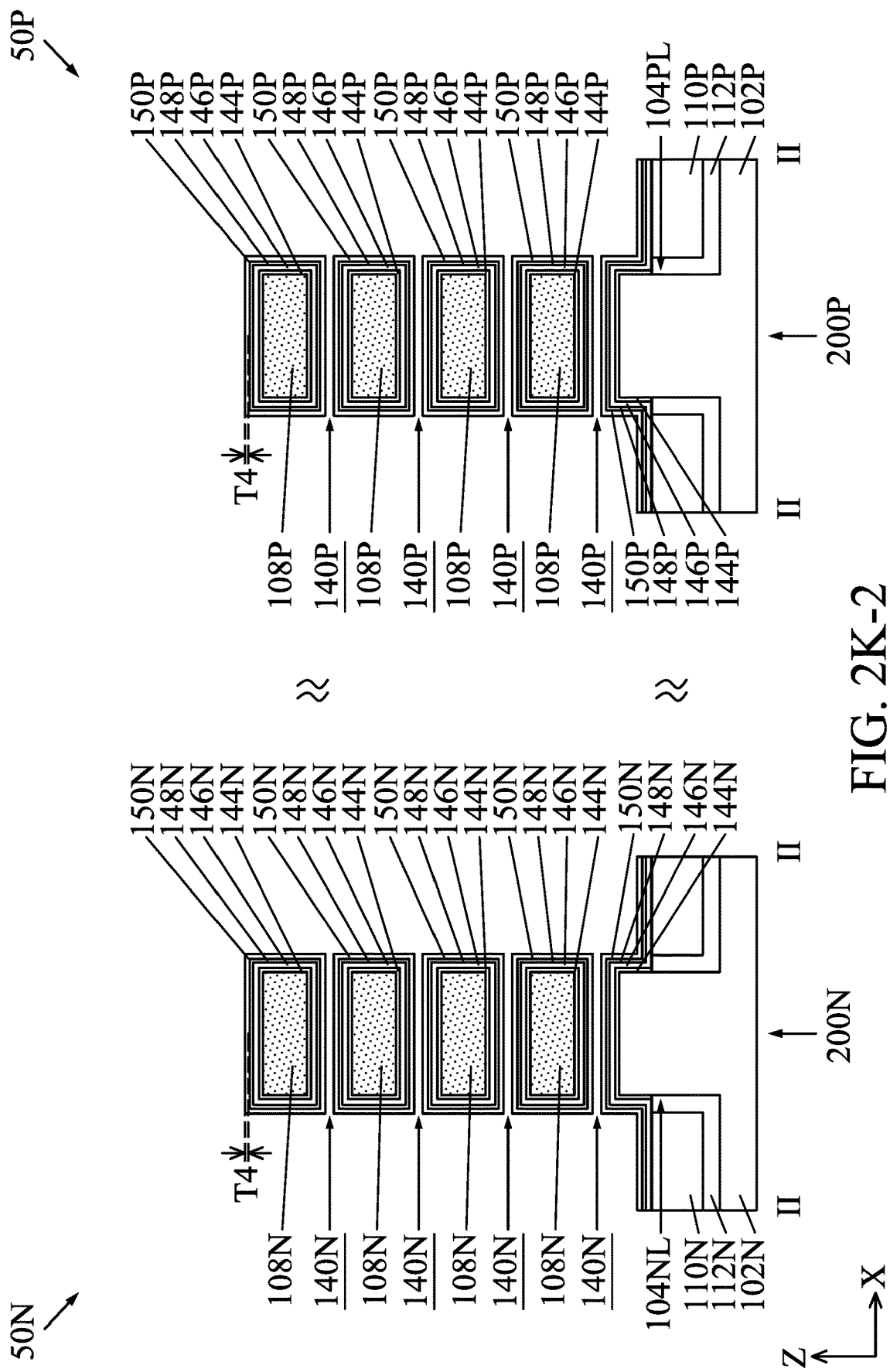
Figures 1, 2L:
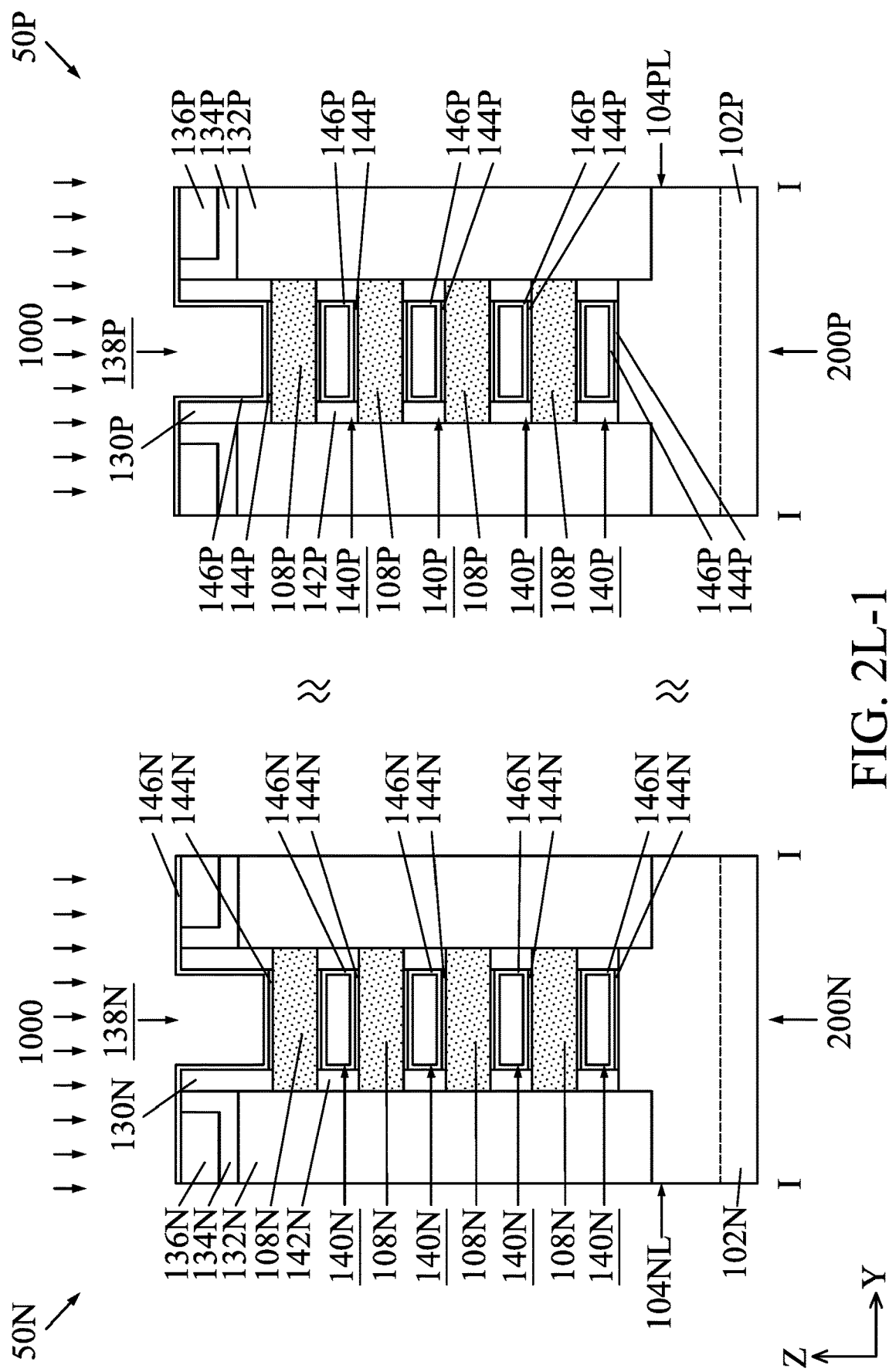
Figures 2, 2L:
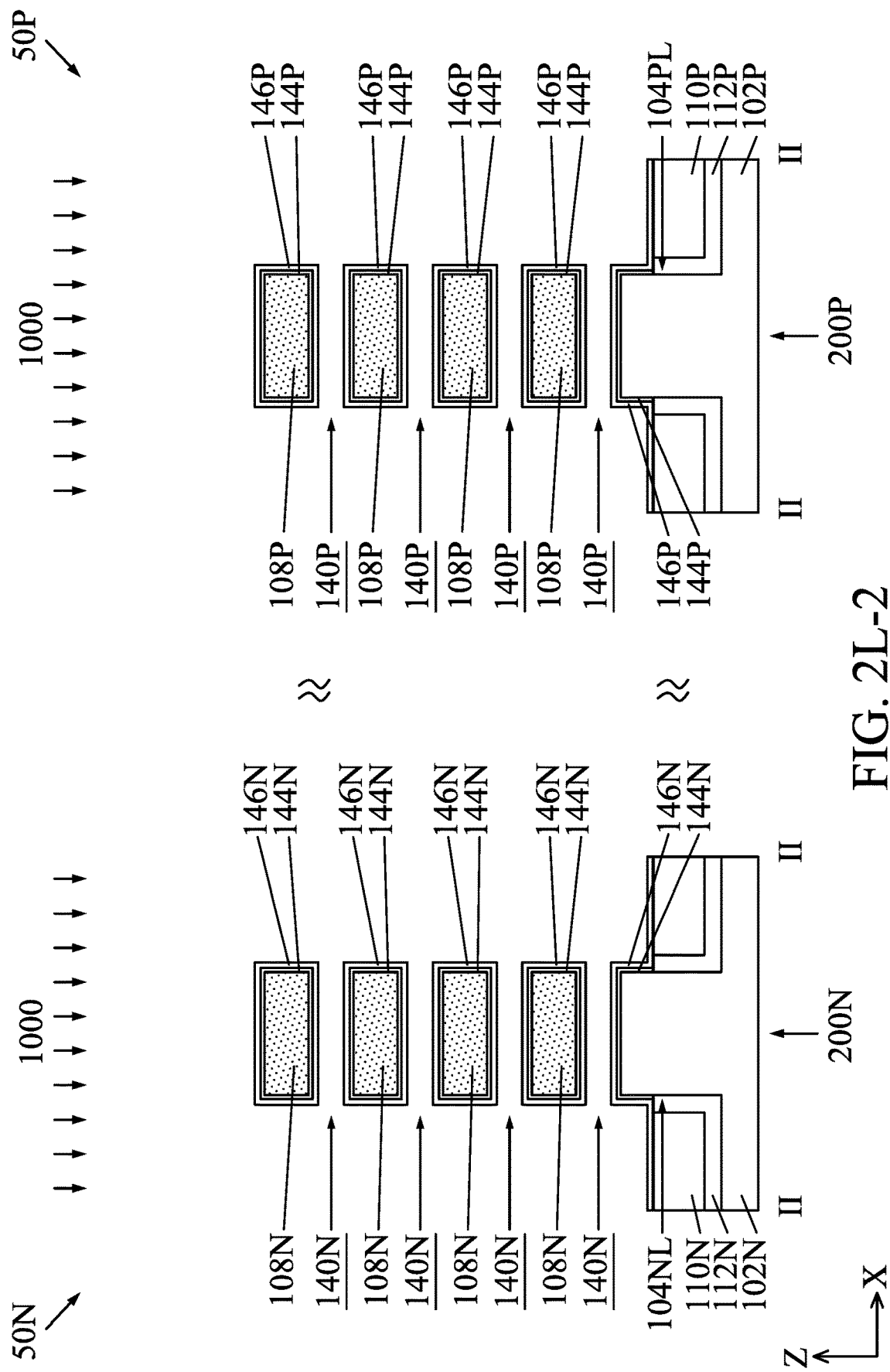
Figures 1, 2M:
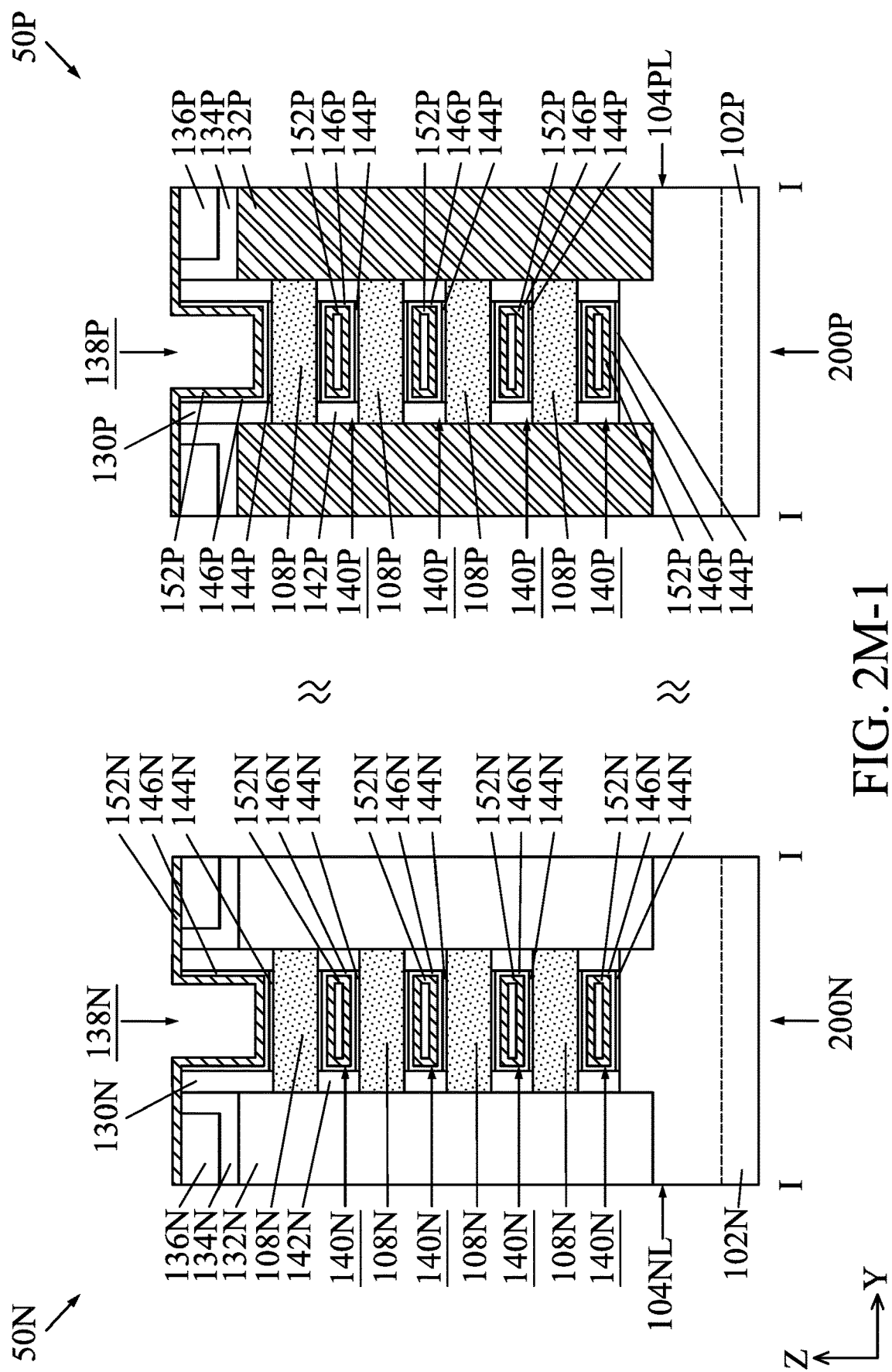
Figures 2, 2M:
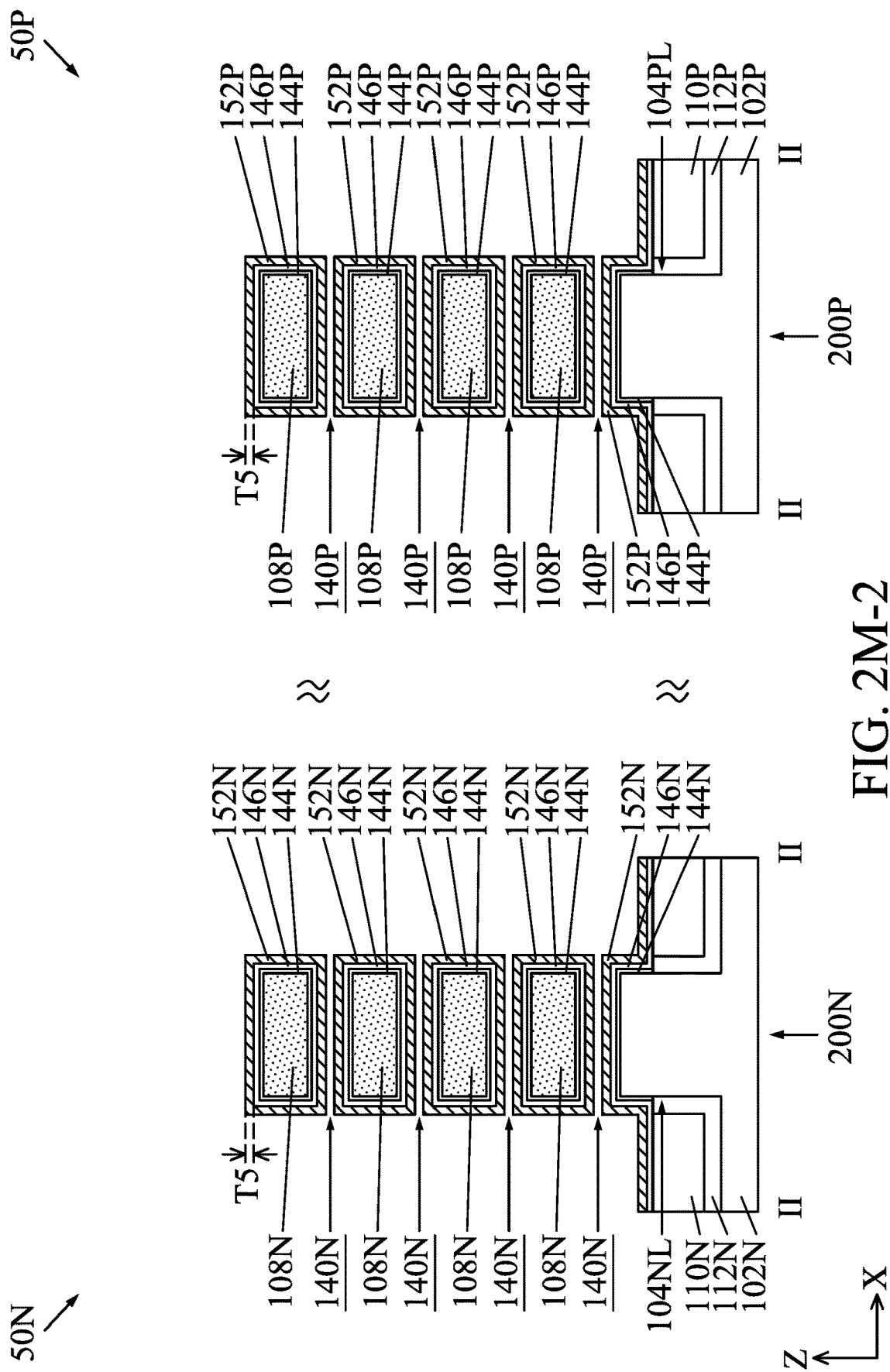
Figures 1, 2N:
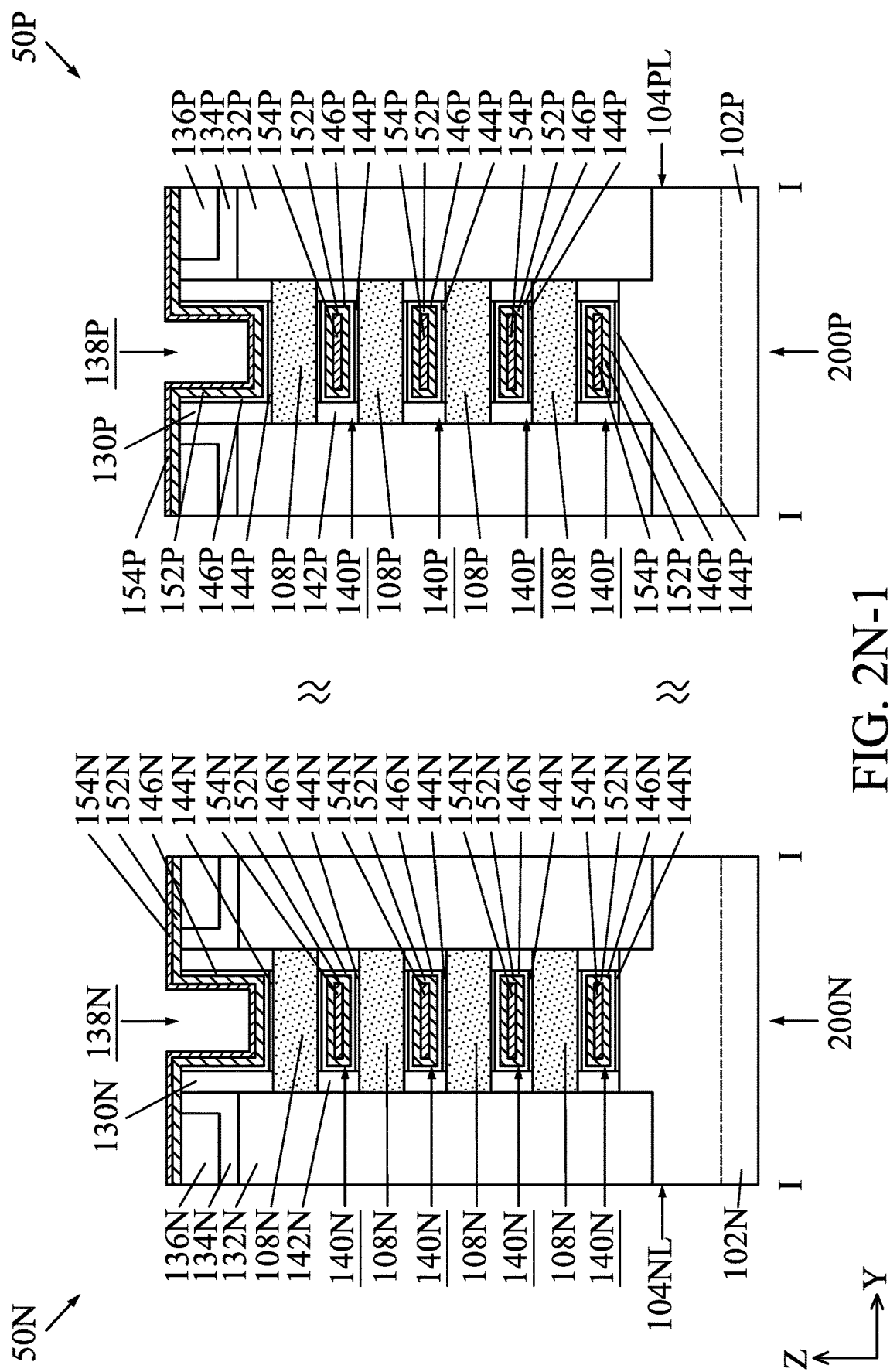
Figures 2, 2N:
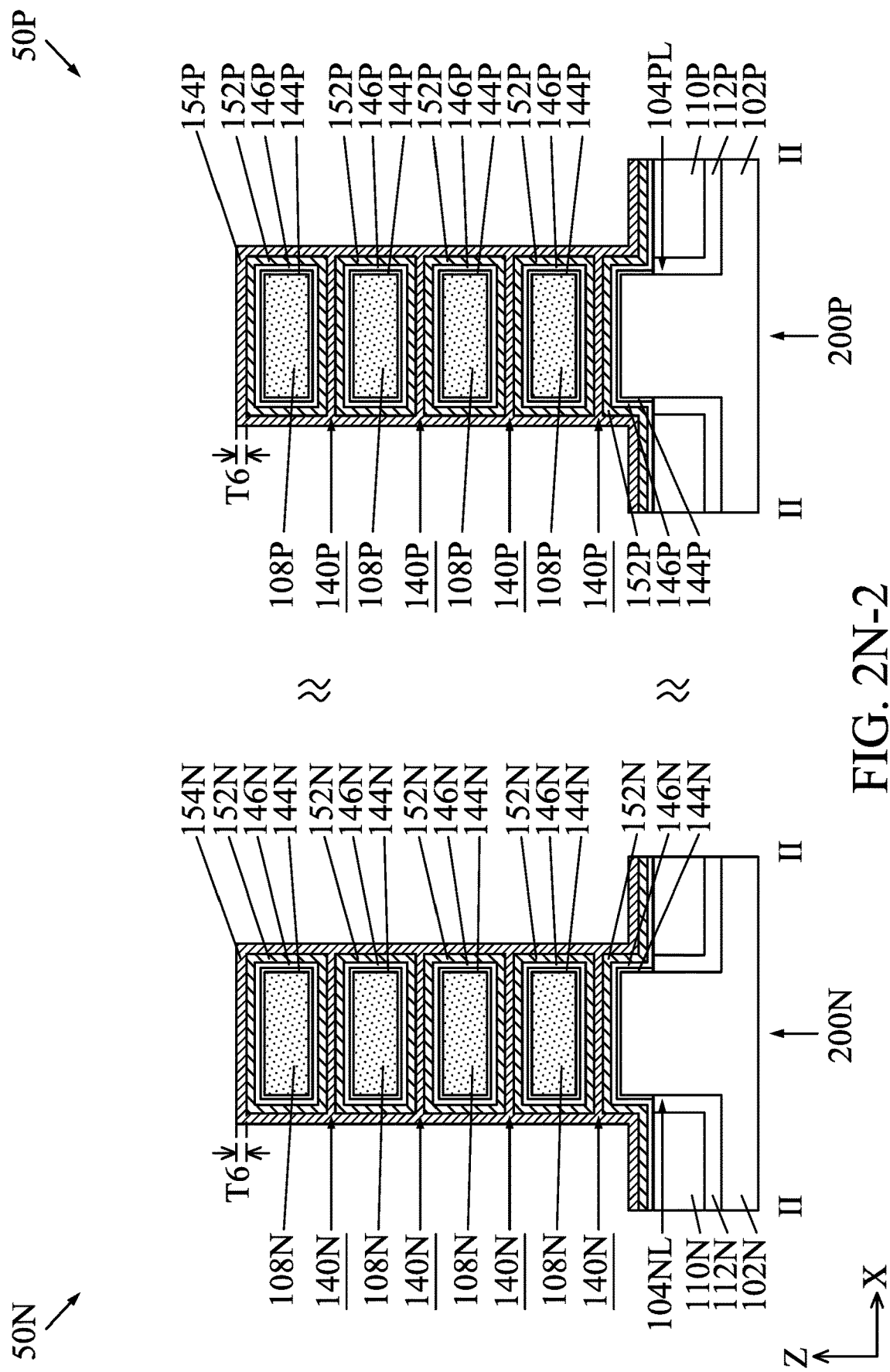
Figures 1, 2O:
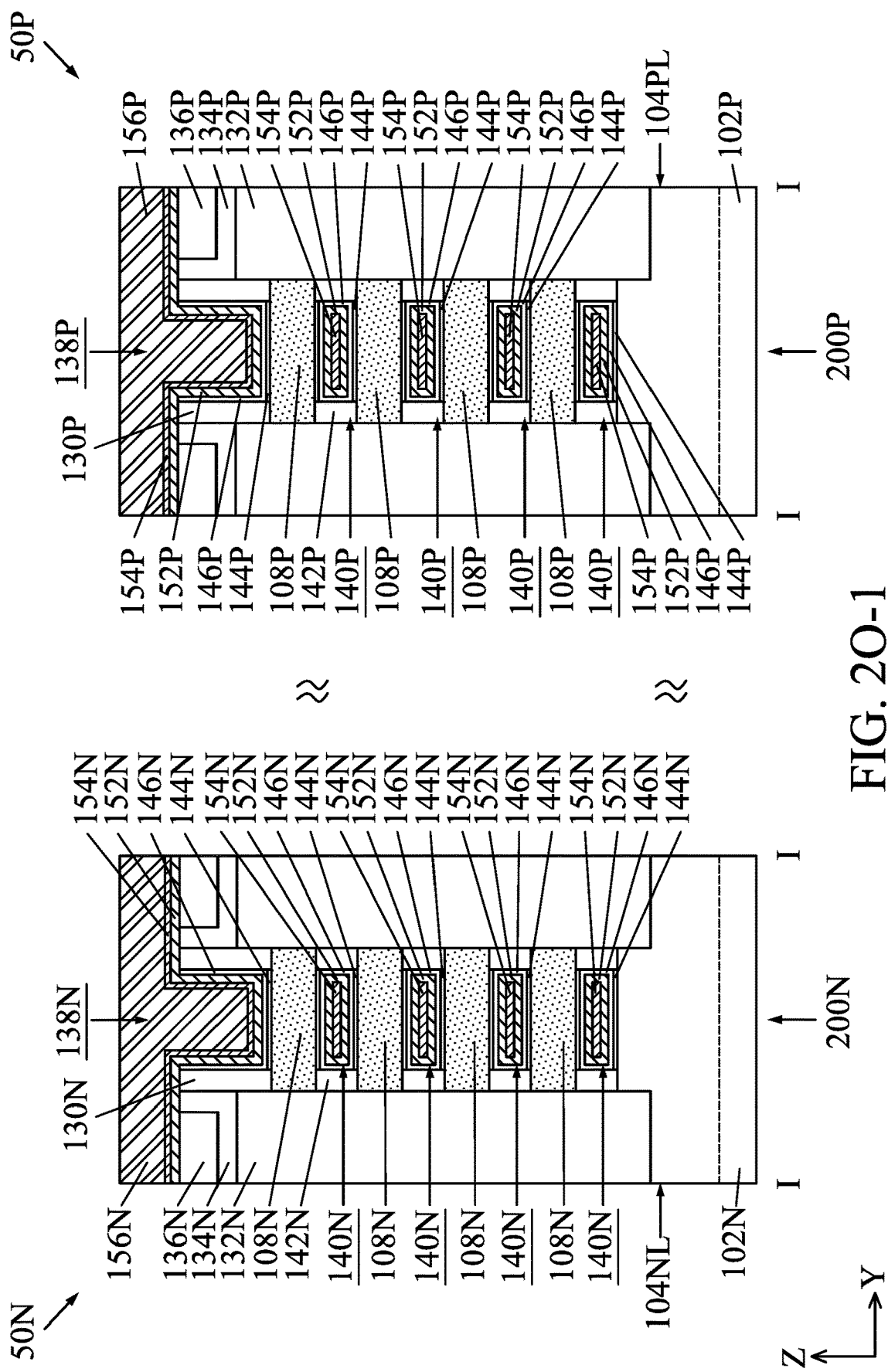
Figures 2, 20:
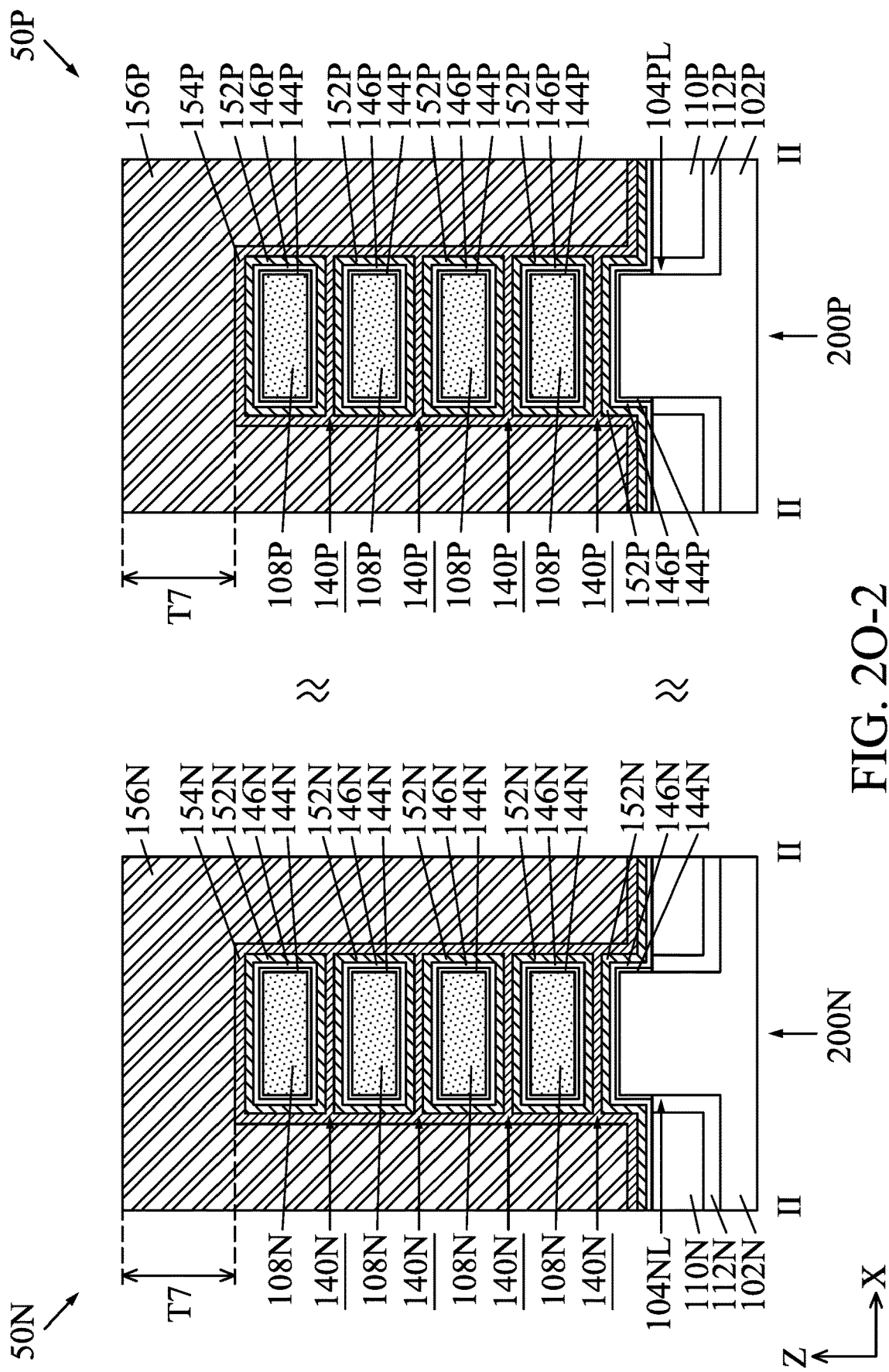
Figures 1, 2P:
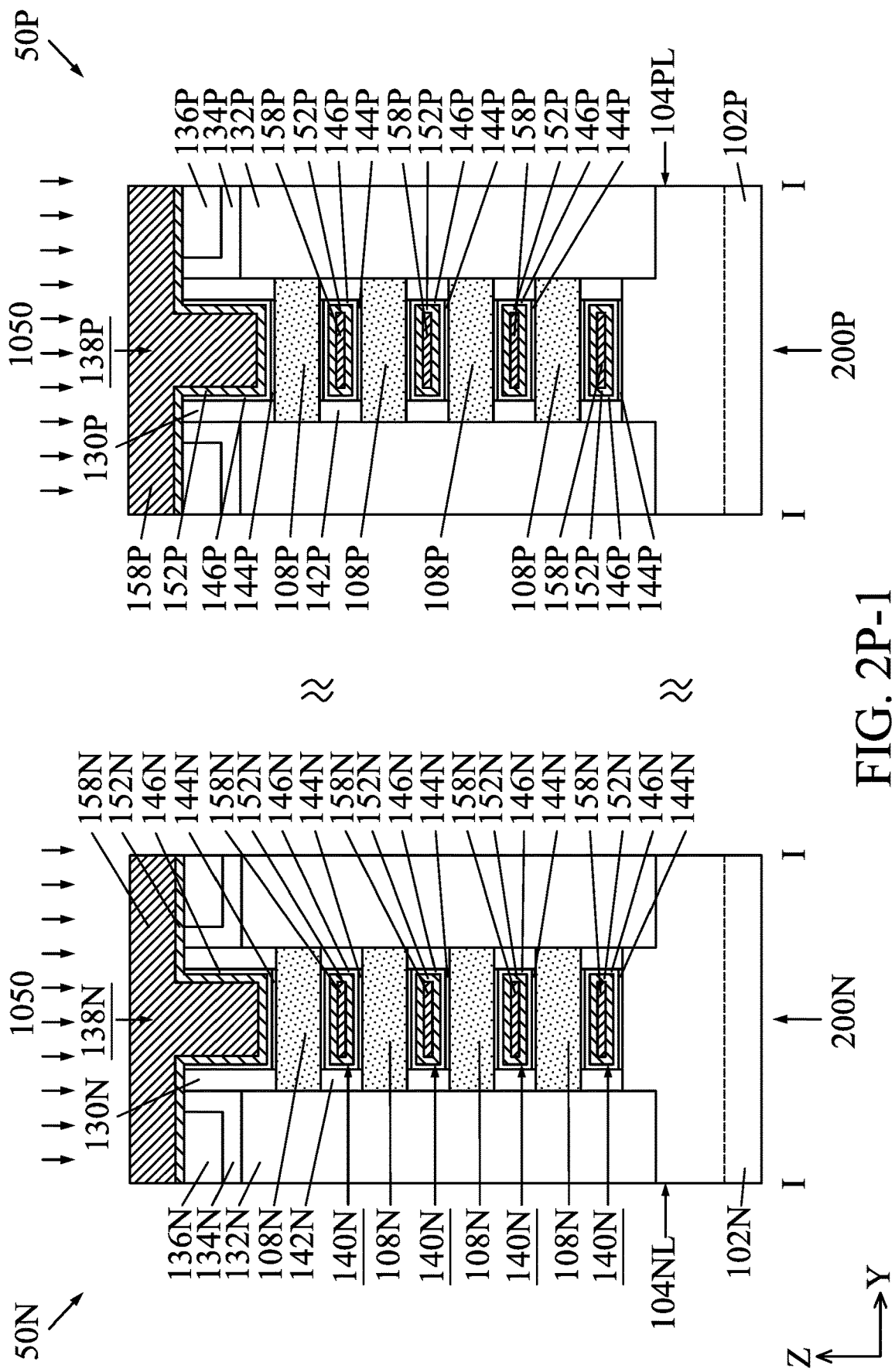
Figures 2, 2P:
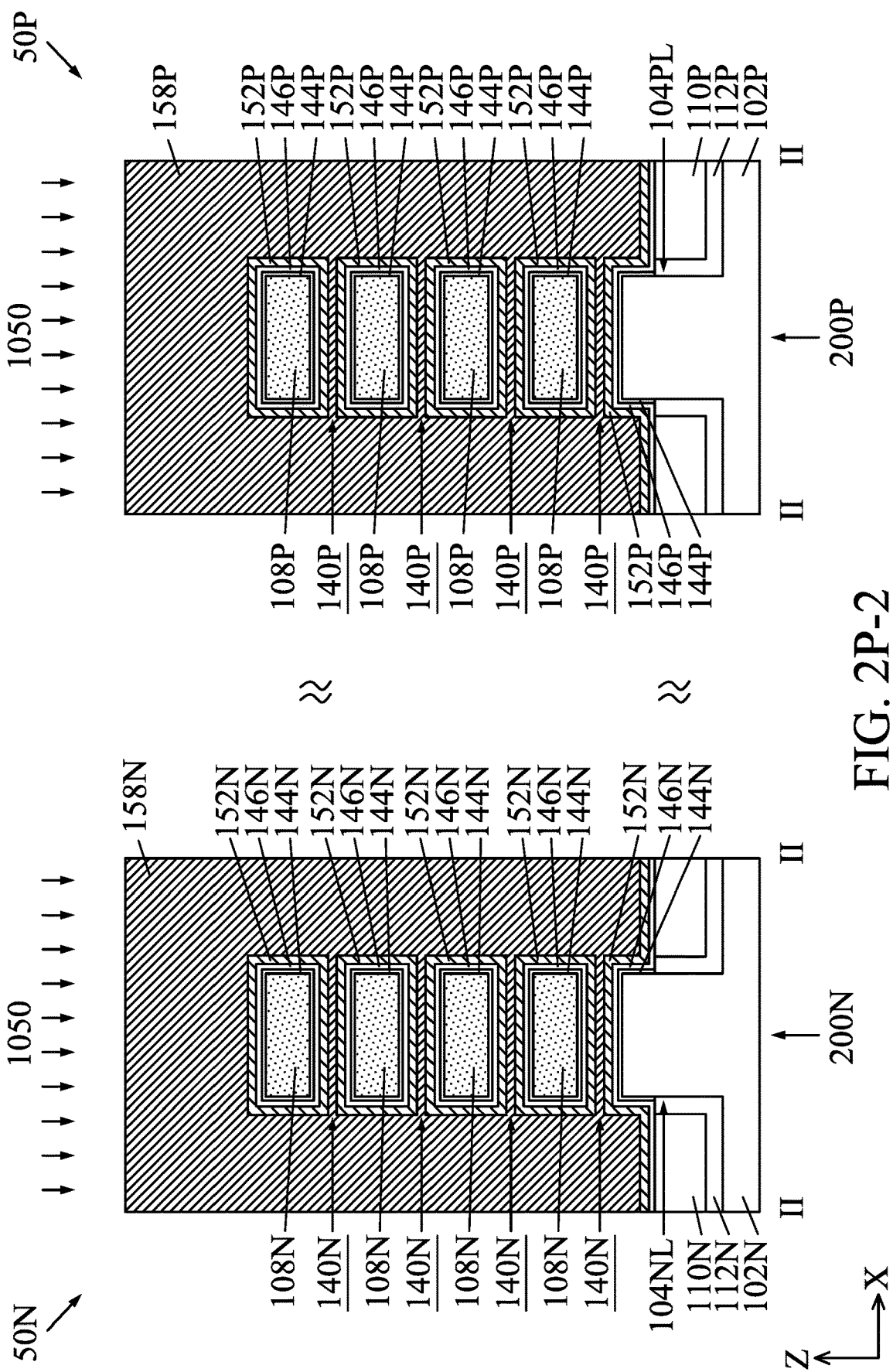
Figures 1, 2Q:
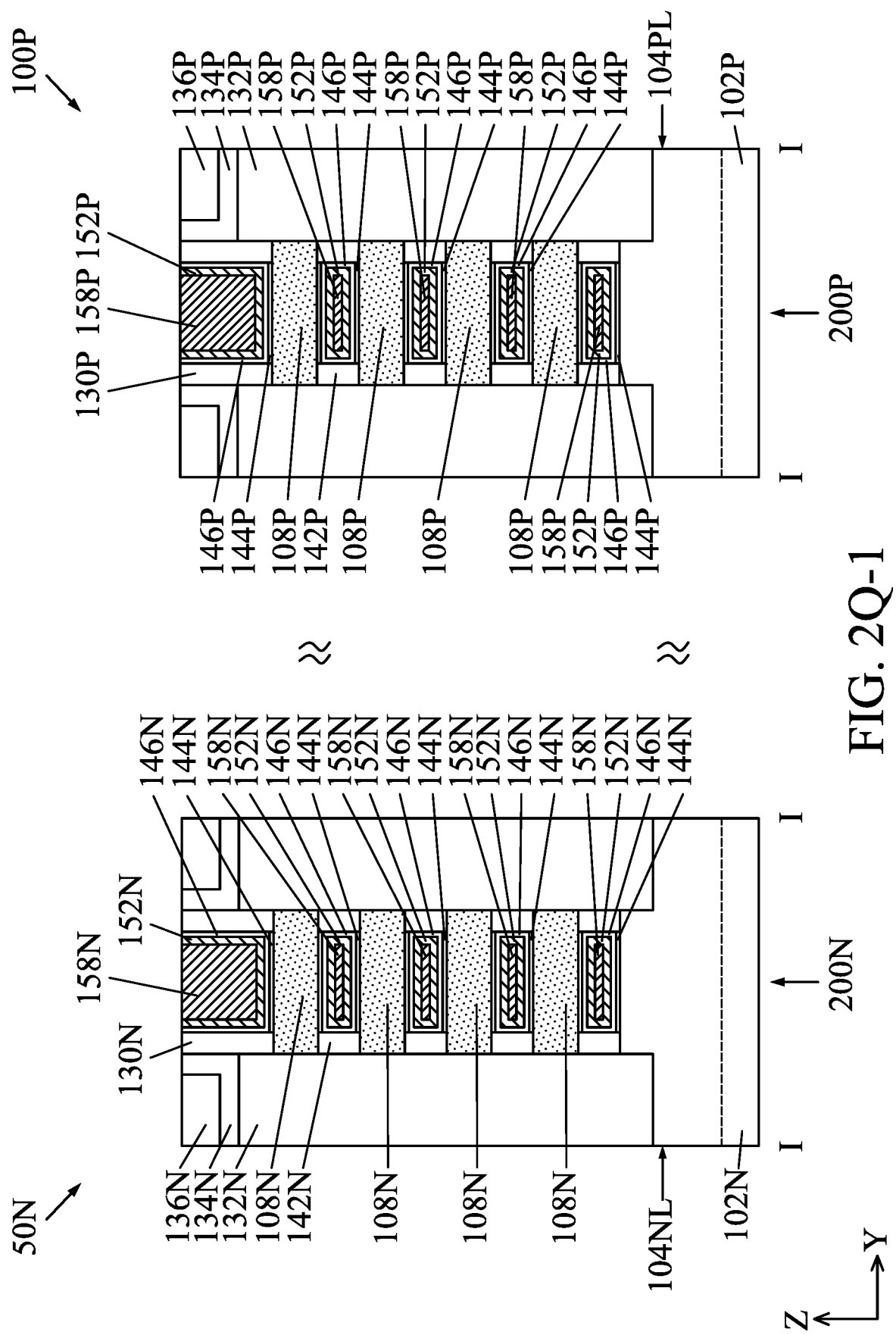
Figures 2, 2Q:
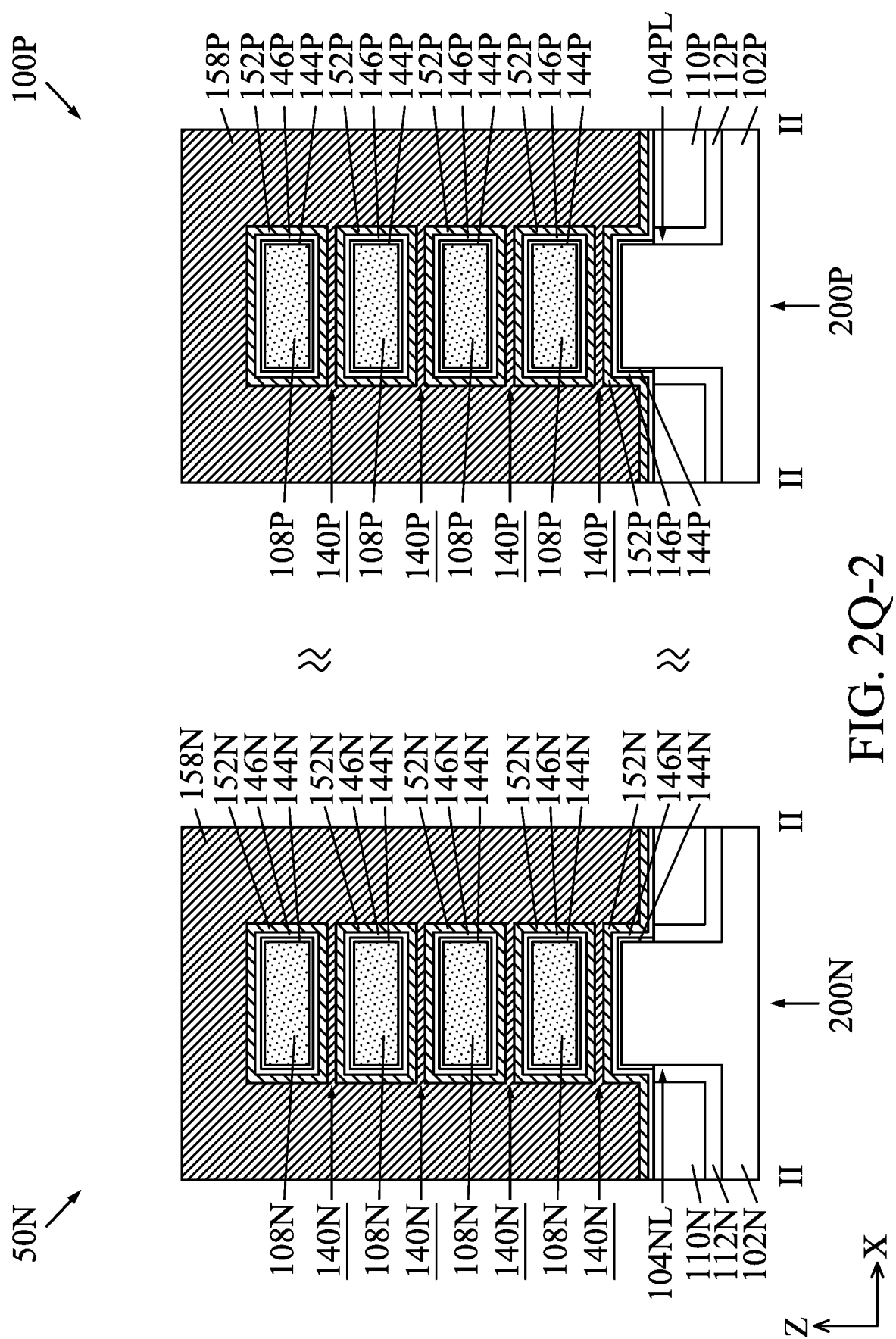
Figures 1, 2R:
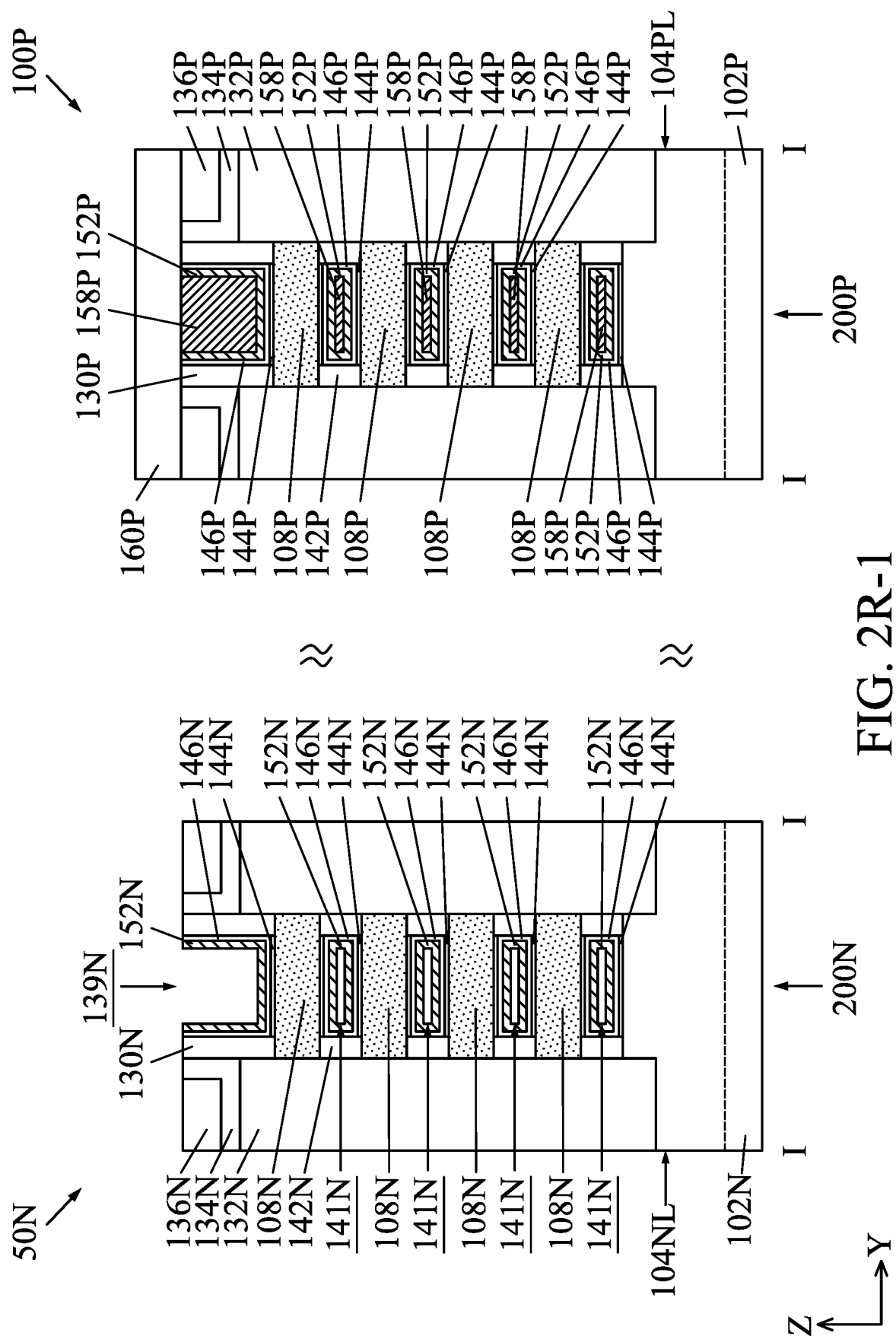
Figures 2, 2R:
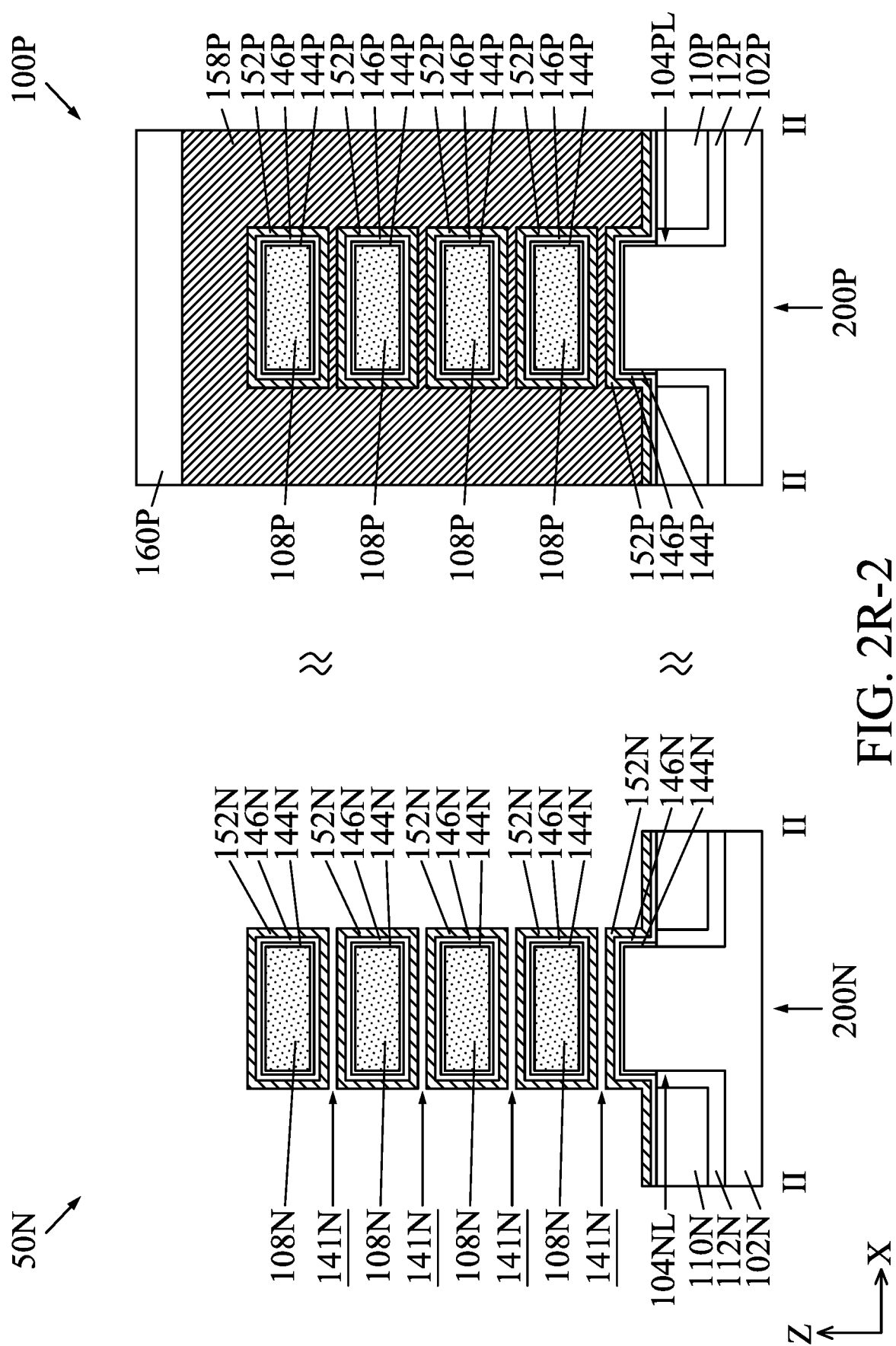
Figures 1, 2S:
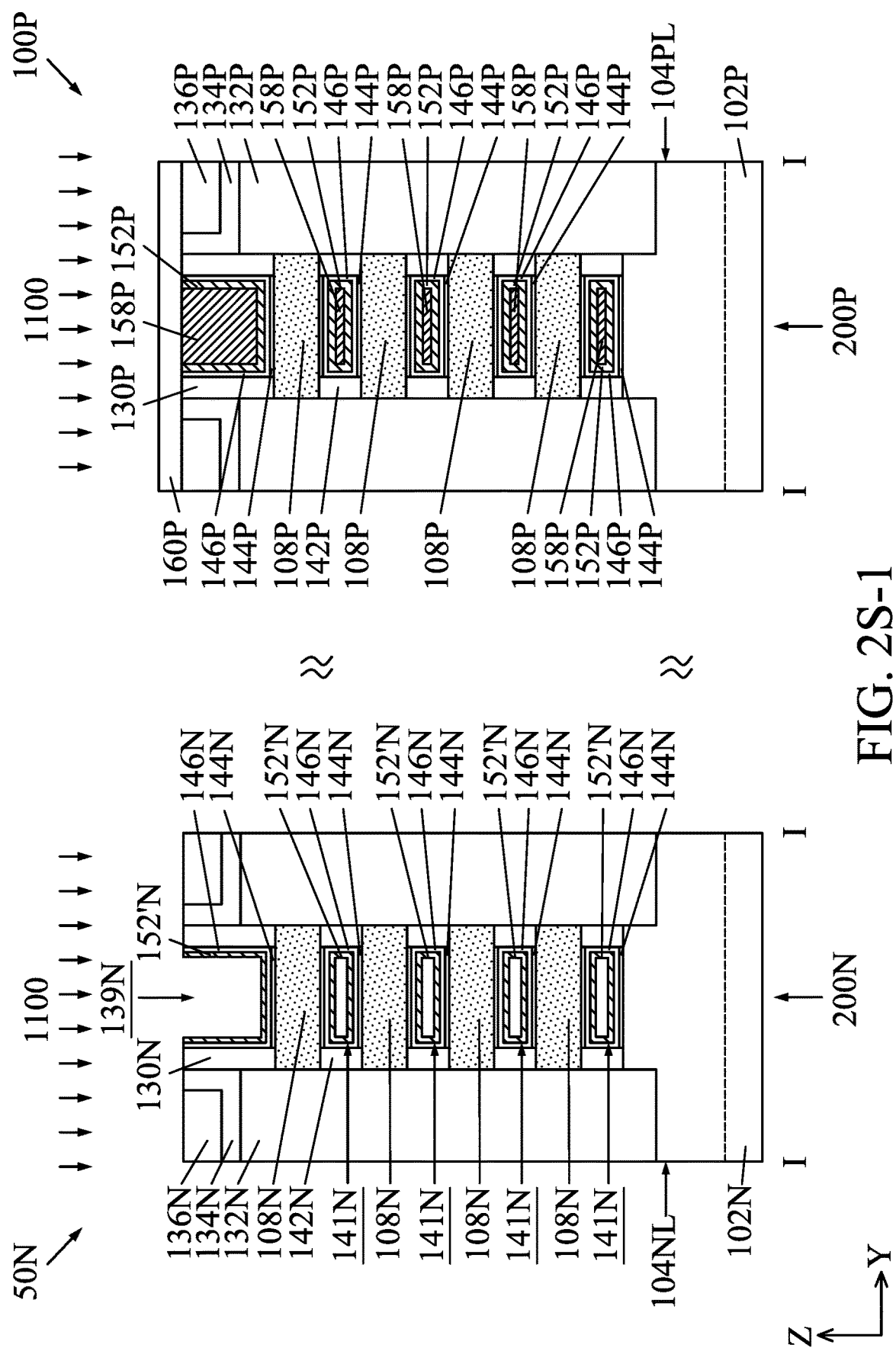
Figures 2, 2S:
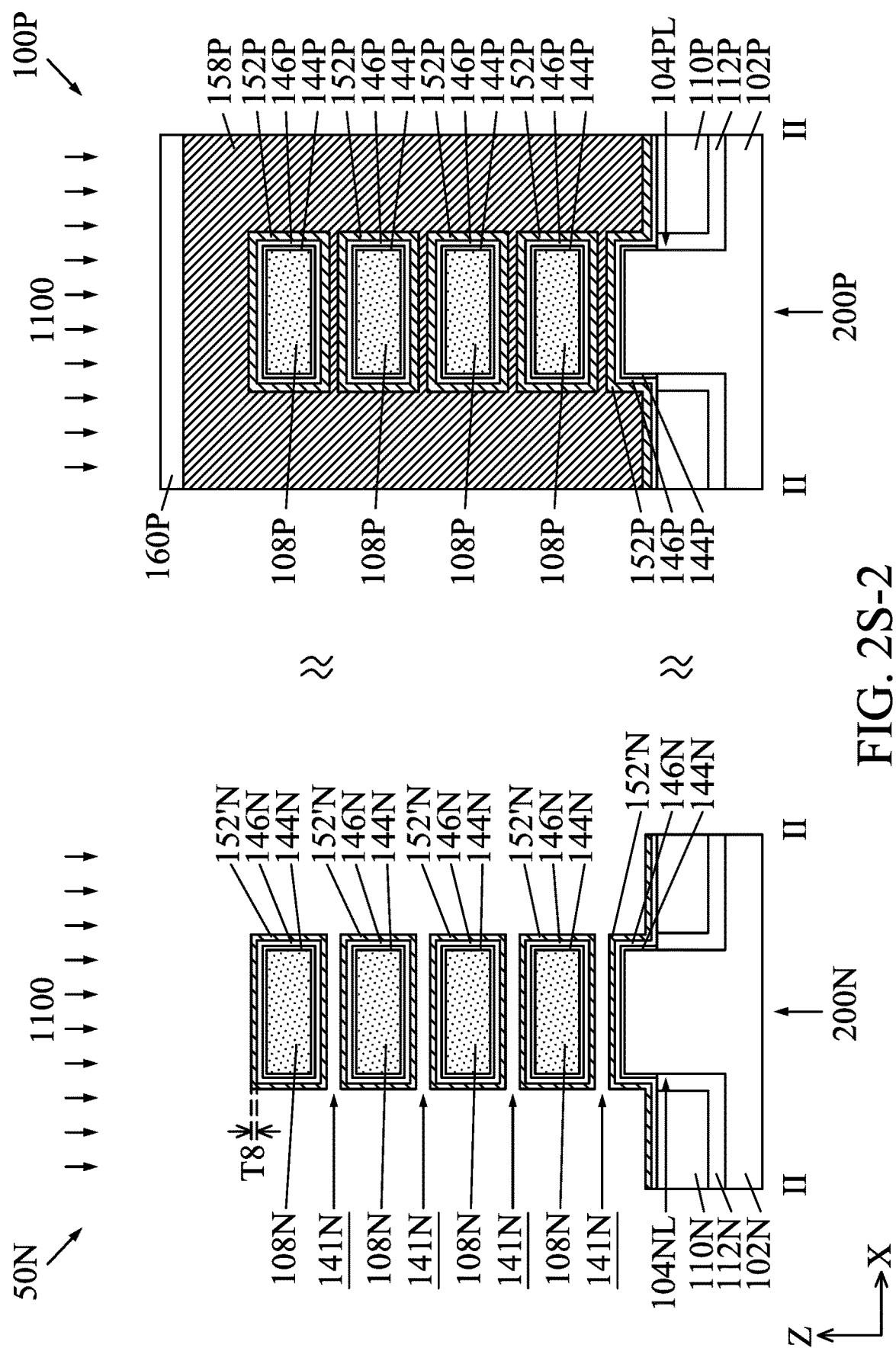
Figures 1, 2T:
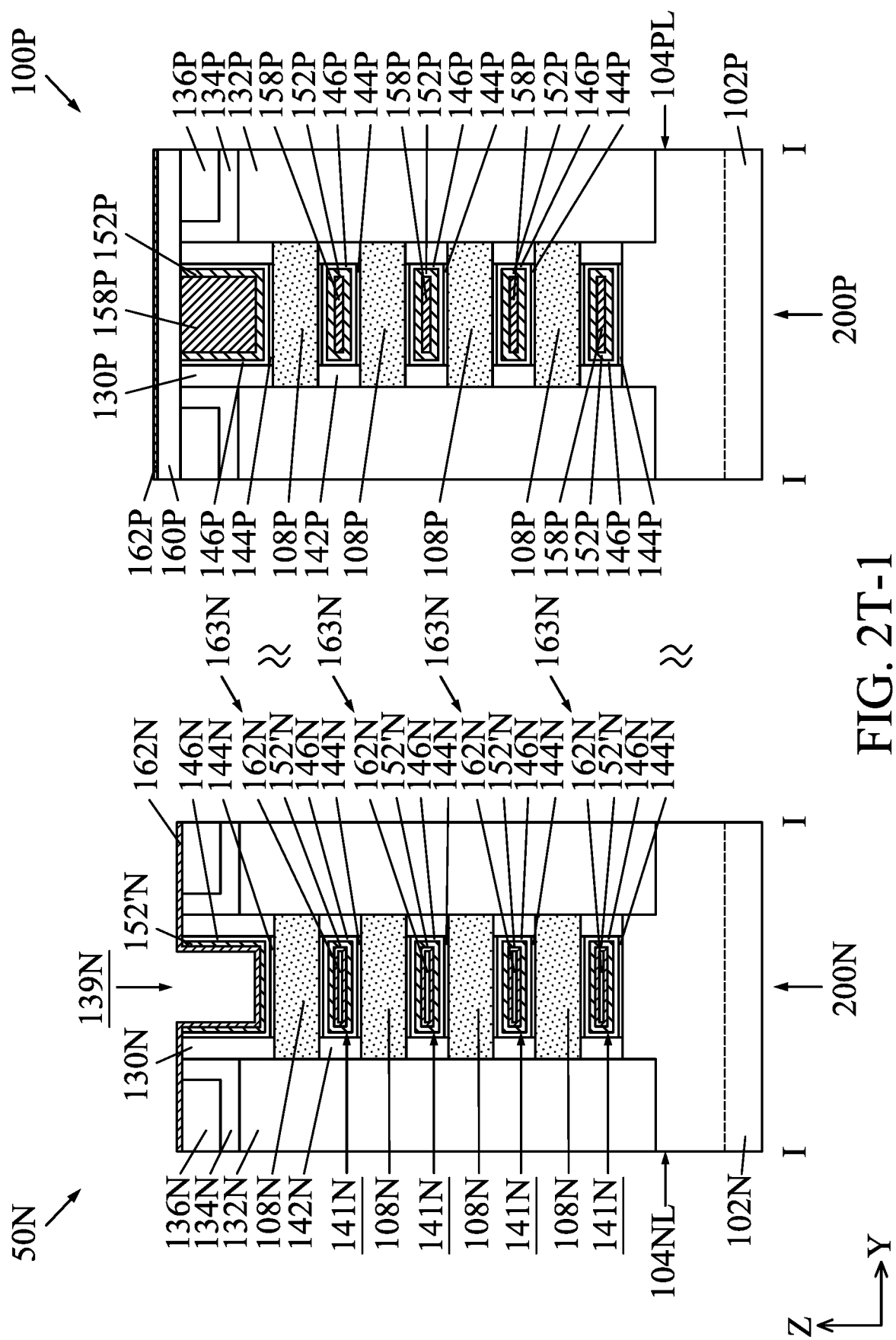
Figures 2, 2T:
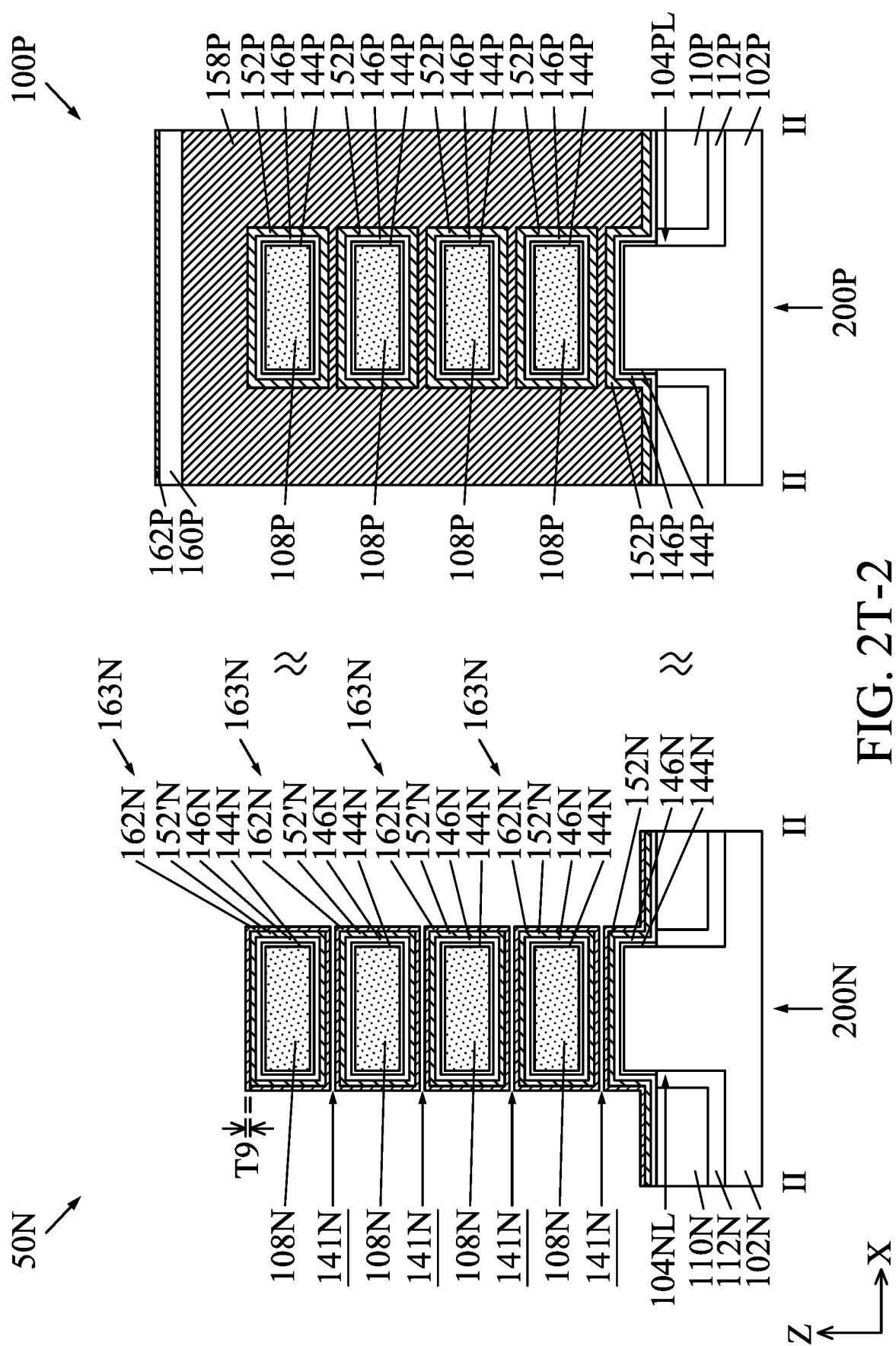
Figures 1, 2U:
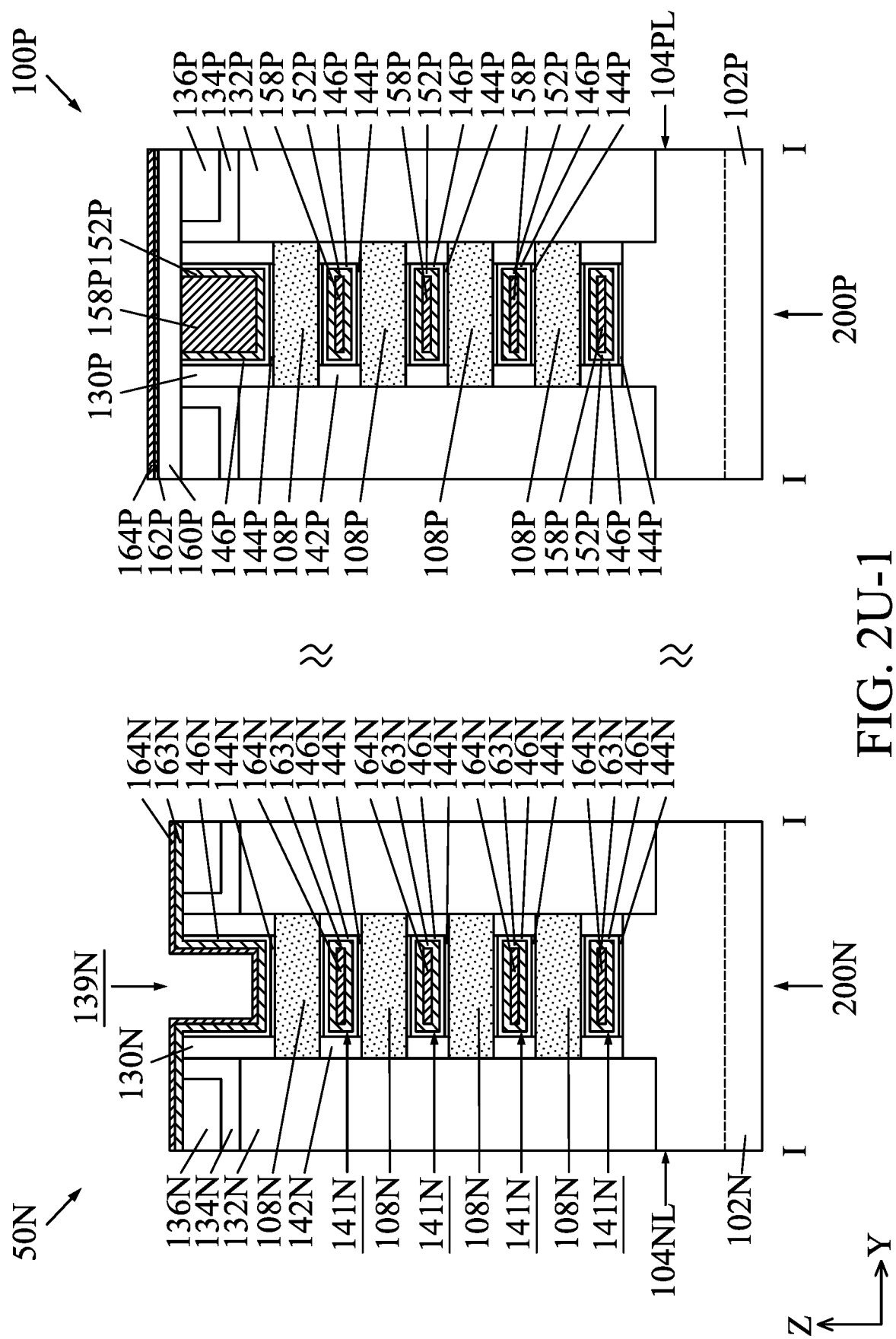
Figures 2, 2U:
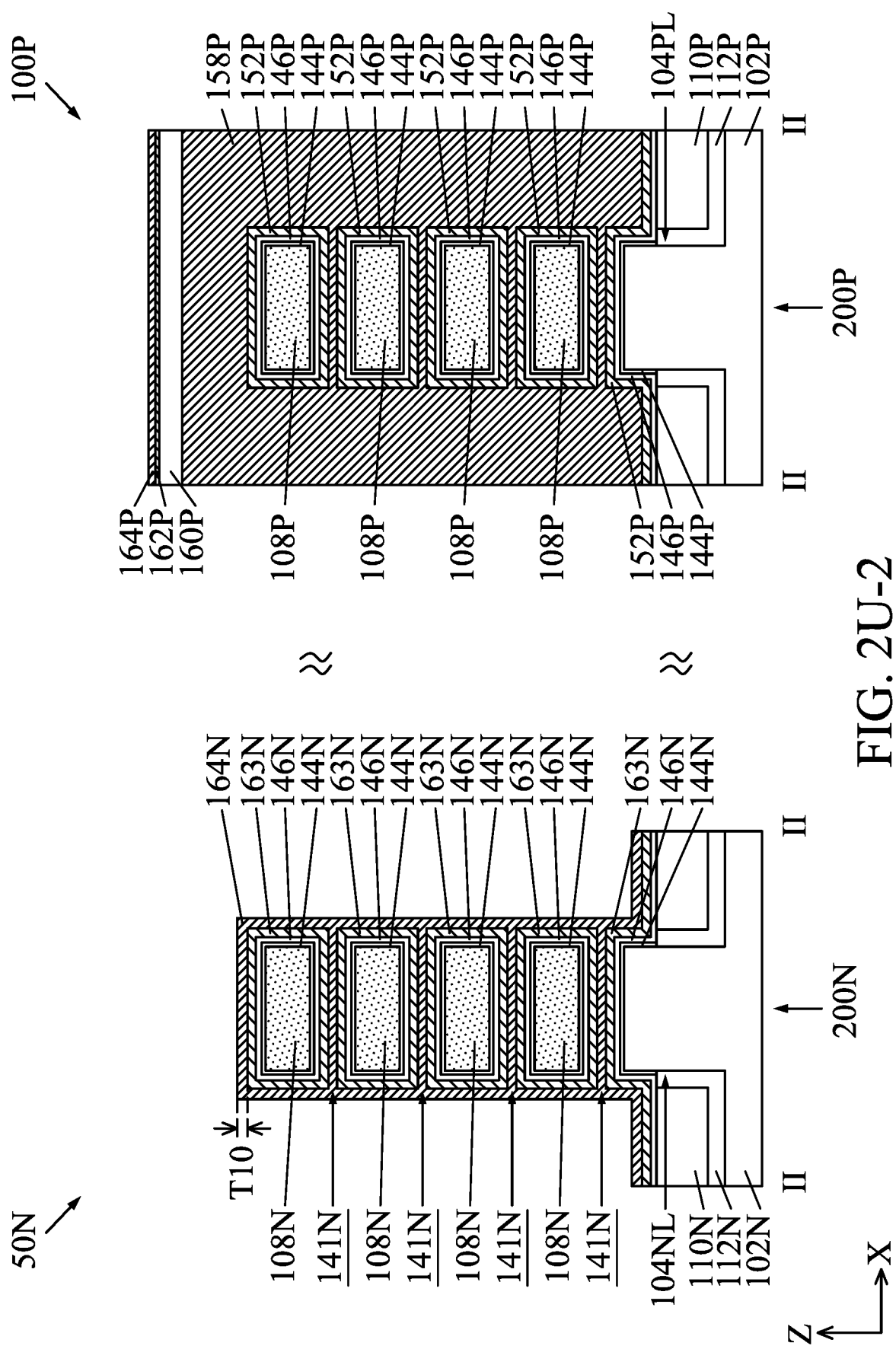
Figures 1, 2V:
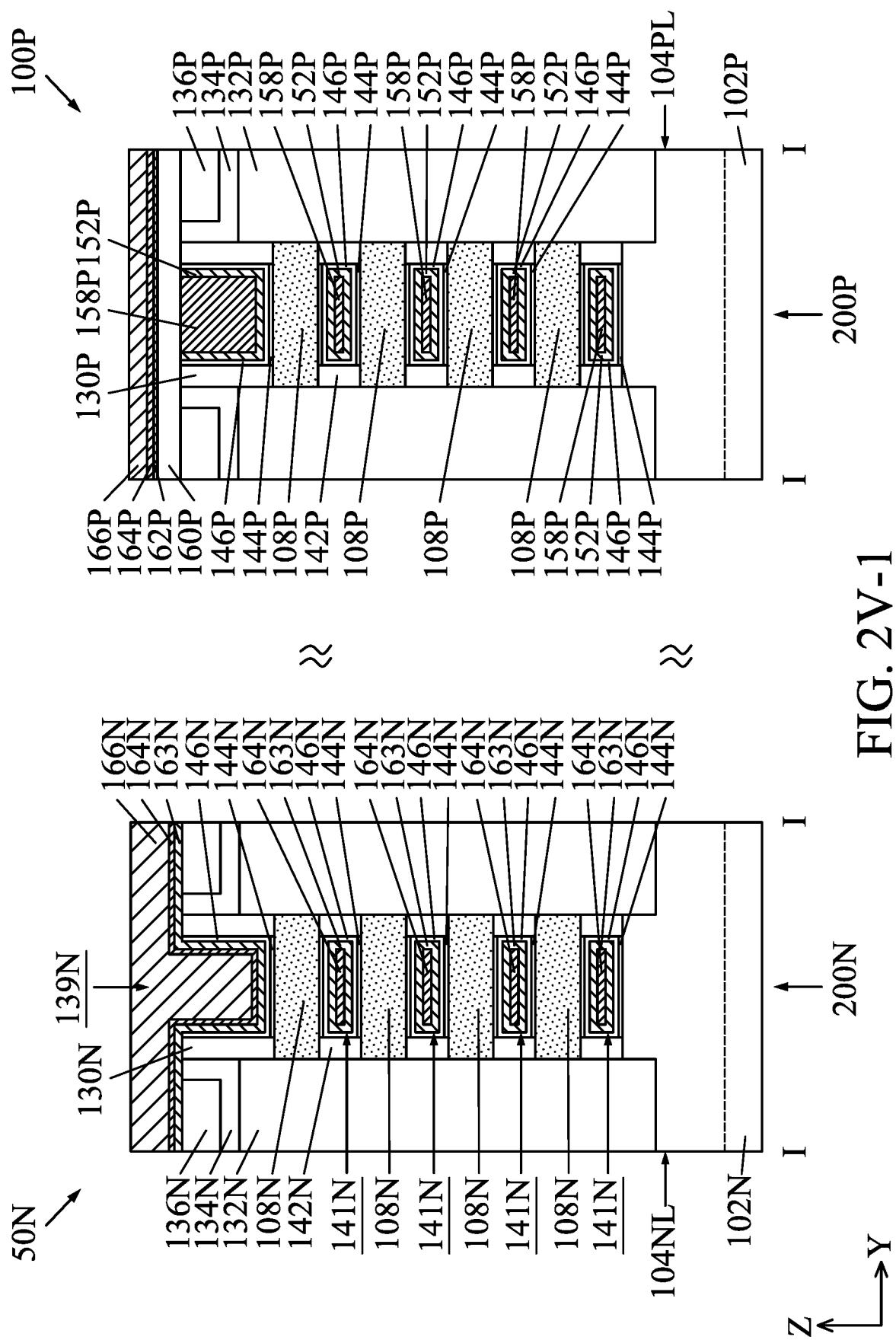
Figures 2, 2V:
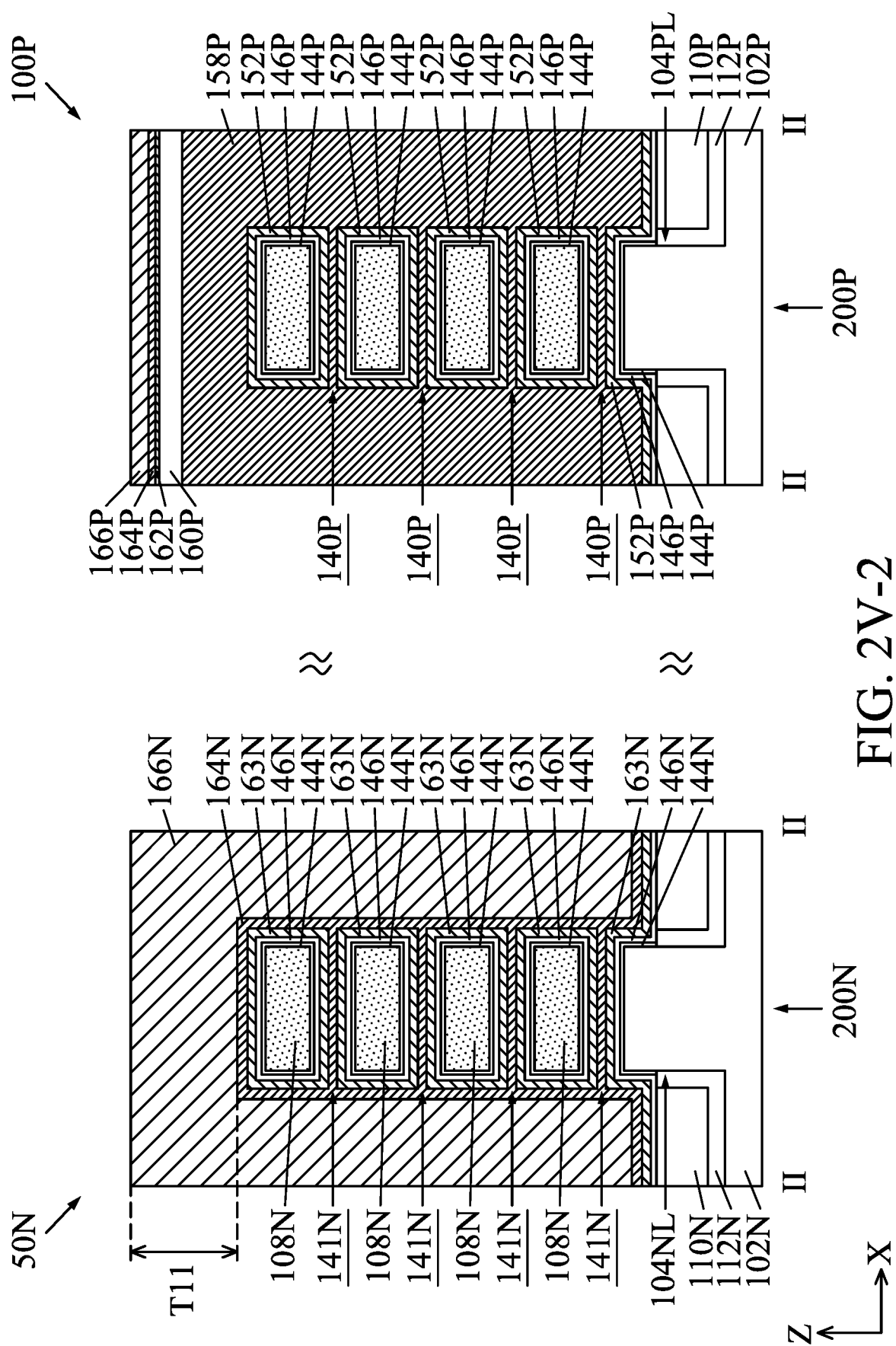
Figures 1, 2W:
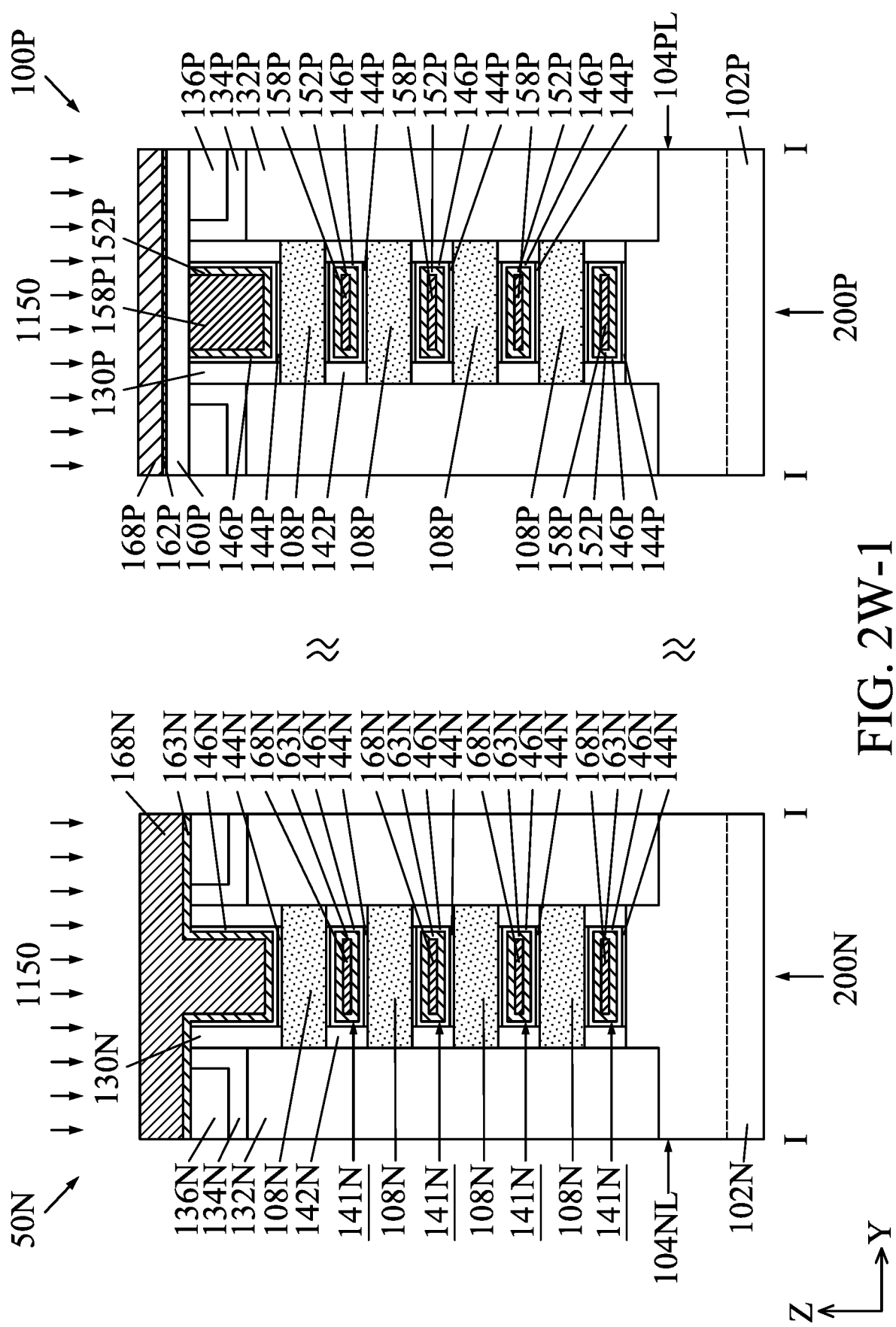
Figures 2, 2W:
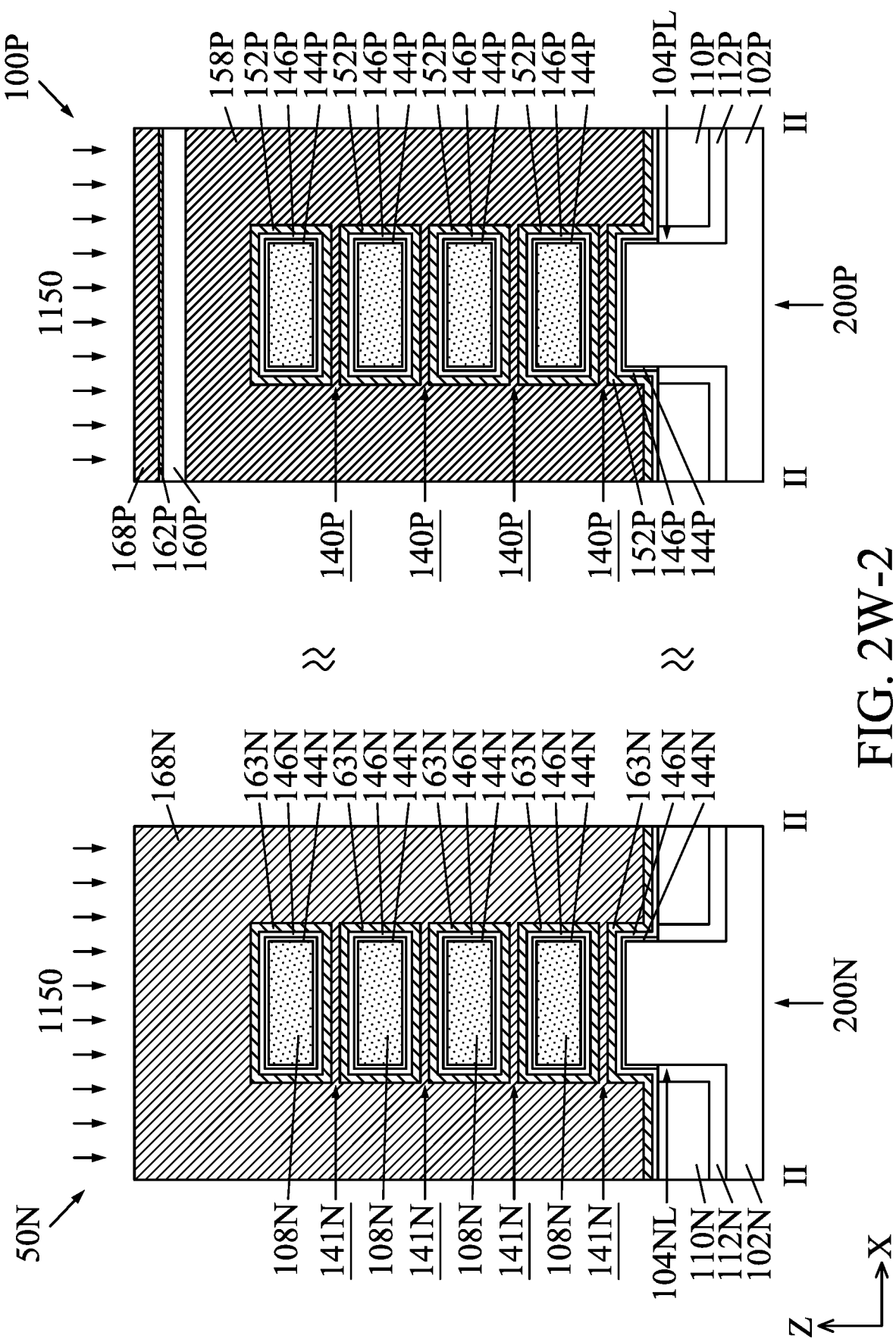
Figures 1, 2X:
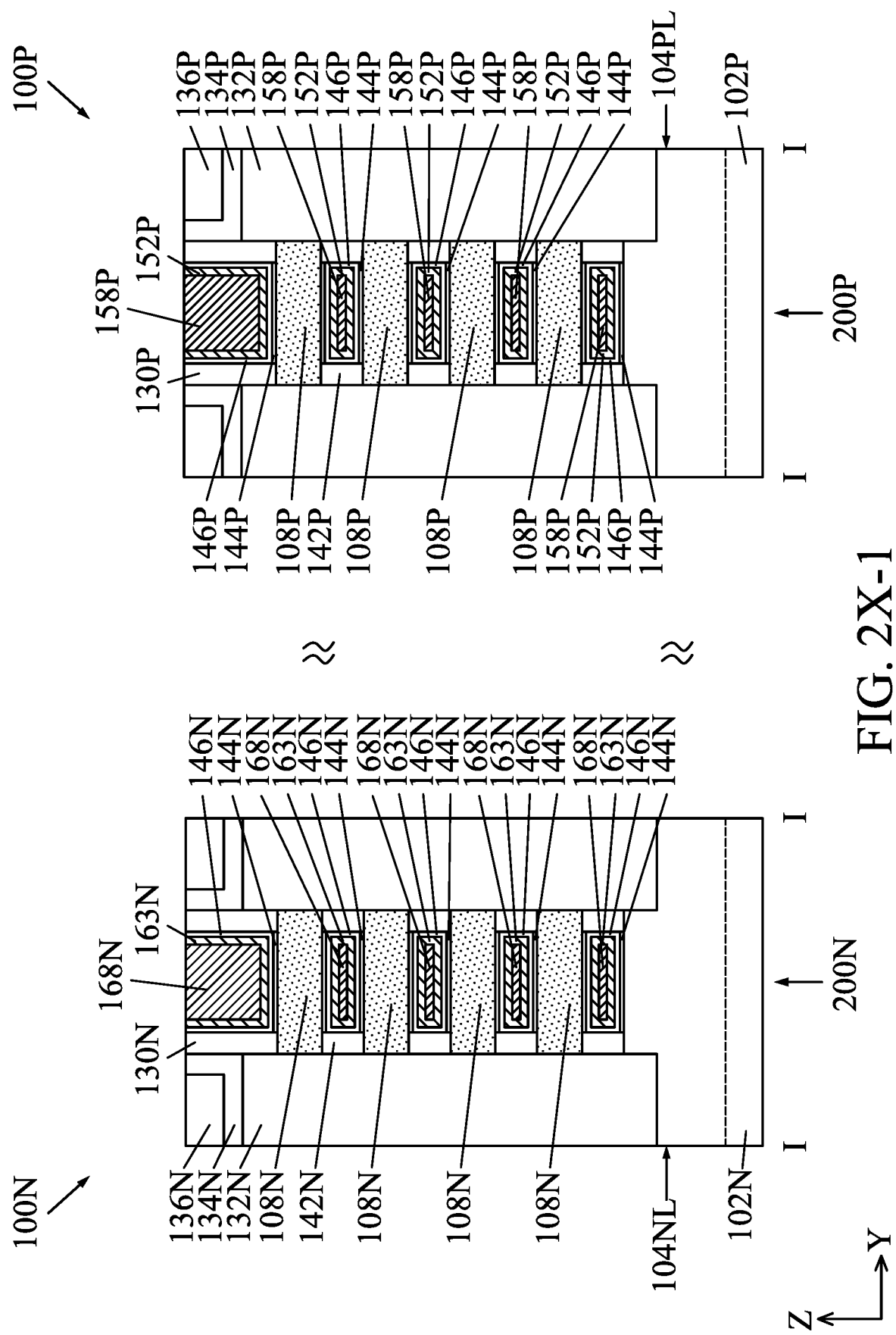
Figures 2, 2X:
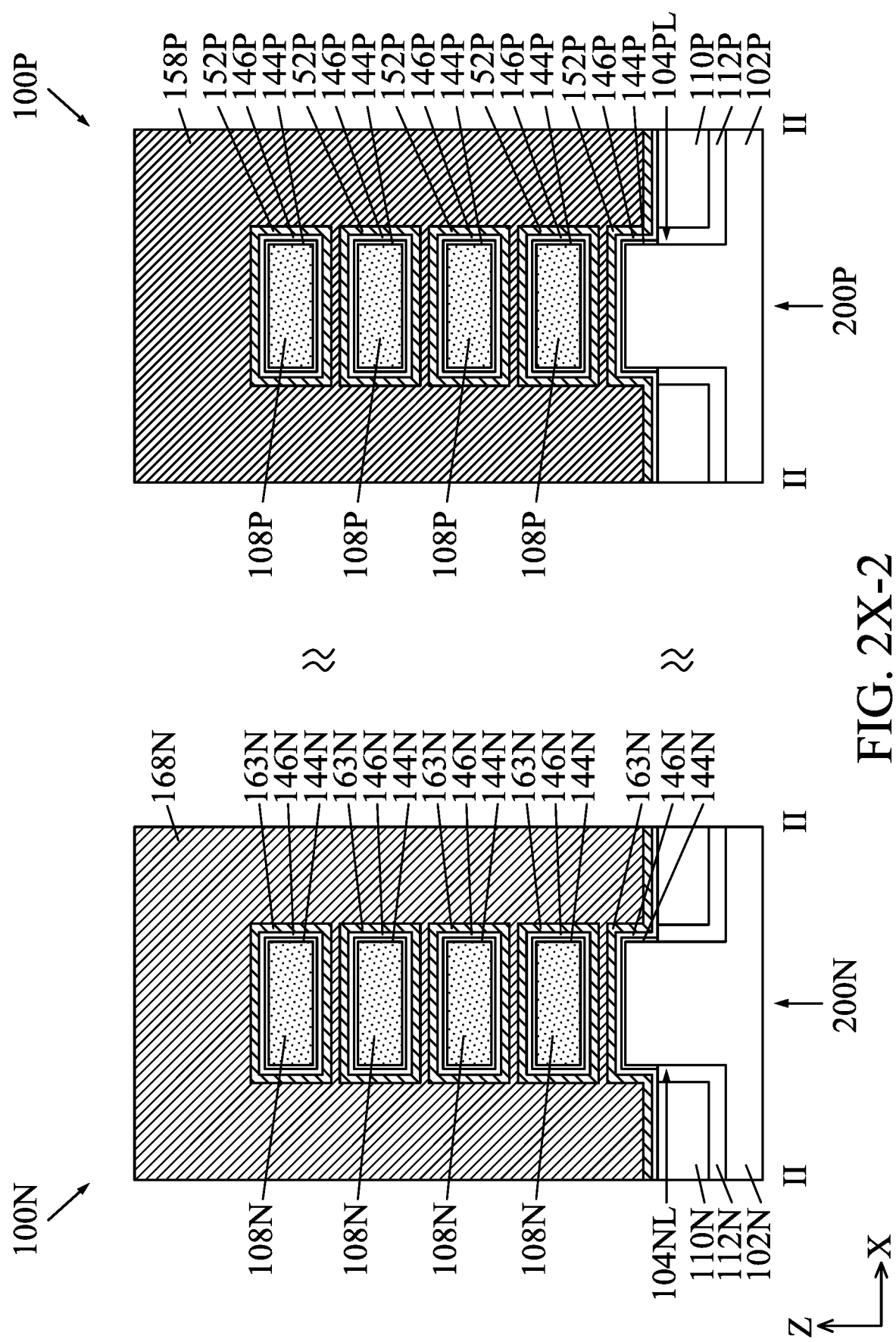

FIGS. 2A-1 through 2X-1 are cross-sectional views illustrating the formation of semiconductor devices along line I-I in FIG. 1 at various intermediate stages, in accordance with some embodiments. FIGS. 2A-2 through 2X-2 are cross-sectional views illustrating the formation of semiconductor devices along line II-II in FIG. 1 at various intermediate stages, in accordance with some embodiments.

An etch-back process is performed on the semiconductor device structures 50N and 50P of FIG. 1, in accordance with some embodiments. The isolation structure 110N and the lining layer 112N are recessed to form trenches 111N, as shown in FIGS. 2A-1 and 2A-2, in accordance with some embodiments. The trenches 111N expose the sidewalls of the upper portion 104NU of the fin structure 104N, in accordance with some embodiments. In some embodiments, the trenches 111N further expose an upper portion of the lower portion 104NL of the fin structure 104N.

The isolation structure 110P and the lining layer 112P are recessed to form the trenches 111P, in accordance with some embodiments. The trenches 111P expose the sidewalls of the upper portion 104PU of the fin structure 104P, in accordance with some embodiments. In some embodiments, the trenches 111P further expose an upper portion of the lower portion 104PL of the fin structure 104P.

In some embodiments, the etch-back process includes one or more selective etch processes, such as a dry etching process, a wet etching process, and/or a combination thereof.

A dummy gate structure 118N and a hard mask layer 124N and a dummy gate structure 118P and a hard mask layer 124P are formed over the semiconductor device structures 50N and 50P of FIGS. 2A-1 and 2A-2, as shown in FIGS. 2B-1 and 2B-2, in accordance with some embodiments. The dummy gate structure 118N and a hard mask layer 124N are formed over the fin structure 104N, in accordance with some embodiments. The dummy gate structure 118N extends in the X direction and across the fin structure 104N, in accordance with some embodiments. The dummy gate structure 118N is filled into the recesses 111N (shown in FIG. 2A-2) and covers the upper surfaces and the sidewalls of the fin structure 104N, in accordance with some embodiments. The hard mask layer 124N is formed over the dummy gate structure 118N, in accordance with some embodiments.

The dummy gate structure 118P and the hard mask layer 124P are formed over the fin structure 104P, in accordance with some embodiments. The dummy gate structure 118P extends in the X direction and across the fin structure 104P, in accordance with some embodiments. The dummy gate structure 118P is filled into the recesses 111P (shown in FIG. 2A-2) and covers the upper surfaces and the sidewalls of the fin structure 104P, in accordance with some embodiments. The hard mask layer 124P is formed over the dummy gate structure 118P, in accordance with some embodiments.

In some embodiments, the dummy gate structure 118N defines source/drain regions and channel region of an n-type semiconductor device, and the dummy gate structure 118P defines source/drain regions and the channel region of a p-type semiconductor device.

The dummy gate structure 118N includes a dummy gate dielectric layer 120N and a dummy gate electrode layer 122N, in accordance with some embodiments. The dummy gate structure 118P includes a dummy gate dielectric layer 120P and a dummy gate electrode layer 122P, in accordance with some embodiments.

In some embodiments, the dummy gate dielectric layers 120N and 120P are made of one or more dielectric materials, such as silicon oxide, silicon nitride, silicon oxynitride (SiON), HfO$_2$, HfZrO, HfSiO, HfTiO, HfAlO, and/or a combination thereof. In some embodiments, the dielectric material is formed using thermal oxidation, CVD, ALD, physical vapor deposition (PVD), another suitable method, and/or a combination thereof.

In some embodiments, the dummy gate electrode layer 122N and 122P are made of a conductive material. In some embodiments, the conductive material includes polycrystalline-silicon (poly-Si), poly-crystalline silicon-germanium (poly-SiGe), metallic nitrides, metallic silicides, metals, and/or a combination thereof. In some embodiments, the conductive material is formed using CVD, PVD, and/or a combination thereof.

In some embodiments, the formation of the dummy gate structures 118N and 118P includes conformally forming a dielectric material for the dummy gate dielectric layers 120N and 120P along the upper surfaces of the substrates 102N and 102P and the sidewalls and the upper surfaces of the fin structures 104N and 104P, and forming a conductive material for the dummy gate electrode layers 122N and 122P over the dielectric material.

Afterward, the hard mask layers 124N and 124P are formed over the conductive material for the dummy gate electrode layers 122N and 122P, in accordance with some embodiments.

In some embodiments, the formation of the hard mask layers 124N and 124P includes forming an oxide layer (e.g., silicon oxide) over the conductive material, forming a nitride layer (e.g., silicon nitride) over the oxide layer, and patterning the oxide layer into layers 126N and 126P and the nitride layer into layers 128N and 128P using photolithography and etching processes.

In some embodiments, the dielectric material for the dummy gate dielectric layers 120N and 120P and the conductive material for the dummy gate electrode layers 122N and 122P, uncovered by the hard mask layers 124N and 124P, are removed using one or more etching processes, thereby exposing the source/drain regions of the fin structures 104N and 104P. In some embodiments, the one or more etching processes are dry etching processes, wet etching processes, or a combination thereof.

Gate spacer layers 130N and gate spacers 130P are formed over the semiconductor device structures 50N and 50P, as shown in FIGS. 2B-1 and 2B-2, in accordance with some embodiments. The gate spacer layers 130N are formed along the sidewalls of the dummy gate structure 118N and the hard mask layer 124N, in accordance with some embodiments. The gate spacer layers 130P are formed along the sidewalls of the dummy gate structure 118P and the hard mask layer 124P, in accordance with some embodiments.

In some embodiments, the gate spacer layers 130N and 130P are made of a dielectric material, such as silicon oxide (SiO$_2$), silicon nitride (SiN), silicon carbide (SiC), silicon oxynitride (SiON), silicon carbon nitride (SiCN), silicon oxide carbonitride (SiOCN), and/or a combination thereof. In some embodiments, the gate spacer layers 130N and 130P are formed using a deposition process followed by an etching process. In some embodiments, the deposition process includes CVD (such as PECVD, LPCVD or HARP) and/or ALD. In some embodiments, the etching process is dry etching.

An etching process is performed on the semiconductor device structures 50N and 50P of FIGS. 2B-1 and 2B-2, in accordance with some embodiments. The fin structure 104N, uncovered by the gate spacer layers 130N, the dummy gate structure 118N, and the hard mask layer 124N, is removed to form source/drain recesses 131N, as shown in FIGS. 2C-1 and 2C-2, in accordance with some embodiments. The source/drain recesses 131N pass through the upper portion 104NU of the fin structure 104N and extend into the lower portion 104NL of the fin structure 104N, in accordance with some embodiments.

The fin structure 104P, uncovered by the gate spacer layers 130P, the dummy gate structure 118P, and the hard mask layer 124P, is removed to form source/drain recesses 131P, in accordance with some embodiments. The source/drain recesses 131P pass through the upper portions 104PU of the fin structure 104P and extend into the lower portion 104PL of the fin structure 104P, in accordance with some embodiments.

In some embodiments, the etching process includes a dry etching process, a wet etching process, or a combination thereof.

Source/drain features 132N and source/drain features 132P are formed over the semiconductor device structures 50N and 50P, as shown in FIGS. 2C-1 and 2C-2, in accordance with some embodiments. The source/drain features 132N are formed in the source/drain recesses 131N, in accordance with some embodiments. In some embodiments, the source/drain features 132N are formed to have upper surfaces above the upper surface of the fin structure 104N.

The source/drain features 132P are formed in the source/drain recesses 131P, in accordance with some embodiments. In some embodiments, the source/drain features 132P are formed to have upper surfaces above the upper surface of the fin structure 104P.

In some embodiments, the source/drain features 132N and 132P are made of any suitable material for an n-type semiconductor device and a p-type semiconductor device, such as Ge, Si, GaAs, AlGaAs, SiGe, GaAsP, SiP, SiC, SiCP, and/or a combination thereof. In some embodiments, the source/drain features 132N and 132P are formed using epitaxial growth process, such as MBE, MOCVD, VPE, another suitable epitaxial growth process, and/or a combination thereof.

A contact etching stop layer (CESL) 134N and a CESL 134P are formed over the semiconductor device structures 50N and 50P of FIGS. 2C-1 and 2C-2, as shown in FIGS. 2D-1 and 2D-2, in accordance with some embodiments. The CESL 134N is conformally formed along the upper surfaces of the source/drain features 132N, the sidewalls and the upper surfaces of the gate spacer layers 130N, and the upper surface of the hard mask layer 124N, in accordance with some embodiments.

The CESL 134P is conformally formed along the upper surfaces of the source/drain features 132P, the sidewalls and the upper surfaces of the gate spacer layers 130P, and the upper surface of the hard mask layer 124P, in accordance with some embodiments.

In some embodiments, the CESLs 134N and 134P are made of a dielectric material, such as silicon nitride, silicon oxide, silicon oxynitride, another suitable dielectric material, or a combination thereof. In some embodiments, the CESLs 134N and 134P are formed using CVD (such as PECVD, HARP, and/or a combination thereof), ALD, another suitable method, and/or a combination thereof.

An interlayer dielectric (ILD) layer 136N and an ILD layer 136P are formed over the semiconductor device structures 50N and 50P, as shown in FIGS. 2D-1 and 2D-2, in accordance with some embodiments. The ILD layer 136N is formed over the CESL 134N, in accordance with some embodiments. The ILD layer 136P is formed over the CESL 134P, in accordance with some embodiments.

In some embodiments, the ILD layers 136N and 136P are made of a dielectric material, such as tetraethylorthosilicate (TEOS) oxide, un-doped silicate glass (USG), or doped silicon oxide such as borophosphosilicate glass (BPSG), fluoride-doped silicate glass (FSG), phosphosilicate glass (PSG), borosilicate glass (BSG), and/or another suitable dielectric material. In some embodiments, the dielectric material for the ILD layer 136N and 136P are formed using CVD (such as HDP-CVD, PECVD, or HARP), ALD, another suitable method, and/or a combination thereof.

A planarization process such as CMP or an etch-back process is performed on the semiconductor device structures 50N and 50P of FIGS. 2D-1 and 2D-2, in accordance with some embodiments. The ILD layers 136N and the CESL 136N, formed above the dummy gate structures 118N, are removed to expose the upper surface of the dummy gate electrode layer 122N, as shown in FIGS. 2E-1 and 2E-2, in accordance with some embodiments.

The ILD layers 136P and the CESL 136P, formed above the dummy gate structures 118P, are removed to expose the upper surface of the dummy gate electrode layer 122N, in accordance with some embodiments.

An etching process is performed on the semiconductor device structures 50N and 50P of FIGS. 2E-1 and 2E-2, in accordance with some embodiments. The dummy gate structure 118N (including the dummy gate electrode layer 122N and the dummy gate dielectric layer 120N) is removed to form a trench 138N, as shown in FIGS. 2F-1 and 2F-2, in accordance with some embodiments.

The dummy gate structure 118P (including the dummy gate electrode layer 122P and the dummy gate dielectric layer 120P) is removed to form a trench 138P, in accordance with some embodiments.

In some embodiments, the etching process includes one or more etching processes. For example, when the dummy gate electrode layers 122N and 122P are polysilicon, a wet etchant such as a tetramethylammonium hydroxide (TMAH) solution may be used to selectively remove the dummy gate electrode layers 122N and 122P. For example, the dummy gate dielectric layers 120N and 120P may be thereafter removed using a plasma dry etching, a dry chemical etching, and/or a wet etching.

An etching process is performed on the semiconductor device structures 50N and 50P, in accordance with some embodiments. The first semiconductor layers 106N of the fin structure 104N are removed to form gaps 140N, as shown in FIGS. 2F-1 and 2F-2, in accordance with some embodiments. The gaps 140N extend between the neighboring second semiconductor layers 108N and between the lowermost second semiconductor layer 108N and the lower portion 104NL of the fin structure 104N, in accordance with some embodiments. The gaps 140N laterally extend directly below the gate spacer layers 130N, in accordance with some embodiments.

After the etching process, four main surfaces (an upper surface, two side surfaces, and a bottom surface) of each of the second semiconductor layers 108N are exposed, in accordance with some embodiments. The exposed second semiconductor layers 108N form a nanowire structure in the NMOS region 200N, which will function as a channel region of an n-type semiconductor device and be surrounded by a gate stack, in accordance with some embodiments.

The first semiconductor layers 106P of the fin structure 104P are removed to form gaps 140P, in accordance with some embodiments. The gaps 140P extend between the neighboring second semiconductor layers 108P and between the lowermost second semiconductor layer 108P and the lower portion 104PL of the fin structure 104P, in accordance with some embodiments. The gaps 140P laterally extend directly below the gate spacer layers 130P, in accordance with some embodiments.

After the etching process, four main surfaces (an upper surface, two side surfaces, and a bottom surface) of each of the second semiconductor layers 108P are exposed, in accordance with some embodiments. The exposed second semiconductor layers 108P form a nanowire structure in the PMOS region 200P. The nanowire structures in the PMOS region 200P will function as a channel region of a p-type semiconductor device and be surrounded by a gate stack, in accordance with some embodiments.

In some embodiments, the etching process includes a selective wet etching process, such as APM (e.g., ammonia hydroxide-hydrogen peroxide-water mixture) etching process. In some embodiments, the wet etching process uses etchants such as ammonium hydroxide ($NH_4OH$), TMAH, ethylenediamine pyrocatechol (EDP), and/or potassium hydroxide (KOH) solutions.

Inner spacer layers 142N and inner spacer layers 142P are formed on the semiconductor device structures 50N and 50P of FIGS. 2F-1 and 2F-2, as shown in FIGS. 2G-1 and 2G-2, in accordance with some embodiments. The inner spacer layers 142N are formed in the gaps 140N and on the source/drain features 132N, in accordance with some embodiments. The inner spacer layers 142N are formed between neighboring second semiconductor layers 108N and between the lowermost second semiconductor layer 108N and the lower portion 104NL, in accordance with some embodiments. The inner spacer layers 142N are formed directly below the gate spacer layers 130N, in accordance with some embodiments.

The inner spacer layers 142P are formed in the gaps 140P and on the source/drain features 132P, in accordance with some embodiments. The inner spacer layers 142P are formed between neighboring second semiconductor layers 108P and between the lowermost second semiconductor layer 108P and the lower portion 104PL, in accordance with some embodiments. The inner spacer layers 142P are formed directly below the gate spacer layers 130P, in accordance with some embodiments.

The inner spacer layers 142N and 142P formed between the source/drain features and a subsequently formed gate stack can reduce the parasitic capacitance between the gate stack and the source/drain features (i.e. Cgs and Cgd), in accordance with some embodiments.

In some embodiments, the inner spacer layers 142N and 142P are made of a dielectric material, such as silicon oxycarbide (SiOC), silicon oxide carbonitride (SiOCN), silicon carbon nitride (SiCN), and/or a combination thereof, in accordance with some embodiments. In some embodiments, the inner spacer layers 142N and 142P are formed using a deposition process followed by an etching process. In some embodiments, the deposition process includes CVD (such as PECVD or LPCVD) and/or ALD. In some embodiments, the etching process includes a plasma dry etching, a dry chemical etching, and/or a wet etching.

Afterward, gate stacks are formed over the semiconductor device structures 50N and 50P, in accordance with some embodiments. It is worth noting that as the scale of the semiconductor devices continues to shrink, the spacing between neighboring second semiconductor layers becomes smaller and smaller. For example, the spacing $S_N$ between neighboring second semiconductor layers 108N may be less than 10 nm. The spacing $S_P$ between neighboring second semiconductor layers 108P may be less than 10 nm.

In some instances, if the gaps 140N or 140P are filled with more than one work function materials, the gaps may not have enough space to accommodate the gate electrode material, which results in degrading the performance (e.g. threshold voltage) of a semiconductor device. The embodiments provide a method for forming gate stacks of an n-type semiconductor device and of a p-type semiconductor device. Each of the gate stacks includes a single work function material and a gate electrode material while achieving respective ultra-low threshold voltage of the n-type semiconductor device and of the p-type semiconductor device. The method is described in detail below.

Interfacial layers 144N and interfacial layers 144P are formed over the semiconductor device structures 50N and 50P of FIGS. 2G-1 and 2G-2, as shown in FIGS. 2H-1 and 2H-2, in accordance with some embodiments. The interfacial layers 144N are formed on the exposed main surfaces of the second semiconductor layers 108N, in accordance with some embodiments. The interfacial layers 144N are formed around respective second semiconductor layers 108N, in accordance with some embodiments. The interfacial layers 144N are further formed on the upper surface and sidewalls of the lower portion 104N, in accordance with some embodiments.

The interfacial layers 144P are formed on the exposed main surfaces of the second semiconductor layers 108P, in accordance with some embodiments. The interfacial layers 144P are formed around respective second semiconductor layers 108P, in accordance with some embodiments. The interfacial layers 144P are further formed on the upper surface and sidewalls of the lower portion 104P, in accordance with some embodiments.

In some embodiments, the interfacial layers 144N and 144P are made of a chemically formed silicon oxide. In some embodiments, the interfacial layers 144N and 144P are formed using one or more cleaning processes. In some embodiments, the one or more cleaning process includes, in sequence, ozone ($O_3$) clean, standard clean 1 (SC1) and standard clean 2 (SC2) performed on the semiconductor device structure 50N and 50P. In some embodiments, the SC1 includes ammonia hydroxide-hydrogen peroxide-water mixture. In some embodiments, the SC2 includes hydrochloric acid-hydrogen peroxide-water mixture. In some embodiments, the interfacial layers 144N and 144P have a thickness T1 ranging from about 5 angstrom (Å) to about 15 Å.

Gate dielectric layers 146N and gate dielectric layers 146P are formed over the semiconductor device structures 50N and 50P of FIGS. 2H-1 and 2H-2, as shown in FIGS. 2I-1 and 2I-2, in accordance with some embodiments. The gate dielectric layers 146N are conformally formed along the interfacial layers 144N, in accordance with some embodiments. The gate dielectric layers 146N are formed around respective second semiconductor layers 108N, in accordance with some embodiments. The gate dielectric layers 146N are further conformally formed along the inner spacers 142N in the gaps 140N, in accordance with some embodiments. The gate dielectric layers 146N are further conformally formed along the upper surfaces of the ILD layer 136N, the CESL 134N and the gate spacer layers 130N and the side surfaces of the gate spacer layers 130N, in accordance with some embodiments. The gate dielectric layers 146N are further conformally formed along the upper surface of the isolation structure 110N, in accordance with some embodiments.

The gate dielectric layers 146P are conformally formed along the interfacial layers 144P, in accordance with some embodiments. The gate dielectric layers 146P are formed around respective second semiconductor layers 108P, in accordance with some embodiments. The gate dielectric layers 146P are further conformally formed along the inner spacers 142P in the gaps 140P, in accordance with some embodiments. The gate dielectric layers 146P are further conformally formed along the upper surfaces of the ILD layer 136P, the CESL 134P and the gate spacer layers 130P and the side surfaces of the gate spacer layers 130P, in accordance with some embodiments. The gate dielectric layers 146P are further conformally formed along the upper surface of the isolation structure 110P, in accordance with some embodiments.

The gate dielectric layers 146N and 146P are made of a dielectric material with high dielectric constant (k-value), for example, greater than 3.9. In some embodiments, the high-k dielectric material is $HfO_2$, which is deposited by ALD using $HfCl_4$ and $H_2O$ as precursors. In some embodiments, the high-k dielectric material is HfSiO, HfSiON, HfTaO, HfTiO, HfZrO, zirconium oxide, aluminum oxide, titanium oxide, hafnium dioxide-alumina ($HfO_2$—$Al2O_3$) alloy, another suitable high-k dielectric material, and/or a combination thereof. In some embodiments, the high-k dielectric material is formed using CVD, ALD, another suitable method, and/or a combination thereof. In some embodiments, the gate dielectric layers 146N and 146P have a thickness T2 ranging from about 10 Å to about 20 Å.

First capping layers 148N and first capping layers 148P are formed over the semiconductor device structures 50N and 50P of FIGS. 2I-1 and 2I-2, as shown in FIGS. 2J-1 and 2J-2, in accordance with some embodiments. The first capping layers 148N are conformally formed along the gate dielectric layers 146N, in accordance with some embodiments. The first capping layers 148N are formed around respective second semiconductor layers 108N, in accordance with some embodiments.

The first capping layers 148P are conformally formed along the gate dielectric layers 146P, in accordance with some embodiments. The first capping layers 148P are formed around respective second semiconductor layers 108P, in accordance with some embodiments.

The first capping layers 148N and 148P are made of titanium nitride doped with silicon (TSN), which is deposited by ALD using $TiCl_4$, $SiH_4$ and $NH_3$ as precursors, in accordance with some embodiments. In some embodiments, the first capping layers 148N and 148P have a thickness T3 ranging from about 10 Å to about 20 Å.

Afterward, an in-situ post metallization anneal (i-PMA) process is performed on the first capping layers 148N and 148P, in accordance with some embodiments. The deposition process of the first capping layers 148N and 148P and the i-PMA process are continuously performed in a single process tool, in accordance with some embodiments. As a result, the first capping layers 148N and 148P may not be exposed to the atmosphere or an ambient containing $O_2$ or $H_2O$ during transportation from the deposition chamber to the anneal chamber, thereby preventing the oxidation of the first capping layers 148N and 148P. In some embodiments, the i-PMA process is a spike anneal, which is performed at a temperature of about 850° C. to about 950° C., and in an ambient containing $N_2$. The formation of the first capping layers 148N and 148P followed by the anneal process may improve the quality of the gate dielectric layers 146N and 146P, thereby enhancing the performance of the semiconductor devices.

Second capping layers 150N and second capping layers 150P are formed over the semiconductor device structures 50N and 50P of FIGS. 2J-1 and 2J-2, as shown in FIGS. 2K-1 and 2K-2, in accordance with some embodiments. The second capping layers 150N are conformally formed along the first capping layer 148N, in accordance with some embodiments. The second capping layers 150N are formed around respective second semiconductor layers 108N, in accordance with some embodiments.

The second capping layers 150P are conformally formed along the first capping layers 148P, in accordance with some embodiments. The second capping layers 150P are formed around respective second semiconductor layers 108P, in accordance with some embodiments.

The second capping layers 150N and 150P are made of silicon deposited using CVD, in accordance with some embodiments. In some embodiments, the CVD is performed at a temperature of about 350° C. to about 450° C. and uses $Si_2H_6$ and $H_2$ as precursors. In some embodiments, the second capping layers 150N and 150P have a thickness T4 ranging from about 20 Å to about 50 Å.

Afterward, a post cap anneal (PCA) process is performed on the second capping layers 150N and 150P, in accordance with some embodiments. In some embodiments, the PCA process is a spike anneal, which is performed in an ambient containing $N_2$ and at a higher temperature than the i-PMA process described above. For example, the temperature may be in a range from about 900° C. to about 950° C. The formation of the second capping layers 150N and 150P followed by the anneal process may improve the quality of the gate dielectric layers 146N and 146P, thereby enhancing the performance of the semiconductor devices.

The second capping layers 150N and 150P and the first capping layers 148N and 148P are removed, as shown in FIGS. 2L-1 and 2L-2, in accordance with some embodiments. The removal of the second capping layers 150N and 150P and the first capping layers 145N and 148P can provide more space to accommodate the subsequently formed work function material and metal fill material, in accordance with some embodiments.

After the removal process, the gate dielectric layers 146N and 148N are exposed in accordance with some embodiments. In some embodiments, the removal process includes one or more etching process, such as plasma dry etching, dry chemical etching, wet etching, and/or a combination thereof.

A post deposition anneal (PDA) process 1000 is performed on the gate dielectric layers 146N and 146P, as shown in FIGS. 2L-1 and 2L-2, in accordance with some embodiments. In some embodiments, the PDA process 1000 is a spike anneal, which is performed at a temperature of about 850° C. to about 950° C., and in an ambient containing $NH_3$. The defects in the gate dielectric layers 146N and 146N, for example, caused by an etching process, may be repaired by nitrogen atoms during the anneal process, which improves the quality of the gate dielectric layers 146N and 146P thereby enhancing the performance of semiconductor devices.

A work function material 152N and a work function material 152P are formed over the semiconductor device structures 50N and 50P of FIGS. 2L-1 and 2L-2, as shown in FIGS. 2M-1 and 2M-2, in accordance with some embodiments. The work function material 152N is conformally formed along the gate dielectric layers 146N, in accordance with some embodiments. The work function material 152N is formed around respective second semiconductor layers 108N, in accordance with some embodiments.

The work function material 152P is conformally formed along the gate dielectric layers 146P, in accordance with some embodiments. The work function material 152P is formed around respective second semiconductor layers 108P, in accordance with some embodiments.

The work function materials 152N and 152P are a p-type work function metal, such as titanium nitride (TiN), in accordance with some embodiments. The work function material 152P is used to tune the threshold voltage of the resulting p-type semiconductor device, in accordance with some embodiment. In some embodiments, the work function materials 152N and 152P are formed using ALD, which uses $TiCl_4$, and $NH_3$ as precursors and is performed at a temperature of about 400° C. to about 450° C. In some embodiments, the work function materials 152N and 152P have a thickness T5 ranging from about 10 Å to about 20 Å.

A metal fill material 154N and a metal fill material 154P are formed over the semiconductor device structures 50N and 50P of FIGS. 2M-1 and 2M-2, as shown in FIGS. 2N-1 and 2N-2, in accordance with some embodiments. The metal fill material 154N is formed over the work function layer 152N, in accordance with some embodiments. The metal fill material 154N is formed around the second semiconductor layers 108N, in accordance with some embodiments. In some embodiments, remaining portions of the gaps 140N are filled with the metal fill material 154N.

The metal fill material 154P is formed over the work function layer 152P, in accordance with some embodiments. The metal fill material 154P is formed around the second semiconductor layers 108P, in accordance with some embodiments. In some embodiments, remaining portions of the gaps 140P are filled with the metal fill material 154P. In some instances, the gaps 140P (or 140N) may not be entirely filled by the as-deposited metal fill materials 154P (or 154P)

The metal fill materials 154N and 154P is a p-type metal with good thermal flowability, for example, cobalt (Co), in accordance with some embodiments. In some embodiments, cobalt has a better thermal flowability than some other p-type metals, such as TiN and WCN.

In some embodiments, the metal fill materials 154N and 154P are formed using PVD followed by in-situ CVD. In some embodiments, the PVD and the CVD for depositing the metal fill materials 154N and 154P are continuously performed in a single process tool. As a result, the metal fill materials 154N and 154P may not be exposed to the atmosphere or an ambient containing $O_2$ or $H_2O$ during transportation from a PVD chamber to a CVD chamber, thereby preventing the oxidation of the metal fill materials 154N and 154P.

In some embodiments, the CVD uses dicobalt hexacarbonyl tert-butylacetylene (CCTBA) and $H_2$ plasma as precursors and is performed at a temperature of about 150° C. to about 250° C., and at a pressure of about 5 Torr to about 15 Torr. In some embodiments, the metal fill materials 154N and 154P have a thickness T6 ranging from about 20 Å to about 60 Å. For example, a part of the metal fill materials 154N and 154P deposited by PVD have a thickness ranging from about 10 Å to about 30 Å, and a part of the metal fill materials 154N and 154P deposited by CVD have a thickness ranging from about 10 Å to about 30 Å.

A metal fill material 156N and a metal fill material 156P are formed over the semiconductor device structures 50N and 50P of FIGS. 2N-1 and 2N-2, as shown in FIGS. 2O-1 and 2O-2, in accordance with some embodiments. The metal fill material 156N is formed over the metal fill material 154N, in accordance with some embodiments. The metal fill material 156N extends across the nanowire structure of the second semiconductor layers 108N in the X direction, in accordance with some embodiments.

The metal fill material 156P is formed over the metal fill material 154P, in accordance with some embodiments. The metal fill material 156P extends across the nanowire structure of the second semiconductor layers 108P in the X direction, in accordance with some embodiments.

The metal fill materials 156N and 156P are the same material as the metal fill materials 154N and 154P, for example cobalt. In some embodiments, the metal fill materials 156N and 156P are formed by electroplating process, and the metal fill materials 154N and 154P are used as seed layers in the electroplating process. In some embodiments, the metal fill materials 154N and 154P have a thickness T7 ranging from about 1000 Å to about 2000 Å.

An anneal process 1050 is performed on the semiconductor device structures 50N and 50P of FIGS. 2O-1 and 2O-2, as shown in FIGS. 2P-1 and 2P-2, in accordance with some embodiments. The metal fill material 154N and the metal fill material 156N are reflowed in the anneal process 1050, in accordance with some embodiments. After the anneal process 1050, the metal fill material 154N together with the metal fill material 156N forms a gate electrode material 158N, in accordance with some embodiments. The gate electrode material 158N is reflowed to fill the gaps 140N and surrounds the second semiconductor layers 108N, in accordance with some embodiments.

The metal fill material 154P and the metal fill material 156P are reflowed in the anneal process 1050, in accordance with some embodiments. After the anneal process 1050, the metal fill material 154P together with the metal fill material 156P forms a gate electrode material 158P, in accordance with some embodiments. The gate electrode material 158P is reflowed to fill the gaps 140P and to surround the second semiconductor layers 108P, in accordance with some embodiments.

In some embodiments, the anneal process 1050 is performed at a temperature of about 250° C. to about 400° C. and in an ambient containing $H_2$. If the temperature is higher than 400° C., the gate electrode material may be deformed due to high flowability. If the temperature is lower than 250° C., the gaps 140N and 140P may not be entirely filled with the gate electrode material due to low flowability, resulting in the formation of voids in the metal fill materials in the gaps. If voids exist in the gate electrode material, the performance (e.g. threshold voltage) of the resulting semiconductor device may be degraded.

Because the metal fill materials 154P and 156P (or metal fill materials 154N and 156N) have good thermal flowability, the gate electrode material 158N (or gate electrode material 158P) can be sufficiently reflowed into the gaps 140P (or 140N) during the anneal process 1050. As the result, the gaps 140P (or 140N) are substantially entirely filled by the gate electrode material 158P (or 158N), in accordance with some embodiments. The likelihood of the formation of voids in the gate electrode material can be substantially reduced. Therefore, the performance of the resulting semiconductor device can be enhanced.

A planarization process such as CMP is performed on the semiconductor device structures 50N and 50P of FIGS. 2P-1 and 2P-2, as shown in FIGS. 2Q-1 and 2Q-2, in accordance with some embodiments. The gate dielectric layer 146N, the work function material 152N and the gate electrode material 158N, formed above the ILD layer 136N, are removed to expose the upper surfaces of the ILD layer 136N, the CESL 134N and the gate spacer layers 130N, in accordance with some embodiments.

The gate dielectric layer 146P, the work function material 152P and the gate electrode material 158P, formed above the ILD layer 136P, are removed to expose the upper surfaces of the ILD layer 136P, the CESL 134P and the gate spacer layers 130P, in accordance with some embodiments.

After the planarization, a p-type semiconductor device 100P is formed in the PMOS region 200P, in accordance with some embodiments. The interfacial layers 144P, the gate dielectric layers 146P, the work function material 152P and the gate electrode material 158P together function as the gate stack of the p-type semiconductor device 100P, in accordance with some embodiments.

As the scale of the semiconductor devices continues to shrink, the spacing $S_P$ between neighboring second semiconductor layers 108P becomes smaller and smaller. In some instances, if more than one work function materials are filled into the gaps 140P, the gaps 140P may not have enough space to accommodate the gate electrode material 158P, which will result in degrading the performance (e.g., threshold voltage) of the p-type semiconductor device 100P. By forming a single work function material 152P and a gate electrode material 158P in the gaps 140P, the p-type semiconductor device 100P with ultra-low threshold voltage can be realized.

After the semiconductor device 100P is formed, a hard mask layer 160P is formed over the p-type semiconductor device 100P, as shown in FIGS. 2R-1 and 2R-2, in accordance with some embodiments. The hard mask layer 160P covers the ILD layer 136P, the CESL 134P, the gate spacer layers 130P and the gate stack (including the interfacial layers 144P, the gate dielectric layers 146P, the work function material 152P and the gate electrode material 158P), in accordance with some embodiments. In some embodiments, the semiconductor device structure 50N is exposed through the hard mask layer 160P.

In some embodiments, the hard mask layer 160P is made of titanium nitride (TiN), tantalum nitride (TaN), or aluminum oxide ($Al_2O_3$), in accordance with some embodiments. In some embodiments, the formation of the hard mask layer 160P includes a deposition process (such as CVD, ALD or PVD), a photolithography process, and an etching process.

Afterward, an etching process is performed on the semiconductor device structure 50N and the semiconductor device 100P, in accordance with some embodiments. The gate electrode material 158N is removed to form a trench 139N and gaps 141N, as shown in FIGS. 2R-1 and 2R-2, in accordance with some embodiments.

After the etching process, the work function material 152N is exposed, in accordance with some embodiments. Because of the etchant of the etching process or being exposed to an ambient containing $O_2$ or $H_2O$ after the etching process, the work function material 152N is oxidized to form a native oxide layer on the exposed surfaces of the work function material 152N, in accordance with some embodiments.

In some embodiments, the etching process is dry etching, wet etching, and/or a combination thereof. The hard mask layer 160P protects the p-type semiconductor device 100P during the etching process, in accordance with some embodiments.

An etching process 1100 is performed on the semiconductor device structure 50N and the semiconductor device 100P of FIGS. 2R-1 and 2R-2, as shown in FIGS. 2S-1 and 2S-2, in accordance with some embodiments. The work function material 152N is thinned down by the etching process 1100, in accordance with some embodiments. In some embodiments, a remaining portion 152'N of the work function material 152N is leaved on and covers the gate dielectric layers 146N, in accordance with some embodiments.

The etching process 1100 also removes the native oxide layer of the work function material 152N, which may reduce the resistance between the work function material and the subsequently formed metal fill material. The etching process 1100 also thin down the hard mask layer 160P, in accordance with some embodiments.

In some embodiments, the etching process 1100 uses $WCl_5$ and/or $TaCl_5$ as etchant and is performed at a temperature of about 300° C. to about 500° C., and a pressure ranging from about 5 Torr to about 15 Torr. In some embodiments, the remaining portions 152' have a thickness T8 that is from about 10% to about 90% of the thickness T5 of the work function material 152N.

A work function material 162N and a work function material 162P are formed over the semiconductor device structure 50N and the semiconductor device 100P of FIGS. 2S-1 and 2S-2, as shown in FIGS. 2T-1 and 2T-2, in accordance with some embodiments. The work function material 162N is conformally formed along the work function material 152'N, in accordance with some embodiments. The work function material 162N is formed around respective second semiconductor layers 108N, in accordance with some embodiments.

The work function material 162P is formed over the hard mask layer 160P, in accordance with some embodiments.

The work function material 162N and 162P are the same material as the work function material 152'N and 152P, for example, titanium nitride (TiN), in accordance with some embodiments. In some embodiments, the work function materials 162N and 162P are formed using ALD, which uses $TiCl_4$ and $NH_3$ as precursors and is performed at a temperature of about 400° C. to about 450° C. In some embodiments, the work function material 162N has a thickness T9 ranging from about 10 Å to about 20 Å.

In some embodiments, the etching process 1100 and the deposition process of the work function materials 162N and 162P are performed in-situ. In some embodiments, these etching and deposition process are continuously performed in a single process tool. As a result, the work function material 152'N may not be exposed to the atmosphere or an ambient containing $O_2$ or $H_2O$ during transportation between an etching chamber and a deposition chamber, thereby preventing the oxidation of the work function material 152'N.

The work function materials 162N and the work function material 152'N are together used as a glue layer for the subsequently formed metal fill material and referred to as 163N, in accordance with some embodiments.

A metal fill material 164N and a metal fill material 164P are formed over the semiconductor device structure 50N and the semiconductor device 100P of FIGS. 2T-1 and 2T-2, as shown in FIGS. 2U-1 and 2U-2, in accordance with some embodiments. The metal fill material 164N is formed over the work function layer 163N, in accordance with some embodiments. The metal fill material 164N is formed around the second semiconductor layers 108N, in accordance with some embodiments. In some embodiments, remaining portions of the gaps 141N are filled with the metal fill material 164N. In some instances, the gaps 141N may not be entirely filled by the as-deposited metal fill materials 164N.

The metal fill material 164P is formed over the work function layer 162P, in accordance with some embodiments.

The metal fill materials 164N and 164P are an n-type metal, such as titanium (Ti), in accordance with some embodiments. In some embodiments, the metal fill materials 164N (e.g. Ti) function as a wetting layer to help the subsequently formed metal fill material (e.g., Al) to reflow into the gaps 141. In some embodiments, the metal fill materials 164N and 164P are formed using CVD (such as PECVD), which uses $TiCl_4$ and $H_2$ plasma as precursors and is performed at a temperature of about 380° C. to about 420° C. In some embodiments, the metal fill material 164N has a thickness T10 ranging from about 10 Å to about 20 Å.

A metal fill material 166N and a metal fill material 166P are formed over the semiconductor device structure 50N and the semiconductor device 100P of FIGS. 2U-1 and 2U-2, as shown in FIGS. 2V-1 and 2V-2, in accordance with some embodiments. The metal fill material 166N is formed over the metal fill material 164N, in accordance with some embodiments. The metal fill material 166N extends across the nanowire structure of the second semiconductor layers 108N in the X direction, in accordance with some embodiments.

The metal fill material 166P is formed over the metal fill material 164P, in accordance with some embodiments.

The metal fill materials 166N and 166P are an n-type metal, such as aluminum (Al). In some embodiments, the metal fill materials 166N and 166P are formed by CVD, which uses dimethyl aluminum hydride (DMAH) or dimethylethylaminealane (DMEAA), and $H_2$ plasma as precursors, and is performed at a temperature of about 150° C. to about 220° C., and a pressure ranging from about 5 Torr to about 15 Torr. In some embodiments, the metal fill material 166N has a thickness T11 ranging from about 1000 Å to about 2000 Å.

An anneal process 1150 is performed on the semiconductor device structure 50N and the semiconductor device 100P of FIGS. 2V-1 and 2V-2, as shown in FIGS. 2W-1 and 2W-2, in accordance with some embodiments. The metal fill material 164N and the metal fill material 166N are reflowed in the anneal process 1150, in accordance with some embodiments. After the anneal process 1150, the metal fill material 164N together with the metal fill material 166N forms a gate electrode material 168N, in accordance with some embodiments. The gate electrode material 168N is reflowed to fill the gaps 141N and surrounds the second semiconductor layers 108N, in accordance with some embodiments.

After the anneal process 1150, the metal fill material 164P together with the metal fill material 166P forms a gate electrode material 168P, in accordance with some embodiments.

In some embodiments, the gate electrode materials 168N and 168P are titanium aluminum (TiAl) alloy. In some embodiments, TiAl has a better thermal flowability than some other n-type metals, such as TiAlC, TaAlC, or TiAlN.

In some embodiments, the anneal process 1150 is performed at a temperature of about 400° C. to about 450° C. and in an ambient containing $H_2$. If the temperature is higher than 450° C., the gate electrode material may be deformed due to high flowability. If the temperature is lower than 400° C., the gaps 141N may not be entirely filled with the gate electrode material due to low flowability, resulting in the formation of voids in the metal fill materials in the gaps. If voids exist in the gate electrode material, the performance (e.g. threshold voltage) of the resulting semiconductor device may be degraded.

Because the metal fill materials 164P (e.g., Ti) is used as the wetting layer and the gate electrode material 168N (e.g., TiAl alloy) have good thermal flowability, the gate electrode material 168N can be sufficiently reflowed into the gaps 141N during the anneal process 1150. As the result, the gaps 141N are substantially entirely filled by the gate electrode material 168N, in accordance with some embodiments. The likelihood of the formation of voids in the gate electrode material can be substantially reduced. Therefore, the performance of the resulting semiconductor device can be enhanced.

A planarization process such as CMP is performed on the semiconductor device structures 50N and the semiconductor device 100P of FIGS. 2W-1 and 2W-2, as shown in FIGS. 2X-1 and 2X-2, in accordance with some embodiments. The work function material 163N and the gate electrode material 168N, formed above the ILD layer 136N, are removed to expose the upper surfaces of the ILD layer 136N, the CESL 134N and the gate spacer layers 130N, in accordance with some embodiments.

The hard mask layer 160P, the work function material 162P and the gate electrode material 168P, formed above the ILD layer 136P, are removed to expose the upper surfaces of the ILD layer 136P, the CESL 134P and the gate spacer layers 130P, in accordance with some embodiments.

After the planarization, an n-type semiconductor device 100N is formed in the NMOS region 200N, in accordance with some embodiments. The interfacial layers 144N, the gate dielectric layers 146N, the work function material 163N and the gate electrode material 168N together function as the gate stack of the n-type semiconductor device 100N, in accordance with some embodiments.

As the scale of the semiconductor devices continues to shrink, the spacing $S_N$ between neighboring second semiconductor layers 108N becomes smaller and smaller. In some instances, if more than one work function materials are filled into the gaps 140N, the gaps 140N may not have enough space to accommodate the gate electrode material 168N, which will result in degrading the performance (e.g., threshold voltage) of the n-type semiconductor device 100N. By forming a single work function material 163N and a gate electrode material 168N in the gaps 140N, the n-type semiconductor device 100N with ultra-low threshold voltage can be realized.

Figure 3:
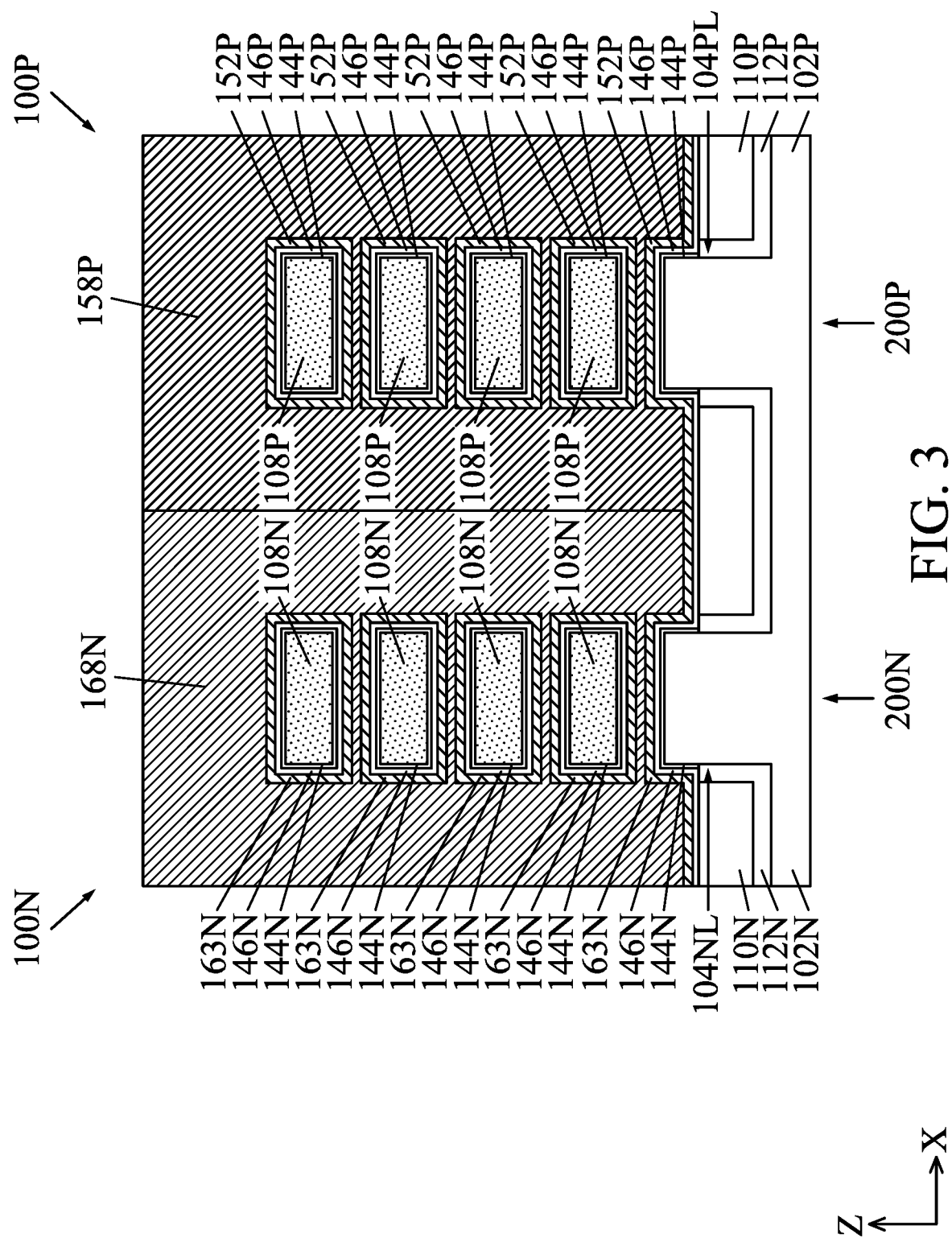
FIG. 3 is a cross-sectional view illustrating the formation of semiconductor devices along line II-II in FIG. 1 at various intermediate stages, in accordance with some embodiments.

FIG. 3 is a cross-sectional view illustrating the formation of semiconductor devices 100N and 100P along line II-II in FIG. 1 at various intermediate stages, in accordance with some embodiments.

The NMOS region 200N and the PMOS region 200P are located close to each other, such as in the static random access memory (SRAM) region of an IC device, as shown in FIG. 3, in accordance with some embodiments. The gate electrode material 168N of the n-type semiconductor device 100N interfaces with the gate electrode material 158P of the p-type semiconductor device 100P, in accordance with some embodiments.

As described above, the method for forming the semiconductor device structure includes forming a work function material 152N/152P around a second semiconductor layer 108N in an NMOS region 200N and a second semiconductor layer 108P in a PMOS region 200P, forming a gate electrode material 158N/158P over the work function material 152N/152P, removing the gate electrode material 158N in the NMOS region 200N, and forming a gate electrode material 168N over the work function material 152N in the NMOS region 200N. The work function material 158P formed in the PMOS region 200P can tune the threshold voltage of the p-type semiconductor device 100P. The work function material 158N formed in the NMOS region is used as a glue layer, and the threshold voltage of the n-type semiconductor device 100N can be tuned by the gate electrode material 168N (e.g., TiAl alloy). As a result, the p-type semiconductor device 100P and the n-type semiconductor device 100N can be respectively tuned to have ultra-low threshold voltages.

Embodiments of a method for forming a semiconductor device structure are provided. The method for forming the semiconductor device structure may include forming a work function material around a first semiconductor layer in a first region and a second semiconductor layer in a second region, forming a first gate electrode material over the work function material, removing the first gate electrode material in the first region, and forming a second gate electrode material over the work function material in the first region. As a result, the semiconductor devices in the two regions can be respectively tuned to have ultra-low threshold voltages.

In some embodiments, a method for forming a semiconductor device structure is provided. The method for forming the semiconductor device structure includes forming a first semiconductor layer over a first region of a substrate and a second semiconductor layer over a second region of the substrate. The method for forming the semiconductor device structure includes forming a work function material around the first semiconductor layer and the second semiconductor layer. The method for forming the semiconductor device structure includes forming a first gate electrode material over the work function material around the first semiconductor layer and the second semiconductor layer. The method for forming the semiconductor device structure includes removing a portion of the first gate electrode material in the first region. The method for forming the semiconductor device structure includes forming a second gate electrode material over the work function material around the first semiconductor layer.

In some embodiments, a method for forming a semiconductor device structure is provided. The method for forming the semiconductor device structure includes forming first semiconductor layer over a first region of a substrate and second semiconductor layer over a second region of the substrate. The method for forming the semiconductor device structure includes forming a gate dielectric layer around the first semiconductor layers and the second semiconductor layers. The method for forming the semiconductor device structure includes forming a first work function material over the gate dielectric layer around the first semiconductor layers and the second semiconductor layers. The method for forming the semiconductor device structure includes forming a first gate electrode material over the first work function material in the second region. The method for forming the semiconductor device structure includes thinning down the first work function material around the first semiconductor layers. The method for forming the semiconductor device structure includes forming a second work function material over the first work function material around the first semiconductor layers. The method for forming the semiconductor device structure includes forming a second gate electrode material over the second work function material.

In some embodiments, a method for forming a semiconductor device structure is provided. The method for forming the semiconductor device structure includes forming a first fin structure and a second fin structure over a substrate. The first fin structure comprises first semiconductor layers and second semiconductor layers alternately stacked and the second fin structure comprises third semiconductor layers and fourth semiconductor layers alternately stacked. The method for forming the semiconductor device structure includes removing the first semiconductor layers of the first fin structure and the third semiconductor layers of the second fin structure. The method for forming the semiconductor device structure includes forming a first work function material around the fourth semiconductor layers of the second fin structure. The method for forming the semiconductor device structure includes forming a p-type metal material over the first work function material. The method for forming the semiconductor device structure includes forming a second work function material around the second semiconductor layers of the first fin structure. The method for forming the semiconductor device structure includes forming an n-type metal material over the second work function material. The first work function material is the same as the second work function material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
   forming a stack over a substrate, the stack comprising first semiconductor layers and second semiconductor layers alternately stacked;
   patterning the stack into a first fin structure over a first region of the substrate and a second fin structure over a second region of the substrate;
   etching the first semiconductor layers of each of the first fin structure and the second fin structure, thereby exposing the second semiconductor layers of each of the first fin structure and the second fin structure;
   forming a work function material around the second semiconductor layers of the first fin structure and the second semiconductor layers of the second fin structure;

forming a first gate electrode material over the work function material;
forming a hard mask layer over the first gate electrode material in the second region;
removing a portion of the first gate electrode material in the first region;
after removing the portion of the first gate electrode material in the first region, forming a second gate electrode material over the work function material around the second semiconductor layers of the first fin structure and over the hard mask layer, wherein forming the second gate electrode material comprises:
forming a third metal fill material over the work function material around the second semiconductor layers of the first fin structure;
forming a fourth metal fill material over the third metal fill material; and
annealing the third metal fill material and the fourth metal fill material; and
removing the hard mask layer and a portion of the second gate electrode material over the hard mask layer to expose the first gate electrode material.

2. The method for forming the semiconductor device structure as claimed in claim 1, wherein the first gate electrode material is different than the second gate electrode material.

3. The method for forming the semiconductor device structure as claimed in claim 1, wherein forming the first gate electrode material comprises:
depositing a first metal fill material over the work function material around the second semiconductor layers of the first fin structure and the second semiconductor layers of the second fin structure;
electroplating a second metal fill material over the first metal fill material; and
annealing the first metal fill material and the second metal fill material.

4. The method for forming the semiconductor device structure as claimed in claim 3, wherein the first metal fill material and the second metal fill material are cobalt.

5. The method for forming the semiconductor device structure as claimed in claim 1, wherein the third metal fill material is titanium and the fourth metal fill material is aluminum.

6. The method for forming the semiconductor device structure as claimed in claim 1, wherein the first region is an NMOS region and the second region is a PMOS region.

7. The method for forming the semiconductor device structure as claimed in claim 1, wherein the first semiconductor layers of each of the first fin structure and the second fin structure are etched to form gaps between the second semiconductor layers, and the first gate electrode material fills the gaps.

8. A method for forming a semiconductor device structure, comprising:
forming first semiconductor layers over a first region of a substrate and second semiconductor layers over a second region of the substrate, wherein first semiconductor layers are vertically spaced apart from one other, and the second semiconductor layers are vertically spaced apart from one other;
forming a gate dielectric layer around the first semiconductor layers and the second semiconductor layers;
forming a first capping layer over the gate dielectric layer;
annealing the first capping layer at a first temperature;
forming a second capping layer over the first capping layer;
annealing the second capping layer at a second temperature that is greater than the first temperature;
forming a first work function material over the gate dielectric layer around the first semiconductor layers and the second semiconductor layers after forming the first capping layer, annealing the first capping layer, forming the second capping layer and annealing the second capping layer;
forming a first gate electrode material over the first work function material in the second region;
thinning down the first work function material around the first semiconductor layers, wherein after thinning down the first work function material around the first semiconductor layers, a first thickness of the first work function material over the first semiconductor layers is less than a second thickness of first work function material over the second semiconductor layers;
forming a second work function material over the first work function material around the first semiconductor layers; and
forming a second gate electrode material over the second work function material.

9. The method for forming the semiconductor device structure as claimed in claim 8, wherein the first gate electrode material is cobalt, the second gate electrode material is titanium aluminum alloy, and the first work function material and the second work function material are TiN.

10. The method for forming the semiconductor device structure as claimed in claim 8, wherein the first gate electrode material is further formed over the first work function material in the first region.

11. The method for forming the semiconductor device structure as claimed in claim 10, further comprising:
etching a portion of the first gate electrode material in the first region to expose the first work function material in the first region, wherein a native oxide is formed on the first work function material in the first region.

12. The method for forming the semiconductor device structure as claimed in claim 11, wherein thinning down the first work function material around the first semiconductor layers further comprises removing the native oxide.

13. The method for forming the semiconductor device structure as claimed in claim 8, further comprising:
removing the first capping layer and the second capping layer to expose the gate dielectric layer; and
annealing the gate dielectric layer.

14. A method for forming a semiconductor device structure, comprising:
forming a first fin structure and a second fin structure over a substrate, wherein the first fin structure comprises first semiconductor layers and second semiconductor layers alternately stacked and the second fin structure comprises third semiconductor layers and fourth semiconductor layers alternately stacked, wherein the first semiconductor layers and the third semiconductor layers are made of SiGe, and the second semiconductor layers and the fourth semiconductor layers are made of Si;
removing the first semiconductor layers of the first fin structure and the third semiconductor layers of the second fin structure;
forming a first work function material around the fourth semiconductor layers of the second fin structure;
forming a p-type metal material over the first work function material, wherein forming the p-type metal material over the first work function material comprises:

electroplating the p-type metal material over the first fin structure and the second fin structure;

etching a second portion of the p-type metal material over the first fin structure;

forming a second work function material around the second semiconductor layers of the first fin structure after forming the p-type metal material; and forming an n-type metal material over the second work function material, wherein the first work function material is the same as the second work function material, and the n-type metal material is different than the p-type metal material.

15. The method for forming the semiconductor device structure as claimed in claim 14, wherein the n-type metal material is further formed over the hard mask layer.

16. The method for forming the semiconductor device structure as claimed in claim 15, further comprising:

removing the hard mask layer and a portion of the n-type metal material over the hard mask layer to expose the p-type metal material.

17. The method for forming the semiconductor device structure as claimed in claim 14, wherein the p-type metal material interfaces with the n-type metal material.

* * * * *